(12) United States Patent
Mitsuyoshi et al.

(10) Patent No.: US 9,050,635 B2
(45) Date of Patent: *Jun. 9, 2015

(54) SUBSTRATE PROCESSING APPARATUS

(71) Applicant: Dainippon Screen Mfg. Co., Ltd., Kyoto-shi, Kyoto (JP)

(72) Inventors: Ichiro Mitsuyoshi, Kyoto (JP); Jun Shibukawa, Kyoto (JP); Shinji Kiyokawa, Kyoto (JP); Tomohiro Kurebayashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/839,956

(22) Filed: Mar. 15, 2013

(65) Prior Publication Data

US 2013/0180551 A1 Jul. 18, 2013

Related U.S. Application Data

(62) Division of application No. 12/029,608, filed on Feb. 12, 2008.

(30) Foreign Application Priority Data

Feb. 15, 2007 (JP) ................................. 2007-034203
Feb. 15, 2007 (JP) ................................. 2007-034204

(51) Int. Cl.
*H01L 21/67* (2006.01)
*B08B 1/02* (2006.01)
*H01L 21/677* (2006.01)

(52) U.S. Cl.
CPC ............ *B08B 1/02* (2013.01); *H01L 21/67051* (2013.01); *H01L 21/67742* (2013.01); *H01L 21/67778* (2013.01); *H01L 21/67011* (2013.01)

(58) Field of Classification Search
CPC ........................................................ B04B 15/06
See application file for complete search history.

(56) References Cited

U.S. PATENT DOCUMENTS 6,874,515 B2 4/2005 Ishihara et al.
6,893,171 B2 5/2005 Fukutomi et al.
(Continued)

FOREIGN PATENT DOCUMENTS

CN 1685080 10/2005
CN 1712333 12/2005
(Continued)

OTHER PUBLICATIONS

Front page of the pamphlet of the announced patent specification in the counterpart Chinese Application No. 200810005675.X issued Dec. 23, 2009. (CN 1891355 and CN 1685080 were previously submitted in an IDS filed May 22, 2009 and are therefore not enclosed.).

(Continued)

*Primary Examiner* — Jason Ko
(74) *Attorney, Agent, or Firm* — Ostrolenk Faber LLP

(57) ABSTRACT

A substrate processing apparatus is composed of an indexer block, a first processing block and a second processing block that are provided in parallel with one another. The indexer block is provided with an indexer robot. The first processing block is provided with a plurality of back surface cleaning units and a first main robot. The second processing block is provided with a plurality of end surface cleaning units, a plurality of top surface cleaning units and a second main robot.

9 Claims, 26 Drawing Sheets

(56) References Cited

U.S. PATENT DOCUMENTS

| | | |
|---|---|---|
| 6,921,466 B2 | 7/2005 | Hongo et al. |
| 2001/0024691 A1 | 9/2001 | Kimura et al. |
| 2002/0006876 A1 | 1/2002 | Hongo et al. |
| 2002/0020627 A1 | 2/2002 | Kunisawa et al. |
| 2002/0059686 A1 | 5/2002 | Uemukai et al. |
| 2002/0152958 A1 | 10/2002 | Shigemori et al. |
| 2002/0157692 A1 | 10/2002 | Ishihara et al. |
| 2003/0079764 A1 | 5/2003 | Hiros et al. |
| 2004/0029333 A1 | 2/2004 | Matsukawa |
| 2004/0055707 A1 | 3/2004 | Sato et al. |
| 2004/0069646 A1 | 4/2004 | Kunisawa et al. |
| 2005/0022325 A1 | 2/2005 | Uemukai et al. ............ 15/77 |
| 2005/0072358 A1 | 4/2005 | Katsuoka et al. |
| 2005/0158478 A1 | 7/2005 | Katsuoka et al. |
| 2005/0208774 A1 | 9/2005 | Fukunaga et al. |
| 2006/0045722 A1 | 3/2006 | Hashimoto |
| 2006/0098978 A1 | 5/2006 | Yasuda et al. |
| 2006/0236929 A1 | 10/2006 | Katsuoka et al. |
| 2006/0243204 A1 | 11/2006 | Katsuoka et al. |
| 2006/0243205 A1 | 11/2006 | Katsuoka et al. |
| 2006/0291855 A1 | 12/2006 | Shigemori et al. |
| 2007/0006895 A1 | 1/2007 | Iwami et al. |
| 2008/0199283 A1 | 8/2008 | Mitsuyoshi et al. |
| 2008/0251385 A1 | 10/2008 | Kunisawa et al. |
| 2008/0296165 A1 | 12/2008 | Kunisawa et al. |
| 2010/0159142 A1 | 6/2010 | Yasuda et al. |

FOREIGN PATENT DOCUMENTS

| | | |
|---|---|---|
| CN | 1891355 | 1/2007 |
| JP | 10-064860 | 3/1998 |
| JP | 2000-150338 | 5/2000 |
| JP | 2001-168009 | 6/2001 |
| JP | 2001-219391 | 8/2001 |
| JP | 2002-110609 | 4/2002 |
| JP | 2002-324828 | 11/2002 |
| JP | 2003-007663 | 1/2003 |
| JP | 2003-203892 | 7/2003 |
| JP | 2003-249429 | 9/2003 |
| JP | 2004-146708 | 5/2004 |
| JP | 2004-214222 | 7/2004 |
| JP | 2004-327519 | 11/2004 |
| JP | 2004-327674 | 11/2004 |
| JP | 2005-175036 | 6/2005 |
| JP | 2005-194613 | 7/2005 |
| JP | 2006-012880 | 1/2006 |
| JP | 2006-310733 | 11/2006 |
| JP | 2007-005659 | 1/2007 |
| KR | 2001-0109299 | 12/2001 |
| KR | 2003-0036087 | 5/2003 |

OTHER PUBLICATIONS

Office Action issued Oct. 27, 2009 in connection with corresponding Korean Patent Application No. 10-2008-0013336.

Office Action issued Mar. 6, 2009 in corresponding Chinese Application No. 200810005675.X.

Office Action (Notice of Reasons for Refusal) in counterpart Japanese Application 2011-266023 dated Mar. 26, 2013.

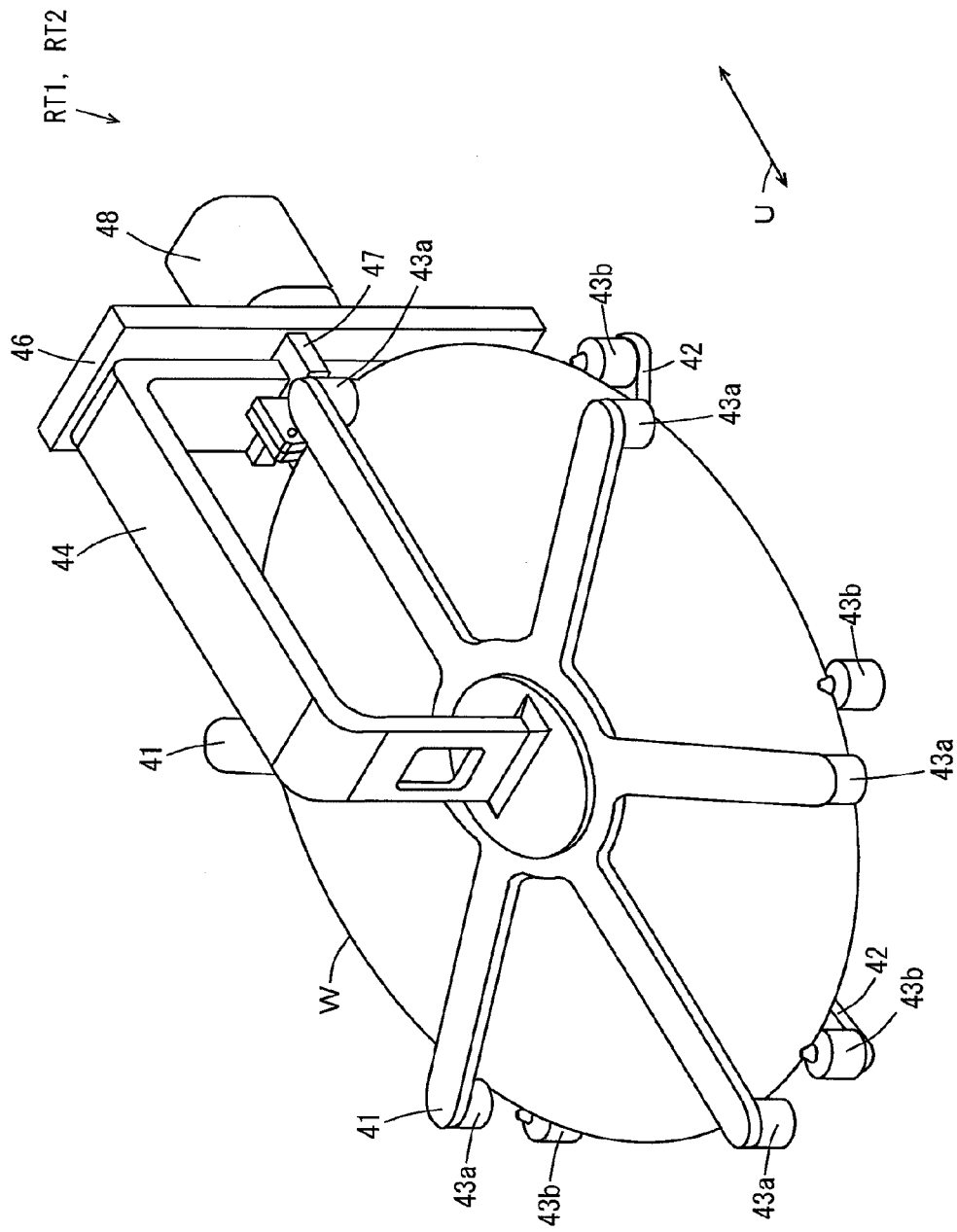
F I G. 6

F I G. 7
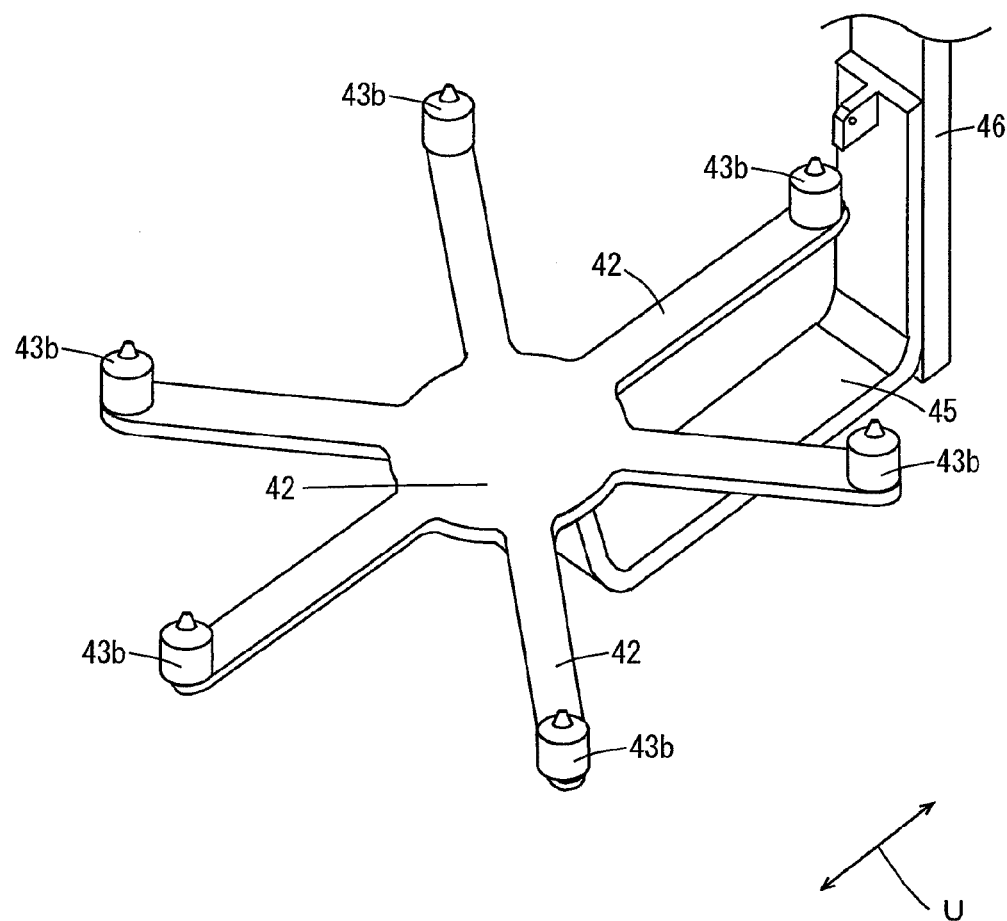

SUBSTRATE PROCESSING APPARATUS

CROSS-REFERENCE RELATED APPLICATION

This is a divisional application of U.S. application Ser. No. 12/029,608, filed Feb. 12, 2008, claiming priority to JP 2007-034203, filed Feb. 15, 2007 and JP 2007-034204, filed Feb. 15, 2007, all incorporated by reference in their entireties.

BACKGROUND OF THE INVENTION

1. Field of the Invention

The present invention relates to a substrate processing apparatus that subjects a substrate to processing.

2. Description of the Background Art

Substrate processing apparatuses have been conventionally used to perform various types of processes to substrates such as semiconductor wafers, glass substrates for photomasks, glass substrates for liquid crystal di splays, glass substrates for optical disks or the like.

For example, the substrate processing apparatus including a reversing unit that reverses a top surface and a back surface of the substrate is described in JP 2004-146708 A. In such a substrate processing apparatus, a center robot (transport unit) that transports the substrate is arranged in substantially the center of a rectangular processing section.

In the processing section, a plurality of (four, for example) back surface cleaning units that perform cleaning processes to the back surfaces of the substrates, respectively, are arranged so as to surround the center robot. In addition, the reversing unit is arranged in a position where the center robot can access in the processing section.

An indexer section including a plurality of storing containers that store the substrates is provided on one end of the processing section. A substrate transport robot that takes the substrate before processing out of the above-mentioned storing container or stores the substrate after the processing in the above-mentioned storing container is provided in this indexer section.

In the above-described configuration, the substrate transport robot takes the substrate before the processing out of any of the storing containers and transfers the substrate to the center robot while receiving the substrate after the processing from the center robot and storing the substrate in the storing container.

The center robot receives the substrate before the processing from the substrate transport robot and subsequently transfers the received substrate to the reversing unit. The reversing unit reverses the substrate received from the center robot so that the top surface thereof is directed downward. Then, the center robot receives the substrate reversed by the reversing unit and carries the substrate into any of the back surface cleaning units.

Next, when the processing is finished in any of the back surface cleaning units described above, the center robot carries the substrate out of the back surface cleaning unit and again transfers the substrate to the reversing unit. The reversing unit reverses the substrate that has been subjected to the processing in the back surface cleaning unit so that the top surface thereof is directed upward.

The center robot subsequently receives the substrate reversed by the reversing unit and transfers it to the substrate transport robot. The substrate transport robot receives the substrate after the processing from the center robot and stores it in the storing container.

In the above-described conventional substrate processing apparatus, however, an operation of the center robot becomes complicated because the number of transporting processes of the substrate is increased. In recent years, cleaning processing to an outer peripheral surface of the substrate has also been desired. If an end surface cleaning unit that performs the cleaning processing to the outer peripheral surface of the substrate is provided in addition to the foregoing configuration, the operation of the center robot becomes even more complicated. In this case, it becomes difficult to efficiently transport a plurality of substrates, and the throughput in substrate processing is significantly decreased.

Furthermore, there is the substrate processing apparatus including a top surface processing unit that performs the processing to the top surface of the substrate, the back surface processing unit that performs the processing to the back surface of the substrate and the reversing unit that reverses the top surface and the back surface of the substrate. In such a substrate processing apparatus, the center robot that transports the substrate is arranged at substantially the center of the rectangular processing section.

In the processing section, the top surface processing unit and the back surface processing unit are arranged so as to surround the center robot. In addition, the reversing unit is arranged in a position where the center robot can access in the processing section.

An indexer section including the plurality of storing containers that store the substrates is provided on one end of the processing section. The substrate transport robot that takes the substrate before the processing out of the above-mentioned storing container or stores the substrate after the processing in the above-mentioned storing container is provided in this indexer section.

In the above-described configuration, the substrate transport robot takes the substrate before the processing out of any of the storing containers and transfers it to the center robot while receiving the substrate after the processing from the center robot and storing it in the storing container.

The center robot receives the substrate before the processing from the substrate transport robot and subsequently carries the received substrate into the top surface cleaning unit. After the processing is finished in the top surface cleaning unit, the center robot carries the substrate out of the top surface cleaning unit, and then transfers it to the reversing unit. The reversing unit reverses the substrate received from the center robot so that the top surface thereof is directed downward. Then, the center robot receives the substrate reversed by the reversing unit and carries the substrate into the back surface cleaning units.

When the processing is finished in the back surface cleaning unit, the center robot carries the substrate out of the back surface cleaning unit and again transfers it to the reversing unit. The reversing unit reverses the substrate subjected to the processing in the back surface cleaning unit so that the top surface thereof is directed upward.

The center robot subsequently receives the substrate reversed by the reversing unit and transfers it to the substrate transport robot. The substrate transport robot receives the substrate after the processing from the center robot and stores it in the storing container.

As described above, the substrate is transported among the top surface processing unit, the back surface processing unit and the reversing unit by the single center robot. Accordingly, the number of the transporting processes of the substrate is increased, so that the operation of the center robot becomes complicated. This makes it difficult to efficiently transport the plurality of substrates, and reduces the throughput of the substrate processing.

SUMMARY OF THE INVENTION

It is an object of the present invention to provide a substrate processing apparatus capable of improving the throughput.

(1) According to an aspect of the present invention, a substrate processing apparatus that performs processing to a substrate having a top surface and a back surface includes first and second processing regions, arranged adjacent to each other, for performing the processing to the substrate, a carrying in and out region for carrying the substrate into and out of the first processing region, a first interface region provided between the carrying in and out region and the first processing region and a second interface region provided between the first processing region and the second processing region, wherein the first processing region includes a first processing section and a first transport device that transports the substrate among the first interface region, the first processing section and the second interface region, the second processing region includes a second processing section and a second transport device that transports the substrate between the second interface region and the second processing section, the carrying in and out region includes a container platform on which a storing container that stores the substrate is placed and a third transport device that transports the substrate between the storing container placed on the container platform and the first interface region, either one of the first and second processing sections includes a back surface cleaning processing section that cleans the back surface of the substrate, and at least one of the first interface region, the second interface region and a region on the opposite side to the second interface region relative to the second transport device includes a reversing device that reverses the top surface and the back surface of the substrate.

In this substrate processing apparatus, the substrate is carried from the carrying in and out region to the first processing region, and the processing is performed to the substrate in the first processing region and the second processing region. In the first processing region, the substrate is transported among the first interface region, the first processing section and the second interface region by the first transport device. In the second processing region, the substrate is transported between the second interface region and the second processing section by the second transport device. In the carrying in and out region, the substrate is transported between the storing container placed on the container platform and the first interface region by the third transport device.

The substrate is reversed by the reversing device in at least one of the first interface region, the second interface region and the region on the opposite side to the second interface region relative to the second transport device so that the back surface thereof is directed upward, and the back surface of the substrate is cleaned by the back surface cleaning processing section in one of the first and second processing sections.

Such a configuration allows transportation of the substrate by the first transport device and transportation of the substrate by the second transport device to be concurrently performed in the first processing region and the second processing region. Accordingly, a plurality of the substrates can be efficiently transported. This allows a transport time of the substrate in the first processing region and the second processing region to be shortened. As a result, the throughput in the substrate processing apparatus can be improved.

(2) Either one of the first and second processing sections may include an edge cleaning processing section that cleans an outer edge of the substrate while holding the back surface of the substrate, the reversing device may reverse the top surface and the back surface of the substrate cleaned by the edge cleaning processing section, and the back surface cleaning processing section may clean the back surface of the substrate reversed by the reversing device.

In this case, in either one of the first and second processing sections, the outer edge of the substrate is cleaned while the back surface thereof is held by the edge cleaning processing section. The top surface and the back surface of the substrate cleaned by the edge cleaning processing section are reversed by the reversing device in at least one of the first interface region, the second interface region and the region on the opposite side to the second interface region relative to the second transport device. The back surface of the substrate reversed by the reversing device is then cleaned by the back surface cleaning processing section in either one of the first and second processing sections.

As described above, the back surface of the substrate is cleaned by the back surface cleaning processing section after the outer edge of the substrate is cleaned by the edge cleaning processing section. Thus, even though the back surface of the substrate is contaminated by being held by the edge cleaning processing section, contaminants on the back surface of the substrate are removed in the back surface cleaning processing section. This allows the substrate to be sufficiently clean.

(3) The edge cleaning processing section may include a plurality of edge cleaning units arranged in a plurality of stages, and the back surface cleaning processing section may include a plurality of back surface cleaning units arranged in a plurality of stages.

In this case, the plurality of edge cleaning units and the plurality of back surface cleaning units are arranged in the plurality of stages, respectively, so that the outer edges of the plurality of substrates and the back surfaces of the plurality of substrates can be efficiently cleaned while the footprint can be reduced. This allows the throughput in the substrate processing apparatus to be further improved.

(4) Either one of the first and second processing sections may include a top surface cleaning processing section that cleans the top surface of the substrate.

In this case, the top surface of the substrate is cleaned by the top surface cleaning processing section in either one of the first and second processing sections.

(5) The top surface cleaning processing section may include a plurality of top surface cleaning units arranged in a plurality of stages.

In this case, the plurality of top surface cleaning units are arranged in the plurality of stages, so that the top surfaces of the plurality of substrates can be efficiently cleaned while the footprint can be reduced. This allows the throughput in the substrate processing apparatus to be further improved.

(6) The reversing device may include first and second reversing devices, the first interface region may include a first substrate platform in which the substrate is placed and the first reversing device, the second interface region may include a second substrate platform in which the substrate is placed and the second reversing device, the first processing section may include the back surface cleaning processing section, the second processing section may include the edge cleaning processing section and the top surface cleaning processing section, the first transport device may transport the substrate among the first substrate platform, the second substrate platform, the first reversing device, the second reversing device and the back surface cleaning processing section, the second transport device may transport the substrate among the second substrate platform, the second reversing device, the edge cleaning processing section and the top surface cleaning processing section, and the third transport device may transport the substrate among the storing container, the first substrate platform and the first reversing device.

In this case, the unprocessed substrate is taken out of the storing container by the third transport device, and placed on the first substrate platform. The substrate placed on the first substrate platform is placed on the second substrate platform by the first transport device. The substrate placed on the second substrate platform is carried into one of the edge cleaning processing section and the top surface cleaning processing section by the second transport device.

The substrate after cleaning by the one of the edge cleaning processing section and the top surface cleaning processing section is carried into the other of the edge cleaning processing section and the top surface cleaning processing section by the second transport device. The substrate after the cleaning by the top surface cleaning processing section and the edge cleaning processing section is carried into the second reversing device by the second transport device. The substrate reversed by the second reversing device so that the back surface thereof is directed upward is carried into the back surface cleaning processing section by the first transport device. The substrate after the cleaning by the back surface cleaning processing section is carried into the first reversing device by the first transport device. The substrate reversed by the first reversing device so that the top surface thereof is directed upward is returned to the storing container by the third transport device.

Such a configuration allows the transportation of the substrate by the first transport device and the transportation of the substrate by the second transport device to be concurrently performed. Thus, the plurality of substrates can be efficiently transported. This allows the transport time of the substrate in the substrate processing apparatus to be shortened. As a result, the throughput in the substrate processing apparatus can be improved.

In addition, the back surface of the substrate is cleaned by the back surface cleaning processing section after the outer edge of the substrate is cleaned by the edge cleaning processing section. Thus, even though the back surface of the substrate is contaminated in the edge cleaning processing section, contaminants on the back surface of the substrate are removed in the back surface cleaning processing section. This allows the substrate to be sufficiently clean.

Moreover, the substrate can be transferred from the second transport device to the first transport device while being reversed by the second reversing device in the second interface region. Furthermore, the substrate can be transferred from the first transport device to the third transport device while being reversed by the first reversing device in the first interface region. This allows the transport time of the substrate to be further shortened and the throughput in the substrate processing apparatus to be further improved.

(7) The first reversing device may reverse the substrate around a rotation axis crossing a line connecting a position of the first transport device and a position of the third transport device in transferring and receiving the substrate, and the second reversing device may reverse the substrate around a rotation axis crossing a line connecting the position of the first transport device and a position of the second transport device in transferring and receiving the substrate.

In this case, the substrate can be transferred and received between the first and third transport devices without change of the direction of the first reversing device, and the substrate can be transferred and received between the first and second transport devices without change of the direction of the second reversing device. Thus, configurations of the first and second reversing devices can be simplified while cost can be reduced. In addition, the directions of the first and second reversing devices are not required to be changed, so that the throughput in the substrate processing apparatus is improved.

(8) The first interface region may include a first substrate platform in which the substrate is placed, the second interface region may include a second substrate platform in which the substrate is placed and the reversing device, the first processing section may include the top surface cleaning processing section, the second processing section may include the edge cleaning processing section and the back surface cleaning processing section, the first transport device may transport the substrate among the first substrate platform, the second substrate platform, the reversing device and the top surface cleaning processing section, the second transport device transports the substrate among the second substrate platform, the reversing device, the edge cleaning processing section and the back surface cleaning processing section, and the third transport device may transport the substrate between the storing container and the first substrate platform.

In this case, the unprocessed substrate is taken out of the storing container by the third transport device, and placed on the first substrate platform. The substrate placed on the first substrate platform is placed on the second substrate platform by the first transport device. The substrate placed on the second substrate platform is carried into the edge cleaning processing section by the second transport device.

The substrate after the cleaning by the edge cleaning processing section is carried into the reversing device by the second transport device. The substrate reversed by the reversing device so that the back surface thereof is directed upward is carried into the back surface cleaning processing section by the second transport device. The substrate after the cleaning by the back surface cleaning processing section is carried into the reversing device by the second transport device. The substrate reversed by the reversing device so that the top surface thereof is directed upward is carried into the top surface cleaning processing section by the first transport device. The substrate after the cleaning by the top surface cleaning processing section is placed on the first substrate platform by the first transport device. The substrate placed on the first substrate platform is returned to the storing container by the third transport device.

Such a configuration allows the transportation of the substrate by the first transport device and the transportation of the substrate by the second transport device to be concurrently performed. Thus, the plurality of substrates can be efficiently transported. This allows the transport time of the substrate in the substrate processing apparatus to be shortened. As a result, the throughput in the substrate processing apparatus can be improved.

In addition, the back surface of the substrate is cleaned by the back surface cleaning processing section after the outer edge of the substrate is cleaned by the edge cleaning processing section. Thus, even though the back surface of the substrate is contaminated in the edge cleaning processing section, contaminants on the back surface of the substrate are removed in the back surface cleaning processing section. This allows the substrate to be sufficiently clean.

Furthermore, the substrate can be transferred from the second transport device to the first transport device while being reversed by the reversing device in the second interface region. This allows the transport time of the substrate to be further shortened and the throughput in the substrate processing apparatus to be further improved.

Note that the outer edge and the back surface of the substrate can be cleaned by the edge cleaning processing section and the back surface cleaning processing section after the top surface of the substrate is cleaned by the top surface cleaning processing section in the above-described configuration.

(9) The reversing device may reverse the substrate around a rotation axis crossing a line connecting a position of the first transport device and a position of the second transport device in transferring and receiving the substrate.

In this case, the substrate can be transferred and received between the first and second transport devices without change of the direction of the reversing device. This allows the configuration of the reversing device to be simplified while cost can be reduced. In addition, the direction of the reversing device is not required to be changed, so that the throughput in the substrate processing apparatus is improved.

(10) The other of the first and second processing sections may include a top surface cleaning processing section that cleans the top surface of the substrate.

In this case, the substrate is reversed by the reversing device so that the back surface thereof is directed upward in at least one of the first interface region, the second interface region and the region on the opposite side to the second interface region relative to the second transport device, and the back surface of the substrate is cleaned by the back surface cleaning processing section in one of the first and second processing sections. The substrate cleaned by the back surface cleaning processing section is again reversed by the reversing device so that the top surface thereof is directed upward. In the other of the first and second processing sections, the top surface of the substrate is cleaned by the top surface cleaning processing section.

Such a configuration allows the transportation of the substrate by the first transport device and the transportation of the substrate by the second transport device to be concurrently performed in the first processing region and the second processing region. Accordingly, the plurality of substrates can be efficiently transported. This allows the transport time of the substrate in the first processing region and the second processing region to be shortened. As a result, the throughput in the substrate processing apparatus can be improved.

(11) The back surface cleaning processing section may include a plurality of back surface cleaning units arranged in a plurality of stages, and the top surface cleaning processing section may include a plurality of top surface cleaning units arranged in a plurality of stages.

In this case, the plurality of back surface cleaning units and the plurality of top surface cleaning units are arranged in the plurality of stages, respectively, so that the back surfaces of the plurality of substrates and the top surfaces of the plurality of substrates can be efficiently cleaned while the footprint can be reduced. This allows the throughput in the substrate processing apparatus to be further improved.

(12) The reversing device may include first and second reversing devices, the first interface region may include a first substrate platform in which the substrate is placed and the first reversing device, the second interface region may include a second substrate platform in which the substrate is placed and the second reversing device, the first processing section may include the back surface cleaning processing section, the second processing section may include the top surface cleaning processing section, the first transport device may transport the substrate among the first substrate platform, the second substrate platform, the first reversing device, the second reversing device and the back surface cleaning processing section, the second transport device may transport the substrate among the second substrate platform, the second reversing device and the top surface cleaning processing section, and the third transport device may transport the substrate among the storing container placed on the container platform, the first substrate platform and the first reversing device.

In this case, the substrate is transported among the first substrate platform, the second substrate platform, the first reversing device, the second reversing device and the back surface cleaning processing section by the first transport device in the first processing region. In the second processing region, the substrate is transported among the second substrate platform, the second reversing device and the top surface cleaning processing section by the second transport device. In the carrying in and out region, the substrate is transported among the storing container placed on the container platform, the first substrate platform and the first reversing device by the third transport device.

Such a configuration allows the transportation of the substrate by the first transport device and the transportation of the substrate by the second transport device to be concurrently performed in the first processing region and the second processing region. Accordingly, the plurality of substrates can be efficiently transported. This allows the transport time of the substrate in the first processing region and the second processing region to be shortened. As a result, the throughput in the substrate processing apparatus can be improved.

Furthermore, the substrate can be transferred and received between the first transport device and the third transport device while being reversed by the first reversing device in the first interface region. Moreover, the substrate can be transferred and received between the first transport device and the second transport device while being reversed by the second reversing device in the second interface region. This allows the transport time of the substrate to be further shortened and the throughput in the substrate processing apparatus to be further improved.

(13) The first reversing device may reverse the substrate around a rotation axis crossing a line connecting a position of the first transport device and a position of the third transport device in transferring and receiving the substrate, and the second reversing device may reverse the substrate around a rotation axis crossing a line connecting the position of the first transport device and a position of the second transport device in transferring and receiving the substrate.

In this case, the substrate can be transferred and received between the first and third transport devices without change of the direction of the first reversing device, and the substrate can be transferred and received between the first and second transport devices without change of the direction of the second reversing device. This allows the configurations of the first and second reversing devices to be simplified while the cost can be reduced. In addition, the directions of the first and second reversing devices are not required to be changed, so that the throughput in the substrate processing apparatus is improved.

(14) The first interface region may include a first substrate platform in which the substrate is placed, the second interface region may include the reversing device, the first processing section may include the top surface cleaning processing section, the second processing section may include the back surface cleaning processing section, the first transport device may transport the substrate among the first substrate platform, the reversing device and the top surface cleaning processing section, the second transport device may transport the substrate between the reversing device and the back surface cleaning processing section, and the third transport device may transport the substrate between the storing container placed on the container platform and the first substrate platform.

In this case, in the first processing region, the substrate is transported among the first substrate platform, the reversing device and the top surface cleaning processing section by the first transport device. In the second processing region, the substrate is transported between the reversing device and the back surface cleaning processing section by the second transport device. In the carrying in and out region, the substrate is transported between the storing container placed on the container platform and the first substrate platform by the third transport device.

Such a configuration allows the transportation of the substrate by the first transport device and the transportation of the substrate by the second transport device to be concurrently performed in the first processing region and the second processing region. Accordingly, the plurality of substrates can be efficiently transported. This allows the transport time of the substrate in the first processing region and the second processing region to be shortened. As a result, the throughput in the substrate processing apparatus can be improved.

Moreover, the substrate can be transferred and received between the first transport device and the second transport device while being reversed by the reversing device in the second interface region. This allows the transport time of the substrate to be further shortened and the throughput in the substrate processing apparatus to be further improved.

(15) The reversing device may reverse the substrate around a rotation axis crossing a line connecting a position of the first transport device and a position of the second transport device in transferring and receiving the substrate.

In this case, the substrate can be transferred and received between the first and second transport devices without change of the direction of the reversing device. This allows the configuration of the reversing device to be simplified and the cost can be reduced. In addition, the direction of the reversing device is not required to be changed, so that the throughput in the substrate processing apparatus is improved.

(16) The first interface region may include a first substrate platform in which the substrate is placed, the second interface region may include a second substrate platform in which the substrate is placed, a region on the opposite side to the second interface region may include the reversing device, the first processing section may include the top surface cleaning processing section, the second processing section may include the back surface cleaning processing section, the first transport device transports the substrate among the first substrate platform, the second substrate platform and the top surface cleaning processing section, the second transport device may transport the substrate among the second substrate platform, the reversing device and the back surface cleaning processing section, and the third transport device may transport the substrate between the storing container placed on the container platform and the first substrate platform.

In this case, the substrate is transported among the first substrate platform, the second substrate platform and the top surface cleaning processing section by the first transport device in the first processing region. In the second processing region, the substrate is transported among the second substrate platform, the reversing device and the back surface cleaning processing section by the second transport device. In the carrying in and out region, the substrate is transported between the storing container placed on the container platform and the first substrate platform by the third transport device.

Such a configuration allows the transportation of the substrate by the first transport device and the transportation of the substrate by the second transport device to be concurrently performed in the first processing region and the second processing region. Accordingly, the plurality of substrates can be efficiently transported. This allows the transport time of the substrate in the first processing region and the second processing region to be shortened. As a result, the throughput in the substrate processing apparatus can be improved.

(17) The reversing device may include first and second reversing devices arranged one above the other. In this case, the substrate before the cleaning by the back surface cleaning processing section is reversed by the first reversing device and the substrate after the cleaning by the back surface cleaning processing section is reversed by the second reversing device. Thus, even though the back surface of the substrate before the cleaning by the back surface cleaning processing section is contaminated, contaminants are prevented from being transferred to the substrate after the back surface cleaning processing via the reversing device. Thus, the back surface of the substrate after the cleaning by the back surface cleaning processing section can be maintained in a clean state.

(18) The first reversing device may be used for reversing the substrate before cleaning by the back surface cleaning processing section, and the second reversing device may be used for reversing the substrate after the cleaning by the back surface cleaning processing section.

In this case, even though the back surface of the substrate before the cleaning by the back surface cleaning processing section is contaminated, contaminants are prevented from being transferred to the substrate after the back surface cleaning processing via the reversing device. Thus, the back surface of the substrate after the cleaning by the back surface cleaning processing section can be maintained in the clean state.

(19) The reversing device may include a first holding mechanism that holds the substrate in a state vertical to a first axis, a second holding mechanism that holds the substrate in the state vertical to the first axis, a supporting member that supports the first and second holding mechanisms so that the first and second holding mechanisms overlap with each other in a direction of the first axis, and a rotating device that integrally rotates the supporting member together with the first and second holding mechanisms around a second axis that is substantially vertical to the first axis.

In this case, the substrate is held by at least one of the first and second holding mechanisms in the state vertical to the first axis. In the state, the first and second holding mechanisms are integrally rotated around the second axis that is substantially vertical to the first axis by the rotating device. Thus, the substrate held by the first holding mechanism or the second holding mechanism is reversed.

Here, when each of the above-mentioned first to third transport devices has two transport holders and carries the substrate into and out of the reversing device by using the two transport holders, the two transport holders are arranged to overlap with each other in a direction parallel to the first axis, so that the two substrates can be simultaneously carried into the first and second holding mechanisms by the two transport holders while the two substrates can be simultaneously carried out of the first and second holding mechanisms by the two transport holders. Accordingly, the plurality of substrates can be efficiently reversed while the substrates can be quickly carried into and out of the reversing device.

(20) The first and second holding mechanisms may include a common reverse holding member having one surface and the other surface that are vertical to the first axis, the first holding mechanism may include a plurality of first supporters that are provided on the one surface of the common reverse holding member and support a periphery of the substrate, a first reverse holding member provided so as to face the one surface of the common reverse holding member, a plurality of second supporters that are provided on a surface, which faces the common reverse holding member, of the first reverse holding member and support the periphery of the substrate and a first driving mechanism that moves at least one of the first reverse holding member and the common reverse holding member so that the first reverse holding member and the common reverse holding member are selectively shifted between a state where the first reverse holding member and the common reverse holding member are spaced apart from each other in the direction of the first axis and a state where the first reverse holding member and the common reverse holding member are close to each other, and the second holding mechanism may include a plurality of third supporters that are provided on the other surface of the common reverse holding member and support the periphery of the substrate, a second reverse holding member provided so as to face the other surface of the common reverse holding member, a plurality of fourth supporters that are provided on a surface, which faces the common reverse holding member, of the second reverse holding member and support the periphery of the substrate and a second driving mechanism that moves at least one of the second reverse holding member and the common reverse holding member so that the second reverse holding member and the common reverse holding member are selectively shifted between a state where the second reverse holding member and the common reverse holding member are spaced apart from each other in the direction of the first axis and a state where the second reverse holding member and the common reverse holding member are close to each other.

In this case, the substrate is inserted into a space between the plurality of first supporters provided on the one surface of the common reverse holding member and the plurality of second supporters provided on the surface, which faces the common reverse holding member, of the first reverse holding member in the state where the first reverse holding member and the common reverse holding member are spaced apart from each other. In the state, at least one of the first reverse holding member and the common reverse holding member is moved by the first driving mechanism so that the first reverse holding member and the common reverse holding member are close to each other. Thus, the periphery of the substrate is held by the plurality of first supporters and the plurality of second supporters.

In this state, the first reverse holding member, the second reverse holding member and the common reverse holding member are integrally rotated around the second axis by the rotating device. Accordingly, the substrate held by the first reverse holding member and the common reverse holding member is reversed.

Moreover, the substrate is inserted into a space between the plurality of third supporters provided on the other surface of the common reverse holding member and the plurality of fourth supporters provided on the surface, which faces the common reverse holding member, of the second reverse holding member in the state where the second reverse holding member and the common reverse holding member are spaced apart from each other. In the state, at least one of the second reverse holding member and the common reverse holding member is moved by the second driving mechanism so that the second reverse holding member and the common reverse holding member come close to each other. Thus, the periphery of the substrate is held by the plurality of third supporters and the plurality of fourth supporters.

In this state, the first reverse holding member, the second reverse holding member and the common reverse holding member are integrally rotated around the second axis by the rotating device. Accordingly, the substrate held by the second reverse holding member and the common reverse holding member is reversed.

(21) According to another aspect of the invention, a substrate processing apparatus that performs processing to a substrate having a top surface and a back surface includes first and second processing regions, arranged adjacent to each other, for performing the processing to the substrate, a carrying in and out region for carrying the substrate into and out of the first processing region, a first interface that transfers and receives the substrate between the carrying in and out region and the first processing region and a second interface that transfers and receives the substrate between the first processing region and the second processing region, wherein the first processing region includes a first processing section and a first transport device that transports the substrate among the first interface, the first processing section and the second interface, the second processing region includes a second processing section and a second transport device that transports the substrate between the second interface and the second processing section, the carrying in and out region includes a container platform on which a storing container that stores the substrate is placed and a third transport device that transports the substrate between the storing container placed on the container platform and the first interface, one of the first and second processing sections includes a back surface cleaning processing section that cleans the back surface of the substrate, and at least one of the first interface and the second interface includes a reversing mechanism that reverses the top surface and the back surface of the substrate while transferring and receiving the substrate between the first transport device and the third transport device or between the first transport device and the second transport device.

In this substrate processing apparatus, the substrate is carried from the carrying in and out region to the first processing region, and the processing is performed to the substrate in the first processing region and the second processing region. In addition, the substrate is transferred and received between the carrying in and out region and the first processing region via the first interface, and the substrate is transferred and received between the first processing region and the second processing region via the second interface.

In the first processing region, the substrate is transported among the first interface, the first processing section and the second interface by the first transport device. In the second processing region, the substrate is transported between the second interface and the second processing section by the second transport device. In the carrying in and out region, the substrate is transported between the storing container placed on the container platform and the first interface by the third transport device.

In this case, transportation of the substrate by the first transport device and transportation of the substrate by the second transport device can be concurrently performed in the first processing region and the second processing region. Accordingly, a plurality of the substrates can be efficiently transported. This allows transport time of the substrate in the first processing region and the second processing region to be shortened. As a result, the throughput in the substrate processing apparatus can be improved.

Moreover, in at least one of the first interface and the second interface, the top surface and the back surface of the substrate are reversed while the substrate is transferred and received between the first transport device and the third transport device or between the first transport device and the second transport device by the reversing mechanism. The back surface of the reversed substrate is cleaned by the back surface cleaning processing section in one of the first and second processing sections.

In this case, the substrate is reversed while being transferred and received, so that the transport time of the substrate can be further shortened. This allows the throughput in the substrate processing apparatus to be further improved.

(22) One or the other of the first and second processing sections may include an edge cleaning processing section that cleans an outer edge of the substrate while holding the back surface of the substrate, the reversing mechanism may reverse the top surface and the back surface of the substrate cleaned by the edge cleaning processing section, and the back surface cleaning processing section may clean the back surface of the substrate reversed by the reversing mechanism.

In this case, in one or the other of the fist and second processing sections, the outer edge of the substrate is cleaned while the back surface thereof is held by the edge cleaning processing section. The top surface and the back surface of the substrate cleaned by the edge cleaning processing section are reversed by the reversing mechanism in at least one of the first interface and the second interface. The back surface of the substrate reversed by the reversing mechanism is then cleaned by the back surface cleaning processing section in one of the first and second processing sections.

As described above, the back surface of the substrate is cleaned by the back surface cleaning processing section after the outer edge of the substrate is cleaned by the edge cleaning processing section. Thus, even though the back surface of the substrate is contaminated by being held by the edge cleaning processing section, contaminants on the back surface of the substrate is removed in the back surface cleaning processing section. This allows the substrate to be sufficiently clean.

(23) The other of the first and second processing sections may include a top surface cleaning processing section that cleans the top surface of the substrate.

In this case, the substrate is reversed by the reversing mechanism so that the back surface thereof is directed upward in at least one of the first interface and the second interface, and the back surface of the reversed substrate is cleaned by the back surface cleaning processing section in one of the first and second processing sections. The substrate cleaned by the back surface cleaning processing section is again reversed by the reversing mechanism so that the top surface thereof is directed upward. In the other of the first and second processing sections, the top surface of the substrate is cleaned by the top surface cleaning processing section. Thus, the top surface and the back surface of the substrate can be sufficiently cleaned.

Other features, elements, characteristics, and advantages of the present invention will become more apparent from the following description of preferred embodiments of the present invention with reference to the attached drawings.

BRIEF DESCRIPTION OF THE DRAWINGS

FIG. 6 is a diagram showing the configuration of the reversing unit;

FIG. 7 is a diagram showing the configuration of the reversing unit;

DESCRIPTION OF THE PREFERRED EMBODIMENTS

A substrate processing apparatus according to an embodiment of the present invention will now be described with reference to drawings.

In the following description, a substrate refers to a semiconductor wafer, a glass substrate for a liquid crystal display, a glass substrate for a PDP (plasma display panel), a glass substrate for a photomask and a substrate for an optical disk or the like.

In the following description, a surface of the substrate on which a variety of patterns such as a circuit pattern or the like are to be formed is referred to as a top surface, and the opposite surface thereof is referred to as aback surface. In addition, a surface of the substrate directed downward is referred to as a lower surface and a surface of the substrate directed upward is referred to as an upper surface.

(1) First Embodiment

(1-1) Configuration of Substrate Processing Apparatus

Figure 1:
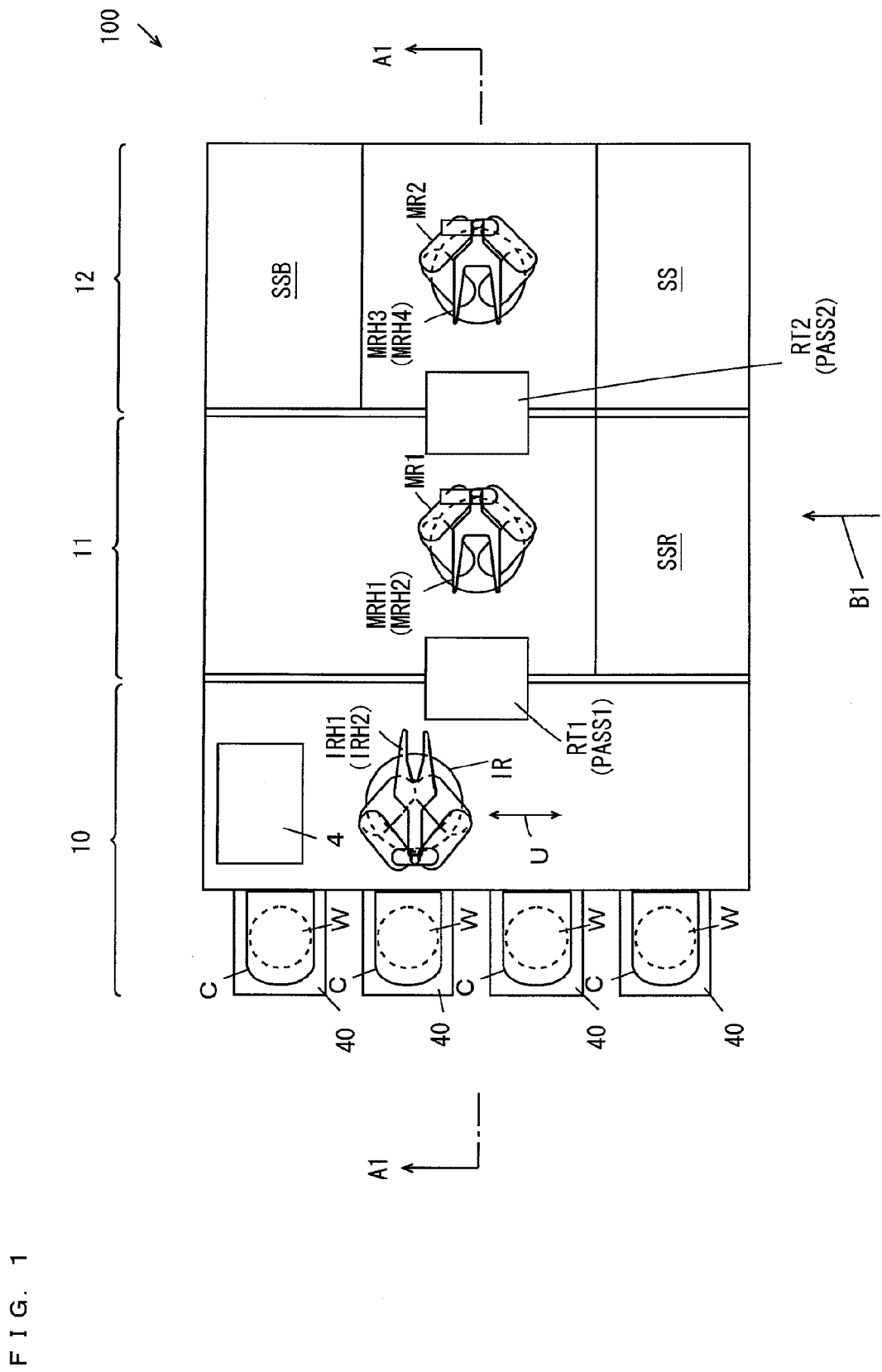
FIG. 1 is a diagram showing a configuration of a substrate processing apparatus according to a first embodiment.
Figure 2:
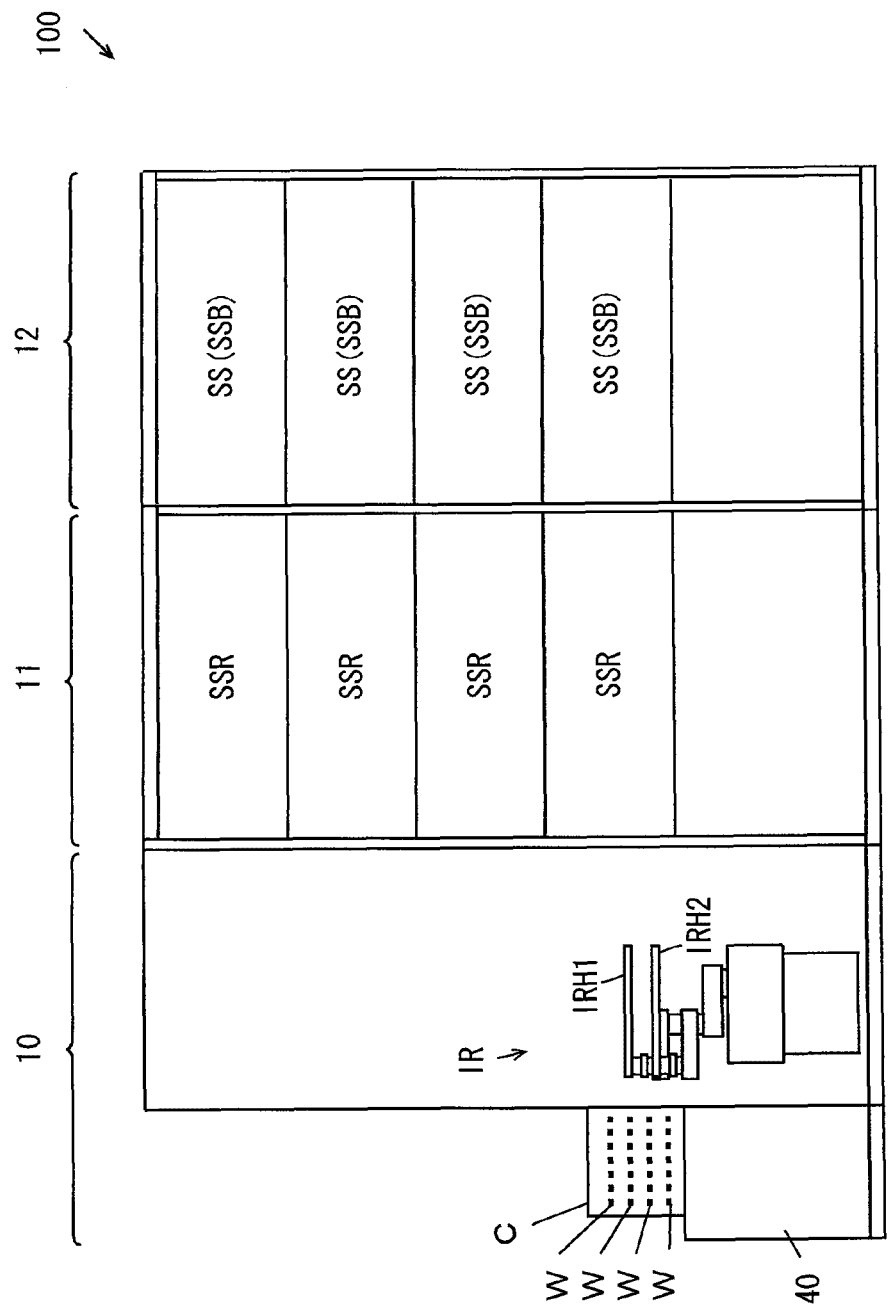
FIG. 2 is a diagram showing the configuration of the substrate processing apparatus according to the first embodiment.
Figure 3:
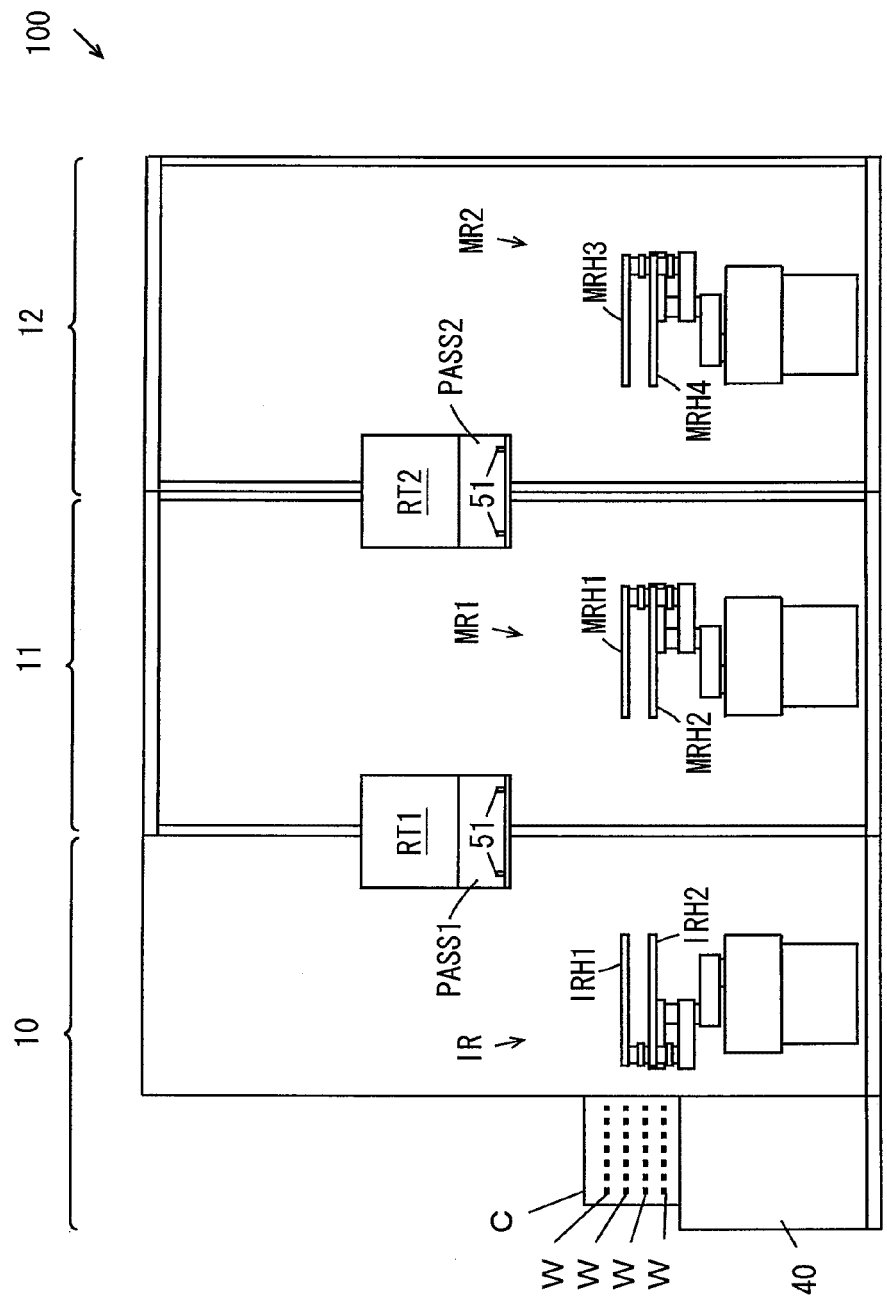
FIG. 3 is a diagram showing the configuration of the substrate processing apparatus according to the first embodiment.

FIGS. 1-3 are schematic views showing a configuration of a substrate processing apparatus according to a first embodiment. FIG. 1 is a plan view of the substrate processing apparatus, and FIG. 2 is a side view in which the substrate processing apparatus of FIG. 1 is seen from a direction of the arrow B1. FIG. 3 is a sectional view taken along the line A1-A1 of FIG. 1.

As shown in FIG. 1, the substrate processing apparatus 100 is composed of an indexer block 10, a first processing block 11 and a second processing block 12 that are provided in parallel with one another. The indexer block 10 is provided with a plurality of carrier platforms 40, an indexer robot IR and a controller 4. Carriers C that store a plurality of substrates W in multiple stages are placed on the carrier platforms 40, respectively.

The indexer robot IR is constructed so that it can move in a direction of the arrow U, rotate around a vertical axis and move up and down. The indexer robot IR has hands IRH1, IRH2 provided one above the other for transferring and receiving the substrate W. Each of the hands IRH1, IRH2 holds a peripheral portion of a lower surface of the substrate W and an outer edge of the substrate W. The controller 4 is composed of a computer or the like including a CPU (central processing unit), and controls each unit in the substrate processing apparatus 100.

As shown in FIG. 1 and FIG. 2, a plurality of (four in FIG. 2) back surface cleaning units SSR and a first main robot MR1 are provided in the first processing block 11. One side of the first processing block 11 has a vertical stack of the plurality of back surface cleaning units SSR (see FIG. 2). The first main robot MR1 is provided at substantially the center of the processing block 11, and constructed so that it can rotate around a vertical axis and move up and down.

The first main robot MR1 has hands MRH1, MRH2 provided one above the other for transferring and receiving the substrate W. Each of the hands MRH1, MRH2 holds the peripheral portion of the lower surface of the substrate W and the outer edge of the substrate W.

A plurality of (four in FIG. 2) top surface cleaning units SS, a plurality of (four in FIG. 2) end surface cleaning units SSB and a second main robot MR2 are provided in the second processing block 12. One side of the second processing block 12 has a vertical stack of the plurality of top surface cleaning units SS, and the other side of the second processing block 12 has a vertical stack of the plurality of end surface cleaning units SSB (see FIG. 2). The second main robot MR2 is provided at substantially the center of the second processing block 12, and constructed so that it can rotate around a vertical axis and move up and down.

As shown in FIG. 3, a reversing unit RT1 for reversing the substrate W and a substrate platform PASS1 for transferring and receiving the substrate W between the indexer robot IR and the first main robot MR1 are provided one above the other between the indexer block 10 and the first processing block 11. A reversing unit RT2 for reversing the substrate W and a substrate platform PASS2 for transferring and receiving the substrate W between the first main robot MR1 and the second main robot MR2 are provided one above the other between the first processing block 11 and the second processing block 12. Details of the reversing units RT1, RT2 will be described later.

Optical sensors (not shown) that detect the presence or absence of the substrate W are provided in the substrate platforms PASS1, PASS2. This allows determination as to whether or not the substrate W is placed in the substrate platforms PASS1, PASS2 to be made. A plurality of support pins 51 that support the lower surface of the substrate W are provided in each of the substrate platforms PASS1, PASS2. The substrate W is temporarily placed on the support pins 51 of the substrate platforms PASS1, PASS2 when the substrate W is transferred and received between the indexer robot IR and the first main robot MR and between the first main robot MR1 and the second main robot MR2.

(1-2) Summary of Operation of the Substrate Processing Apparatus

Next, a summary of an operation of the substrate processing apparatus 100 will be described with reference to FIGS. 1-3. Note that an operation of each component of the substrate processing apparatus 100, described below, is controlled by the controller 4 of FIG. 1.

First, the indexer robot IR takes the unprocessed substrate W out of one of the carriers C placed on the carrier platforms 40 in the indexer block 10. The indexer robot IR rotates around the vertical axis while moving in the direction of the arrow U, and places the substrate W in the substrate platform PASS1. The substrate W placed in the substrate platform PASS1 is received by the first main robot MR1 in the first processing block 11, and subsequently placed in the substrate platform PASS2. The substrate W placed in the substrate platform PASS2 is received by the second main robot MR2 in the second processing block 12, and then carried into the end surface cleaning unit SSB.

In the end surface cleaning unit SSB, cleaning processing is performed to an end surface of the substrate W. Hereinafter, the cleaning processing to the end surface of the substrate W is referred to as the end surface cleaning processing. Note that details of the end surface cleaning processing by the end surface cleaning unit SSB will be described later.

The substrate W after the end surface cleaning processing is carried out of the end surface cleaning unit SSB by the second main robot MR2, and subsequently carried into the top surface cleaning unit SS. In the top surface cleaning unit SS, the cleaning processing is performed to a top surface of the substrate W. Hereinafter, the cleaning processing to the top surface of the substrate W is referred to as the top surface cleaning processing. Details of the top surface cleaning processing by the top surface cleaning unit SS will be described later.

The substrate W after the top surface cleaning processing is carried out of the top surface cleaning unit SS by the second main robot MR2 and then carried into the reversing unit RT2. In the reversing unit RT2, the substrate W with the top surface thereof directed upward is reversed so that a back surface thereof is directed upward. The substrate W after the reversing is carried out of the reversing unit RT2 by the first main robot MR1 in the first processing block 11, and subsequently carried into the back surface cleaning unit SSR.

In the back surface cleaning unit SSR, the cleaning processing is performed to the back surface of the substrate W. Hereinafter, the cleaning processing to the back surface of the substrate W is referred to as the back surface cleaning processing. Note that details of the back surface cleaning processing by the back surface cleaning unit SSR will be described later. The substrate W after the back surface cleaning processing is carried out of the back surface cleaning unit SSR by the first main robot MR1, and then carried into the reversing unit RT1. In the reversing unit RT1, the substrate W with the back surface thereof directed upward is reversed so that the top surface thereof is directed upward.

The substrate W after the reversing is carried out of the reversing unit RT1 by the indexer robot IR in the indexer block 10, and stored in the carrier C on the carrier platform 40.

(1-3) Details of the Main Robots

(1-3-1) Configurations of the First Main Robot and the Second Main Robot

Figure 4:
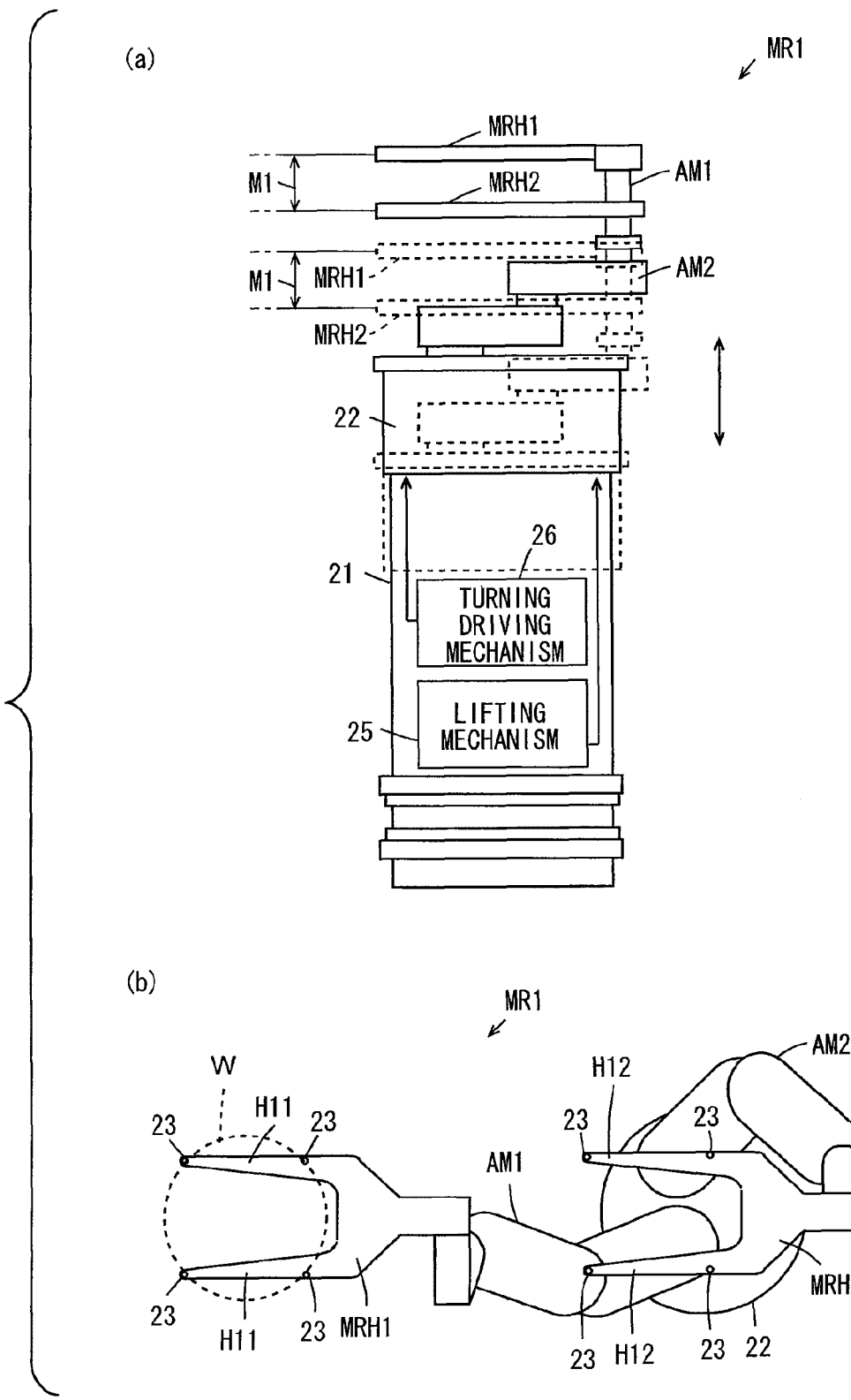
FIG. 4 is a diagram showing a configuration of a first main robot.

Next, detailed configurations of the first and second main robots MR1, MR2 are described. Here, the detailed configuration of the first main robot MR1 is described. The configuration of the second main robot MR2 is the same as the configuration of the first main robot MR1 shown below. FIG. 4 (a) is a side view of the first main robot MR1, and FIG. 4 (b) is a plan view of the first main robot MR1.

As shown in FIG. 4 (a) and FIG. 4 (b), the first main robot MR1 includes a base 21, to which a moving portion 22 is attached so as to be able to vertically move and turn with respect to the base 21. The hands MRH1 and MRH2 are connected to the moving portion 22 by multi-joint type arms AM1 and AM2, respectively.

The moving portion 22 is moved up and down by a lifting mechanism 25 provided in the base 21 while being turned around a vertical axis by a turning driving mechanism 26 provided in the base 21.

The multi-joint type arms AM1, AM2 are independently driven by driving mechanisms that are not shown, respectively, and horizontally move the respective hands MRH1, MRH2 forward and backward while keeping them in fixed postures.

Each of the hands MRH1, MRH2 is arranged to have a certain height with respective to the moving portion 22, and the hand MRH1 is positioned above the hand MRH2. A difference M1 (FIG. 4 (a)) in height between the hand MRH1 and the hand MRH2 is maintained constant.

The hands MRH1, MRH2 have the same shape and are formed to be approximately U-shaped, respectively. The hand MRH1 has two claw portions H11 extending substantially in parallel with each other and the hand MRH2 has two claw portions H12 extending substantially in parallel with each other.

Furthermore, a plurality of support pins 23 are attached on the hands MRH1, MRH2, respectively. In the present embodiment, the four support pins 23 are attached on the upper surfaces of the hands MRH1, MRH2, respectively, at substantially equal distances from each other along the outer circumference of the substrate W placed thereon. The peripheral portion of the lower surface of the substrate W and the outer edge of the substrate W are held by the four support pins 23.

(1-3-2) Example of Operation of the First Main Robot

Next, a specific example of an operation of the first main robot MR1 is described with reference to FIG. 1.

First, the first main robot MR1 receives the unprocessed substrate W from the substrate platform PASS1 by the hand MRH2 Next, the first main robot MR1 carries the substrate W with the back surface thereof directed upward out of the reversing unit RT2 by the hand MRH1. This substrate W has already been subjected to the end surface cleaning processing and the top surface cleaning processing. The unprocessed substrate W held by the hand MRH2 is subsequently placed in the substrate platform PASS2.

Then, the first main robot MR1 carries the substrate W after the back surface cleaning processing out of any of the back surface cleaning units SSR by the hand MRH2, and carries the substrate W held by the hand MRH1 into the back surface cleaning unit SSR. The first main robot MR1 subsequently carries the substrate W, held by the hand MRH2, after the back surface cleaning processing into the reversing unit RT1.

The first main robot MR1 successively performs a series of such operations. Note that the operation of the hand MRH1 and the operation of the hand MRH2 may be reverse to each other in the above-described example of the operation.

The first main robot MR1 performs three transporting processes for the single substrate W, that is, a transporting process from the substrate platform PASS1 to the substrate platform PASS2, a transporting process from the reversing unit RT2 to the back surface cleaning unit SSR and a transporting process from the back surface cleaning unit SSR to the reversing unit RT1.

(1-3-3) Operation of the Second Main Robot

Next, a specific example of an operation of the second main robot MR2 is described with reference to FIG. 1.

The second main robot MR2 firstly receives the unprocessed substrate W from the substrate platform PASS2 by the hand MRH4. Then, the second main robot MR2 carries the substrate W after the end surface cleaning processing out of any of the end surface cleaning units SSB by the hand MRH3, and carries the substrate W held by the hand MRH4 into the end surface cleaning unit SSB. The second main robot MR2 subsequently carries the substrate W after the top surface cleaning processing out of any of the top surface cleaning units SS by the hand MRH4, and carries the substrate W held by the hand MRH3 into the top surface cleaning unit SS. After that, the second main robot MR2 carries the substrate W held by the hand MRH4 into the reversing unit RT2.

The second main robot MR2 successively performs a series of such operations. Note that the operation of the hand MRH3 and the operation of the hand MRH4 may be reverse to each other in the above-described example of the operation.

The second main robot MR2 performs three transporting processes for the single substrate W, that is, a transporting process from the substrate platform PASS2 to the end surface cleaning unit SSB, a transporting process from the end surface cleaning unit SSB to the top surface cleaning unit SS and a transporting process from the top surface cleaning unit SS to the reversing unit RT2. Such an operation of the second main robot MR2 is performed concurrently with the above-described operation of the first main robot MR1.

(1-4) Configuration and Operation of the Reversing Unit

Next, configurations of the reversing units RT1, RT2 are described. Note that the reversing units RT1, RT2 have the same configuration.

Figure 5:
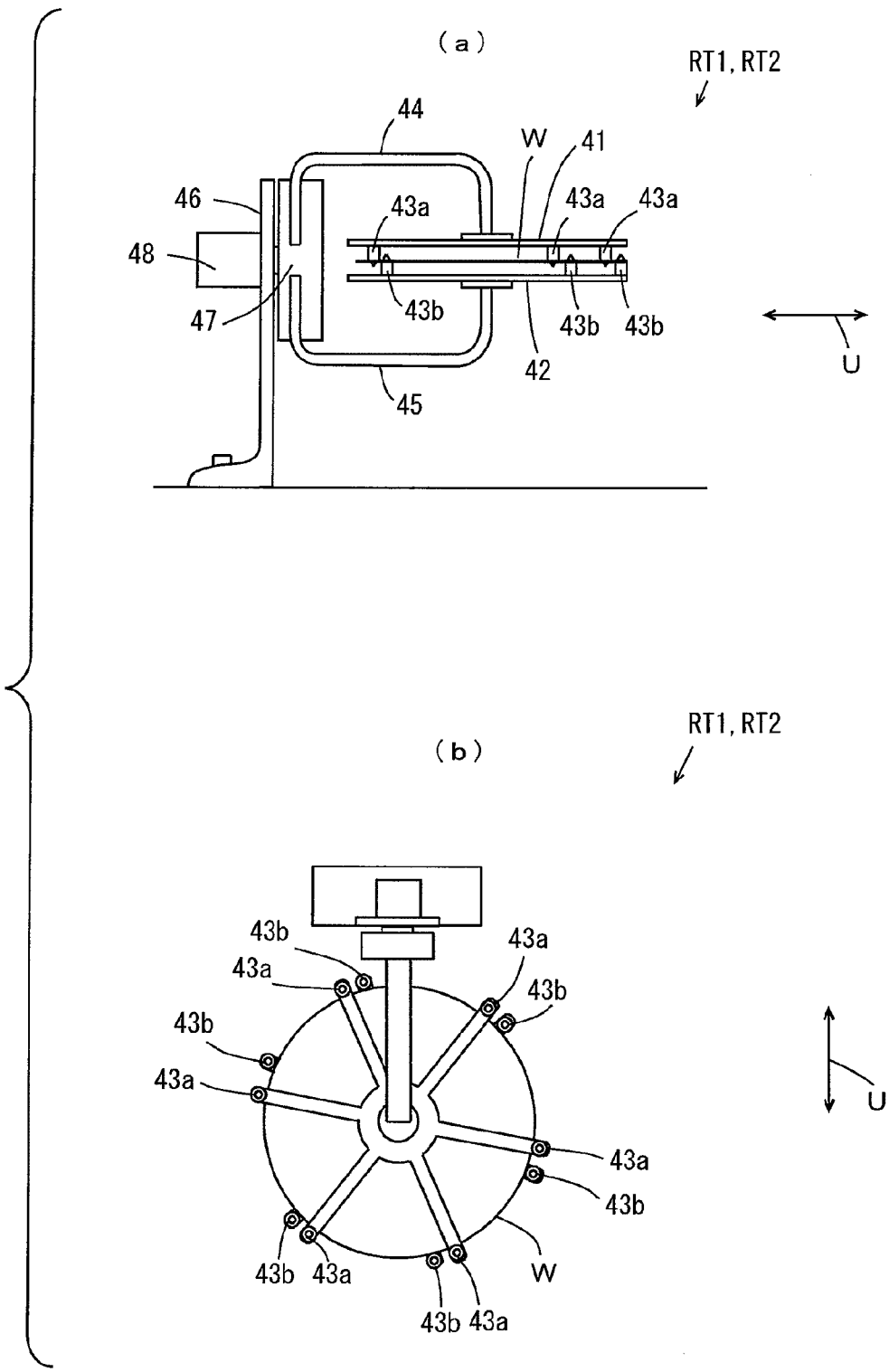
FIG. 5 is a diagram showing a configuration of a reversing unit.

FIG. 5 is a schematic structural diagram of the reversing unit RT1, RT2 of FIG. 1. FIG. 5 (a) is a side view of the reversing unit RT1, RT2, and FIG. 5 (b) is a top view of the reversing unit RT1, RT2. FIG. 6 is a perspective view showing the appearance of a main part of the reversing unit RT1, RT2, and FIG. 7 is a perspective view showing the appearance of a part of the reversing unit RT1, RT2.

As shown in FIG. 5, the reversing unit RT1, RT2 includes a first supporting member 41, a second supporting member 42, a plurality of substrate support pins 43a, 43b, a first movable member 44, a second movable member 45, a fixed plate 46, a link mechanism 47 and a rotating mechanism 48.

As shown in FIG. 6, the first supporting member 41 is composed of six bar-shaped members that extend radially. An end portion of each of the six bar-shaped members is provided with the substrate support pin 43a. Similarly, as shown in FIG. 7, the second supporting member 42 is composed of six bar-shaped members that extend radially. An end portion of each of the six bar-shaped members is provided with the substrate support pin 43b.

While the first and second supporting members 41, 42 are each composed of the six bar-shaped members in the present embodiment, the first and second supporting members 41, 42 may be each composed of any number of bar-shaped members or other members having any other shape, including, for example, a disk or polygonal shape with an outer circumference corresponding to the plurality of support pins 43a, 43b.

The first movable member 44 of FIG. 6 is U-shaped with one end and the other end thereof vertically extending and a center portion thereof extending in the direction of the arrow U. The first supporting member 41 is fixed to one end of the first movable member 44. The other end of the first movable member 44 is connected to the link mechanism 47. Similarly, the second movable member 45 of FIG. 7 is U-shaped. The second supporting member 42 is fixed to one end of the second movable member 45. The other end of the second movable member 45 is connected to the link mechanism 47. The link mechanism 47 is attached to a rotation shaft of the rotating mechanism 48. The link mechanism 47 and the rotating mechanism 48 are attached to the fixed plate 46.

The link mechanism 47 of FIG. 6 incorporates an air cylinder or the like, and is capable of selectively shifting the first movable member 44 and the second movable member 45 between a state where they are spaced apart from each other and a state where they are close to each other. The rotating mechanism 48 incorporates a motor or the like, and is capable of rotating the first movable member 44 and the second movable member 45 via the link mechanism 47 through, for example, 180 degrees around an horizontal axis.

Here, the operation of the reversing unit RT1, RT2 is described with reference to drawings. First, the substrate W is carried into the reversing unit RT1, RT2 by the first or second main robot MR1, MR2 (FIG. 1). The substrate W is transferred onto the plurality of substrate support pins 43b of the second supporting member 42 by the first or second main robot MR1, MR2 in the state where the first movable member 44 and the second movable member 45 are vertically spaced apart from each other.

Then, as shown in FIG. 5 (a), the link mechanism 47 operates to shift the first movable member 44 and the second movable member 45 to the state where they are vertically close to each other. Accordingly, both sides of the substrate W are supported by the plurality of substrate support pins 43a, 43b, respectively.

Next, the rotating mechanism 48 operates to rotate the first movable member 44 and the second movable member 45 through 180 degrees around an axis parallel to the direction of the arrow U. Thus, the substrate W is rotated through 180 degrees together with the first movable member 44 and the second movable member 45 while being held by the plurality of substrate support pins 43a, 43b provided on the first supporting member 41 and the second supporting member 42. Thus, the substrate W is reversed.

The link mechanism 47 subsequently operates to shift the first movable member 44 and the second movable member 45 to the state where they are vertically spaced apart from each other. In this state, the substrate W is carried out of the reversing unit RT1, RT2 by the indexer robot IR or the first main robot MR1.

(1-5) The Details of the End Surface Cleaning Unit

Figure 8:
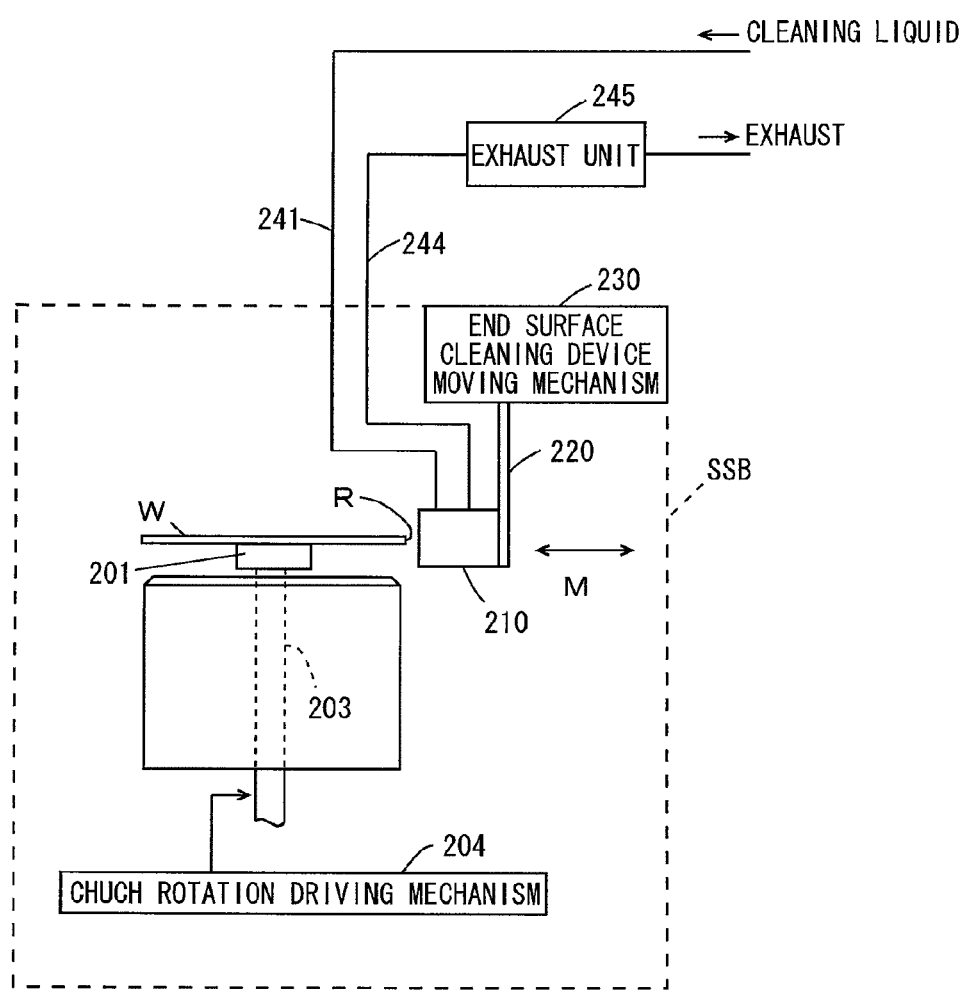
FIG. 8 is a diagram showing a configuration of an end surface cleaning unit SSB.

FIG. 8 is a diagram for explaining a configuration of the end surface cleaning unit SSB. As shown in FIG. 8, the end surface cleaning unit SSB includes a spin chuck 201 for rotating the substrate W around a vertical rotation axis passing through the center of the substrate W while horizontally holding the substrate W.

The spin chuck 201 is secured to an upper end of a rotation shaft 203, which is rotated by a chuck rotation driving mechanism 204. A suction path (not shown) is formed in the spin chuck 201. Air inside the suction path is exhausted with the substrate W placed on the spin chuck 201 to adsorb the back surface of the substrate W on the spin chuck 201 under vacuum, so that the substrate W can be held in a horizontal posture.

An end surface cleaning device moving mechanism 230 is provided beside the spin chuck 201 and in an upper part of the end surface cleaning unit SSB. A bar-shaped supporting member 220 extending downward is attached to the end surface cleaning device moving mechanism 230. The supporting member 220 moves in a horizontal direction (see the arrow M in FIG. 8) by the end surface cleaning device moving mechanism 230.

An end surface cleaning device 210 having a substantially cylindrical shape is attached to a lower end of the supporting member 220 so as to horizontally extend. This causes the end surface cleaning device 210, together with the supporting member 220, to be moved by the end surface cleaning device moving mechanism 230.

The end surface cleaning device 210 is positioned at substantially the same level as the substrate W held by suction on the spin chuck 21. This causes one end of the end surface cleaning device 210 to face an end surface R of the substrate W. In the following description, the one end, which faces the end surface R of the substrate W, of the end surface cleaning device 210 is taken as a front.

At the start of the end surface cleaning processing of the substrate W, the end surface cleaning device 210 is moved to a position facing the end surface of the substrate W by the end surface cleaning device moving mechanism 230. When the end surface cleaning processing of the substrate W is finished, the end surface cleaning device 210 is moved by the end surface cleaning device moving mechanism 230 so as to be away from the end surface R of the substrate W.

A cleaning liquid supply pipe 241 and an exhaust pipe 244 are connected to the end surface cleaning device 210. The cleaning liquid is supplied to an inner space (a cleaning chamber 211, described later) of the end surface cleaning device 210 through the cleaning liquid supply pipe 241. Moreover, the exhaust pipe 244 is connected to an exhaust unit 245. The exhaust unit 245 sucks in an atmosphere in the inner space of the end surface cleaning device 210, and exhausts the air through the exhaust pipe 244.

Figure 9:
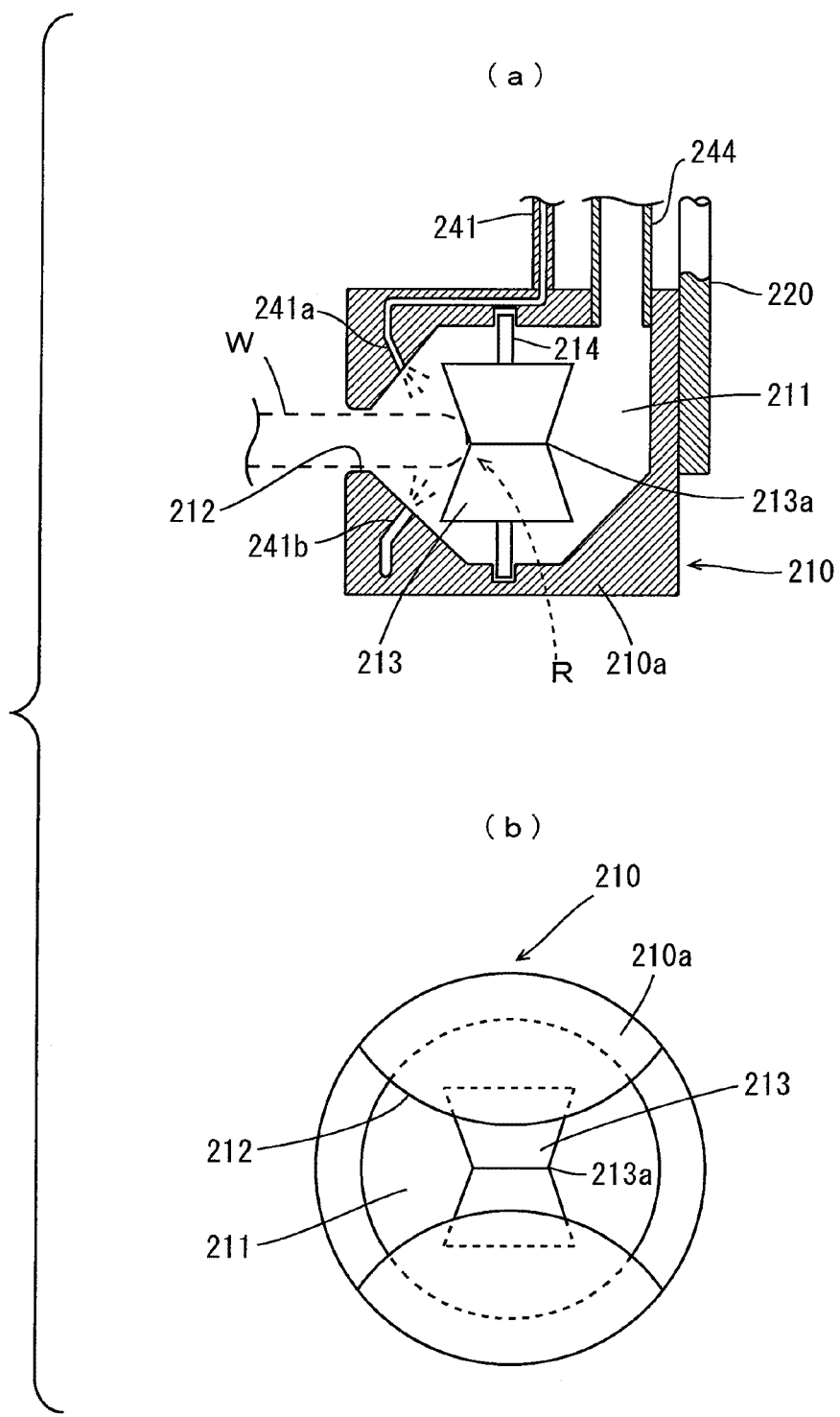
FIG. 9 is a diagram showing the configuration of an end surface cleaning device of the end surface cleaning unit SSB.

The details of the end surface cleaning device 210 will be described. FIG. 9 is a diagram for explaining a configuration of the end surface cleaning device 210 of the end surface cleaning unit SSB shown in FIG. 8. FIG. 9 (a) is a vertical sectional view of the end surface cleaning device 210, and FIG. 9 (*b*) is a front view of the end surface cleaning device 210.

As shown in FIG. 9 (*a*), the cleaning chamber 211 is formed inside a substantially cylindrical housing 210*a* in the end surface cleaning device 210. As shown in FIG. 9 (*a*) and FIG. 9 (*b*), an opening 212 for causing the cleaning chamber 211 and the outside of the housing 210*a* to communicate with each other is formed on a front of the housing 210*a*. The opening 212 has an upper surface and a lower surface in a circular arc shape such that the vertical width thereof is gradually enlarged sideward on both sides from the center thereof. During the end surface cleaning processing of the substrate W, the end surface R of the substrate W held by suction on the spin chuck 201 is inserted into the opening 212.

A brush 213 having a substantially cylindrical shape is arranged so as to vertically extend within the cleaning chamber 211. A V-shaped groove 213*a* is formed over a circumferential direction on the outer periphery of the brush 213. The brush 213 is attached to a rotation shaft 214 that vertically extends. An upper end and a lower end of the rotation shaft 214 are rotatably attached to rotation bearings, respectively, formed at the top and the bottom of the cleaning chamber 211. This causes the brush 213 to be rotatably supported by the cleaning chamber 211 and the rotation shaft 214.

During the end surface cleaning processing of the substrate W, the end surface R of the rotating substrate W and the groove 213*a* formed on the brush 213 come into contact with each other. This causes the end surface R of the substrate W to be cleaned with the brush 213.

The cleaning liquid supply pipe 241 and the exhaust pipe 244, described above, are connected to the top of the end surface cleaning device 210. The cleaning liquid supply pipe 241 is connected to cleaning liquid supply paths 241*a*, 241*b* formed within the housing 210*a*. As shown in FIG. 9 (*a*), the cleaning liquid supply path 241*a* extends to an inner surface at the top of the cleaning chamber 211 from the outside of the housing 210*a*. The cleaning liquid supply path 241*b* extends to an inner surface at the bottom of the cleaning chamber 211 from the outside of the housing 210*a*. FIG. 9 (*a*) illustrates only a part of the cleaning liquid supply pipe 241*b*.

This causes the cleaning liquid supplied to the end surface cleaning device 210 to be sprayed in the vertical direction toward the end surface R of the substrate W coming into contact with the brush 213 within the cleaning chamber 211 during the end surface cleaning processing of the substrate W. Accordingly, the end surface R of the substrate W to be efficiently cleaned.

The exhaust pipe 244 is inserted into the cleaning chamber 211 through a hole provided at the top of the housing 210*a*. This causes an atmosphere in the cleaning chamber 211 to be sucked in by the exhaust unit 245 shown in FIG. 8 and exhausted through the exhaust pipe 244. In the cleaning chamber 211, the atmosphere inside thereof is exhausted by the exhaust unit 245, so that the volatilized cleaning liquid and a mist of the cleaning liquid are efficiently exhausted.

(1-6) Details of the Top Surface Cleaning Unit and the Back Surface Cleaning Unit Next, configurations of the top surface cleaning unit SS and the back surface cleaning unit SSR shown in FIG. 1 will be described.

Figure 10:
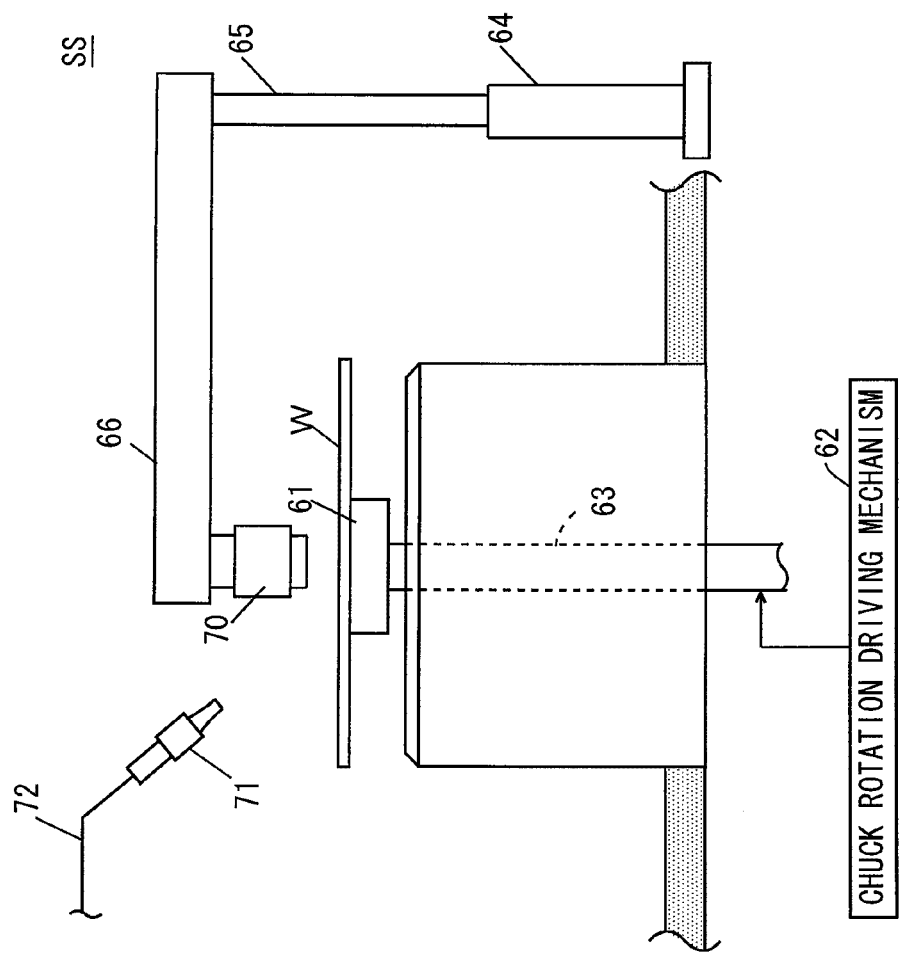
FIG. 10 is a diagram showing a configuration of a top surface cleaning unit SS.
Figure 11:
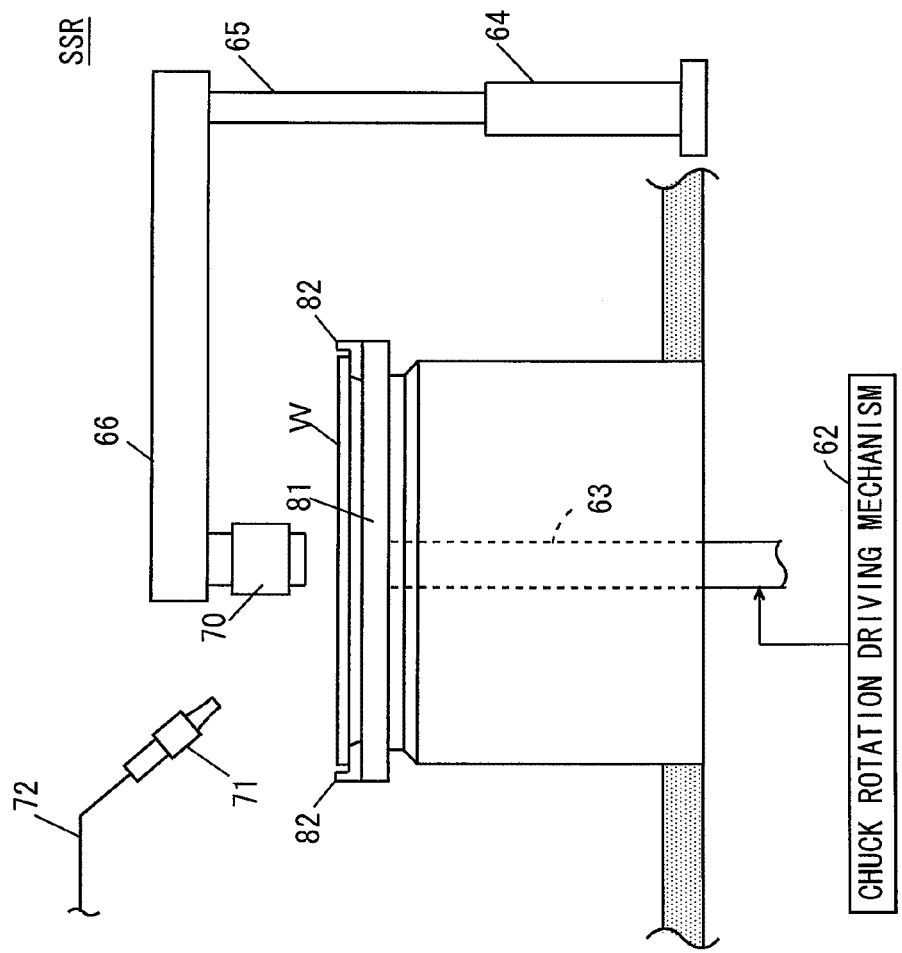
FIG. 11 is a diagram showing a configuration of a back surface cleaning unit SSR.

FIG. 10 is a schematic view showing the configuration of the top surface cleaning unit SS, and FIG. 11 is a schematic view showing the configuration of the back surface cleaning unit SSR. In each of the top surface cleaning unit SS shown in FIG. 10 and the back surface cleaning unit SSR shown in FIG. 11, the cleaning processing to the substrate W by using a brush (hereinafter referred to as the scrub cleaning processing) is performed.

As shown in FIG. 10, the top surface cleaning unit SS includes a spin chuck 61 for rotating the substrate W around a vertical axis passing through the center of the substrate W while holding the substrate W horizontally. The spin chuck 61 is secured to an upper end of a rotation shaft 63 that is rotated by a chuck rotation driving mechanism 62. Similarly to the spin chuck 201 in the above-described end surface cleaning unit SSB, the spin chuck 61 holds the substrate W by absorbing the lower surface of the substrate W thereon under vacuum. A mechanical type spin chuck (see FIG. 11, described later) that holds the outer edge of the substrate W may be used in the top surface cleaning unit SS instead of the suction-type spin chuck 61.

As described above, the substrate W with the top surface thereof directed upward is carried into the top surface cleaning unit SS. When the scrub cleaning processing and a rinsing processing are performed, the back surface of the substrate W is held by suction on the spin chuck 61.

A motor 64 is provided outside the spin chuck 61. A rotation shaft 65 is connected to the motor 64. An arm 66 is coupled to the rotation shaft 65 so as to horizontally extend, and a substantially cylindrical brush cleaner 70 is provided on the tip of the arm 66.

In addition, above the spin chuck 61, a liquid discharge nozzle 71 is provided for supplying a cleaning liquid or a rinse liquid (pure water) onto the top surface of the substrate W held by the spin chuck 61. A supply pipe 72 is connected to the liquid discharge nozzle 71, and the cleaning liquid and the rinse liquid are selectively supplied to the liquid discharge nozzle 71 through this supply pipe 72.

In the scrub cleaning processing, the motor 64 rotates the rotation shaft 65. Thus, the arm 66 turns within a horizontal plane, and the brush cleaner 70 moves between a position outside the substrate W and a position above the center of the substrate W, centered around the rotation shaft 65. A lifting mechanism (not shown) is provided in the motor 64. The lifting mechanism lifts and lowers the brush cleaner 70 in the position outside the substrate W and the position above the center of the substrate W by lifting and lowering the rotation shaft 65.

At the start of the scrub cleaning processing, the substrate W with the top surface thereof directed upward is rotated by the spin chuck 61. Moreover, the cleaning liquid or the rinse liquid is supplied to the liquid discharge nozzle 71 through the supply pipe 72. Thus, the cleaning liquid or the rinse liquid is supplied onto the top surface of the substrate W that rotates. In this state, the brush cleaner 70 is swung and moved up and down by the rotation shaft 65 and the arm 66. Accordingly, the scrub cleaning processing is performed to the top surface of the substrate W. Note that since the suction-type spin chuck 61 is used in the top surface cleaning unit SS, the peripheral portion and the outer edge of the substrate W can be simultaneously cleaned.

Next, for the back surface cleaning unit SSR, different points from the top surface cleaning unit SS shown in FIG. 10 will be described by referring to FIG. 11. As shown in FIG. 11, the back surface cleaning unit SSR includes a mechanical type spin chuck 81 that holds the outer edge of the substrate W instead of the suction-type spin chuck 61 that holds the lower surface of the substrate W by vacuum suction. When the scrub cleaning processing and the rinsing processing are performed, the substrate W is rotated while being maintained in the horizontal posture with the peripheral portion of the lower surface and the outer edge thereof held by the spin holding pins 82 on the spin chuck 61.

The substrate W with the back surface thereof directed upward is carried into the back surface cleaning unit SSR. Therefore, the substrate W is held by the spin chuck 81 with the back surface thereof directed upward. Then, a scrub cleaning processing that is similar to the above described scrub cleaning processing is performed to the back surface of the substrate W.

In the above mentioned end surface cleaning unit SSB and top surface cleaning unit SS, the back surface of the substrate W is sucked onto the suction-type spin chucks 201, 61. In this case, a suction mark is likely to be formed on the back surface of the substrate W. In the back surface cleaning unit SSR, the back surface of the substrate W is cleaned, so that the suction mark formed during the end surface cleaning processing and the top surface cleaning processing can be removed.

(1-7) Effects of the First Embodiment

In the present embodiment, the first main robot MR1 is provided in the first processing block 11 and the second main robot MR2 is provided in the second processing block 12. In this case, transportation of the substrate W in the first processing block 11 and transportation of the substrate W in the second processing block 12 can be concurrently performed. Thus, a transport time of the substrate W can be shortened, so that the throughput in the substrate processing apparatus 100 can be improved.

In addition, the back surface cleaning processing is performed to the substrate W by the back surface cleaning unit SSR after the end surface cleaning processing and the top surface cleaning processing are performed to the substrate W in the substrate processing apparatus 100 according to the present embodiment. In this case, even though the suction mark is formed on the back surface of the substrate W by the suction-type spin chuck 201 or 61 in the end surface cleaning unit SSB or the top surface cleaning unit SS, the suction mark on the back surface of the substrate W can be removed in the subsequent back surface cleaning processing. This allows the substrate W to be sufficiently clean.

Furthermore, the reversing unit RT1 is provided in an intermediate position between the indexer robot IR and the first main robot MR1 while the reversing unit RT2 is provided in an intermediate position between the first main robot MR1 and the second main robot MR2 in the present embodiment. In this case, the substrate W can be transferred from the second main robot MR2 to the first main robot MR1 while being reversed. Similarly, the substrate W can be transferred from the first main robot MR1 to the indexer robot IR while being reversed. This allows the number of the transporting processes by the first and second main robots MR1, MR2 to be reduced and the throughput in the substrate processing apparatus 100 to be further improved.

Moreover, the number of the transporting processes of the substrate W by the first main robot MR1 and the number of the transporting processes of the substrate W by the second main robot MR2 are equal to each other in the present embodiment. Therefore, it is not necessary, in most cases, to keep one of the first and second main robots MR1, MR2 on standby corresponding to the operation of the other. This allows the substrate W to be efficiently transported and the throughput in the substrate processing apparatus 100 to be further improved.

In addition, the plurality of back surface cleaning units SSR are arranged in multiple stages on one side of the first processing block 11, and the plurality of top surface cleaning units SS and the plurality of end surface cleaning units SSB are arranged in respective multiple stages on one side and the other side of the second processing block 12, respectively, in the substrate processing apparatus 100 according to the present embodiment. This can significantly save the space in the substrate processing apparatus 100 and reduce the substrate processing apparatus 100 in size, compared to a case where the plurality of cleaning units are arranged in two dimensions.

Moreover, the substrate W before the back surface cleaning processing and the substrate W after the back surface cleaning processing are reversed by the different reversing units RT1, RT2 in the present embodiment. In this case, even though the back surface of the substrate W before the back surface cleaning processing is contaminated, contaminants will not transfer to the substrate W after the back surface cleaning processing. Accordingly, the back surface of the substrate W after the back surface cleaning processing can be maintained in a clean state.

Furthermore, in the present embodiment, providing the plurality of top surface cleaning units SS and the plurality of back surface cleaning units SSR so as to be stacked in respective multiple stages in a height direction allows the configuration of the substrate processing apparatus 100 (a configuration of a so-called platform) to be reduced in size while disposing the top surface cleaning units SS, the back surface cleaning units SSR and the end surface cleaning units SSB in the above-mentioned height direction allows the respective required numbers of top surface cleaning units SS, back surface cleaning units SSR and end surface cleaning unit SSB to be easily provided.

(2) Second Embodiment

For a substrate processing apparatus according to a second embodiment of the present invention, different points from the above-described first embodiment will be described.

Figure 12:
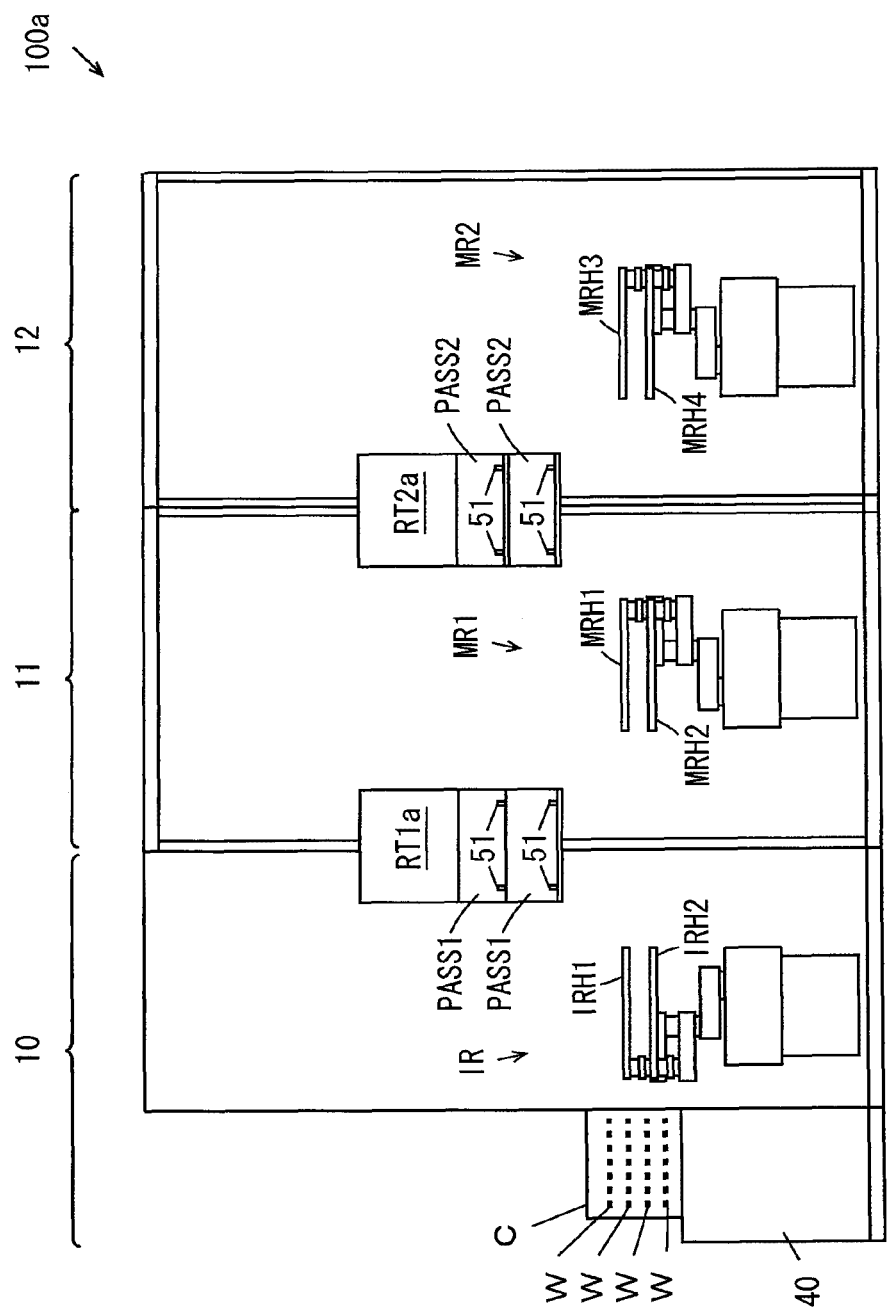
FIG. 12 is a diagram showing a configuration of a substrate processing apparatus according to a second embodiment.

FIG. 12 is a schematic sectional view of the substrate processing apparatus according to the second embodiment. As shown in FIG. 12, the substrate processing apparatus 100a according to the second embodiment includes reversing units RT1a, RT2a that will be shown below instead of the reversing units RT1, RT2. In addition, the respective two substrate platforms PASS1, PASS2 are provided.

(2-1) Reversing Unit

Figure 13:
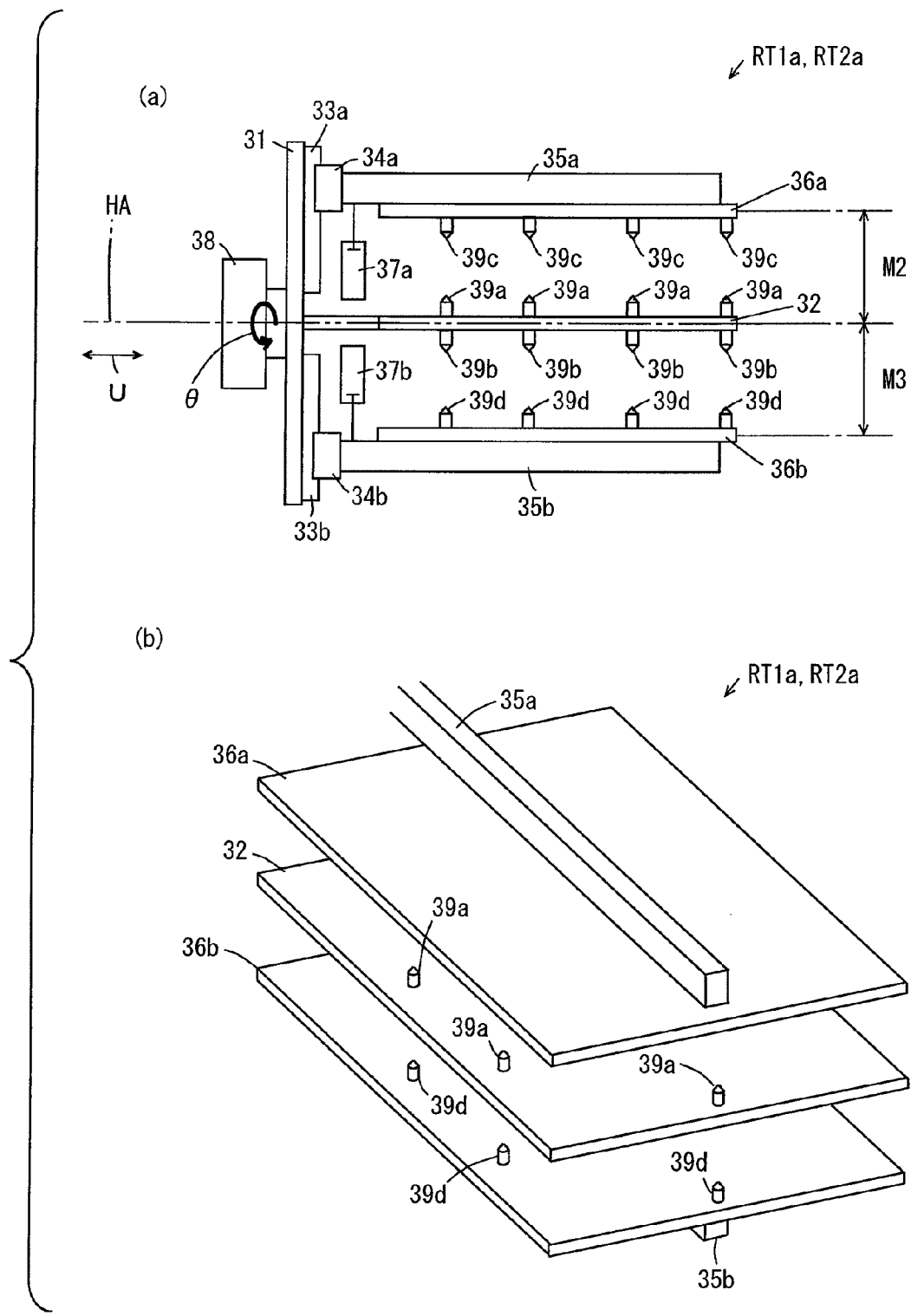
FIG. 13 is a diagram showing a configuration of a reversing unit according to the second embodiment.

FIG. 13 (a) is a side view of the reversing unit RT1a, RT2a, and FIG. 13 (b) is a perspective view of the reversing unit RT1a, RT2a. Note that the reversing units RT1a, RT2a have the same configuration.

As shown in FIG. 13 (a), the reversing unit RT1a, RT2a includes a supporting plate 31, a fixed plate 32, a pair of linear guides 33a, 33b, a pair of supporting members 35a, 35b, a pair of cylinders 37a, 37b, a first movable plate 36a, a second movable plate 36b and a rotary actuator 38.

The supporting plate 31 is provided so as to extend vertically, to which the fixed plate 32 is attached so that it horizontally extends from the center of one surface of the supporting plate 31. The linear guide 33a extending in a direction vertical to the fixed plate 32 is provided in a region of the supporting plate 31 on one surface side of the fixed plate 32. In addition, the linear guide 33b extending in the direction vertical to the fixed plate 32 is provided in the region of the supporting plate 31 on the other surface side of the fixed plate 32. The linear guides 33a, 33b are provided symmetrically with respect to the fixed plate 32.

The supporting member 35a is provided so as to extend in a direction parallel to the fixed plate 32 on the one surface side of the fixed plate 32. The supporting member 35a is slidably attached to the linear guide 33a by a coupling member 34a. The cylinder 37a is connected to the supporting member 35a and moves the supporting member 35a up and down along the linear guide 33a. In this case, the supporting member 35a moves in the direction vertical to the fixed plate 32 while being maintained in a fixed posture. Moreover, the first movable plate 36a is attached to the supporting member 35a so as to face the one surface of the fixed plate 32.

On the other surface side of the fixed plate 32, the supporting member 35b is provided so as to extend in the direction parallel to the fixed plate 32. The supporting member 35b is slidably attached to the linear guide 33b by a coupling member 34b. The supporting member 35b is connected to the cylinder 37b, which moves the supporting member 35b up and down along the linear guide 33b. In this case, the supporting member 35b moves in the direction vertical to the fixed plate 32 while being maintained in a fixed posture. Furthermore, the second movable plate 36b is attached to the supporting member 35b so as to face the other surface of the fixed plate 32.

With the first movable plate 36a and the second movable plate 36b being farthest away from the fixed plate 32, a distance M2 between the first movable plate 36a and the fixed plate 32 and a distance M3 between the second movable plate 36b and the fixed plate 32 are set to be substantially equal to a difference M1 in height between the hand MRH1 and the hand MRH2 of the first main robot MR1 (a difference in height between the hand MRH3 and the hand MRH4 of the second main robot MR2) shown in FIG. 4 in the present embodiment.

The rotary actuator 38 rotates the supporting plate 31 around the horizontal axis HA that is in parallel with the direction of the arrow U (FIG. 1). Accordingly, the first movable plate 36a, the second movable plate 36b and the fixed plate 32 that are coupled to the supporting plate 31 rotate around the horizontal axis HA (in a θ direction).

As shown in FIG. 13 (*b*), each of the first movable plate 36a, the fixed plate 32 and the second movable plate 36b is formed in the shape of a flat plate.

In addition, a plurality of support pins 39a are provided on the one surface, which faces the first movable plate 36a, of the fixed plate 32, and a plurality of support pins 39b are provided on the other surface of the fixed plate 32 as shown in FIG. 13 (*a*). Moreover, a plurality of support pins 39c are provided on one surface, which faces the fixed plate 32, of the first movable plate 36a, and a plurality of support pins 39d are provided on one surface, which faces the fixed plate 32, of the second movable plate 36b.

In the present embodiment, respective six pieces of the support pins 39a, 39b, 39c, 39d are provided. These support pins 39a, 39b, 39c, 39d are arranged along the outer circumference of the substrate W that is carried into the reversing unit RT1, RT2. Moreover, the support pins 39a, 39b, 39c, 39d have the same length. Therefore, with the first movable plate 36a and the second movable plate 36b being farthest away from the fixed plate 32, a distance between the tips of the support pins 39a and the tips of the support pins 39d and a distance between the tips of the support pins 39b and the tips of the support pins 39c are substantially equal to the difference M1 in height between the hand MRH1 and the hand MRH2 of the first main robot MR1 (the difference in height between the hand MRH3 and the hand MRH4 of the second main robot MR2) shown in FIG. 4.

Note that the distance M2 between the first movable plate 36a and the fixed plate 32 and the distance M3 between the second movable plate 36b and the fixed plate 32 may be suitably changed. Note that with the first movable plate 36a and the second movable plate 36b being farthest away from the fixed plate 32, the distance between the tips of the support pins 39c and the tips of the support pins 39d is set to be larger than the difference M1 in height between the hand MRH1 and the hand MRH2 (the difference in height between the hand MRH3 and the hand MRH4).

(2-2) Summary of Operation of the Substrate Processing Apparatus

Next, a summary of an operation of the substrate processing apparatus 100a will be described with reference to FIG. 1 and FIG. 12.

First, the indexer robot IR takes the two unprocessed substrates W out of one of the carriers C placed on the carrier platforms 40 by using the hands IRH1, IRH2 in the indexer block 10. Then, the indexer robot IR sequentially transfers the two substrates W held by the hands IRH1, IRH2 to the two substrate platforms PASS1.

The first main robot MR1 in the first processing block 11 sequentially receives the two substrates W from the two substrate platforms PASS1 by using the hands MRH1, MRH2, and sequentially places the two substrates W in the two substrate platforms PASS2. Next, the second main robot MR2 in the second processing block 12 sequentially receives the two substrates W from the two substrate platforms PASS2 by using the hands MRH3, MRH4, and sequentially carries the two substrates W into the two end surface cleaning units SSB.

Then, the second main robot MR2 sequentially carries the two substrates W after the end surface cleaning processing out of the two end surface cleaning units SSB by using the hands MRH3, MRH4, and sequentially carries the two substrates W into the two top surface cleaning units SS. After that, the second main robot MR2 sequentially carries the two substrates W after the top surface cleaning processing out of the two top surface cleaning units SS by using the hands MRH3, MRH4, and simultaneously carries the two substrates W into the reversing unit RT2a.

In the reversing unit RT2a, the two substrates W with the top surfaces thereof directed upward are reversed so that the back surfaces thereof are directed upward. The operation of the reversing unit RT2a will be described later.

Then, the first main robot MR1 in the first processing block 11 simultaneously carries the two substrates W with the back surfaces thereof directed upward out of the reversing unit RT2a by using the hands MRH1, MRH2, and sequentially carries the two substrates W into the two back surface cleaning units SSR. Next, the first main robot MR1 sequentially carries the two substrates W after the back surface cleaning processing out of the two back surface cleaning units SSR, and simultaneously carries the two substrates W into the reversing unit RT1a.

In the reversing unit RT1a, the two substrates W with the back surfaces thereof directed upward are reversed so that the top surfaces thereof are directed upward. The operation of the reversing unit RT1a will be described later. Next, the indexer robot IR in the indexer block 10 sequentially carries the two substrates W after the reversing out of the reversing unit RT1a by using the hands IRH1, IRH2, and stores the two substrates W in the carrier C on the carrier platform 40. Accordingly, a series of the operations of the substrate processing apparatus 100a according to the second embodiment is completed.

Note that the difference in height between the hand IRH1 and the hand IRH2 of the indexer robot IR is set to be substantially equal to the difference M1 in height between the hand MRH1 and the hand MRH2 (the difference in height between the hand MRH3 and the hand MRH4), so that the indexer robot IR can simultaneously carry the two substrates W out of the reversing unit RT1a.

In addition, spacing between the two substrate platforms PASS1 and spacing between the two substrate platforms PASS2 are set to be substantially equal to the difference M1 in height between the hand MRH1 and the hand MRH2 (the difference in height between the hand MRH3 and the hand MRH4) shown in FIG. 4, so that the first main robot MR1 can simultaneously receive the two substrates W from the two substrate platforms PASS1. Moreover, this allows the first main robot MR1 to simultaneously place the two substrates W in the two substrate platforms PASS2. Furthermore, this allows the second main robot MR2 to simultaneously receive the two substrates W from the two substrate platforms PASS2. In addition, when the difference in height between the hand IRH1 and the hand IRH2 of the indexer robot IR is set to be substantially equal to the difference M1 in height between the hand MRH1 and the hand MRH2 (the difference in height between the hand MRH3 and the hand MRH4), the indexer robot IR can simultaneously place the two substrates W in the two substrate platforms PASS1.

(2-3) Operation of the Reversing Unit

Figure 14:
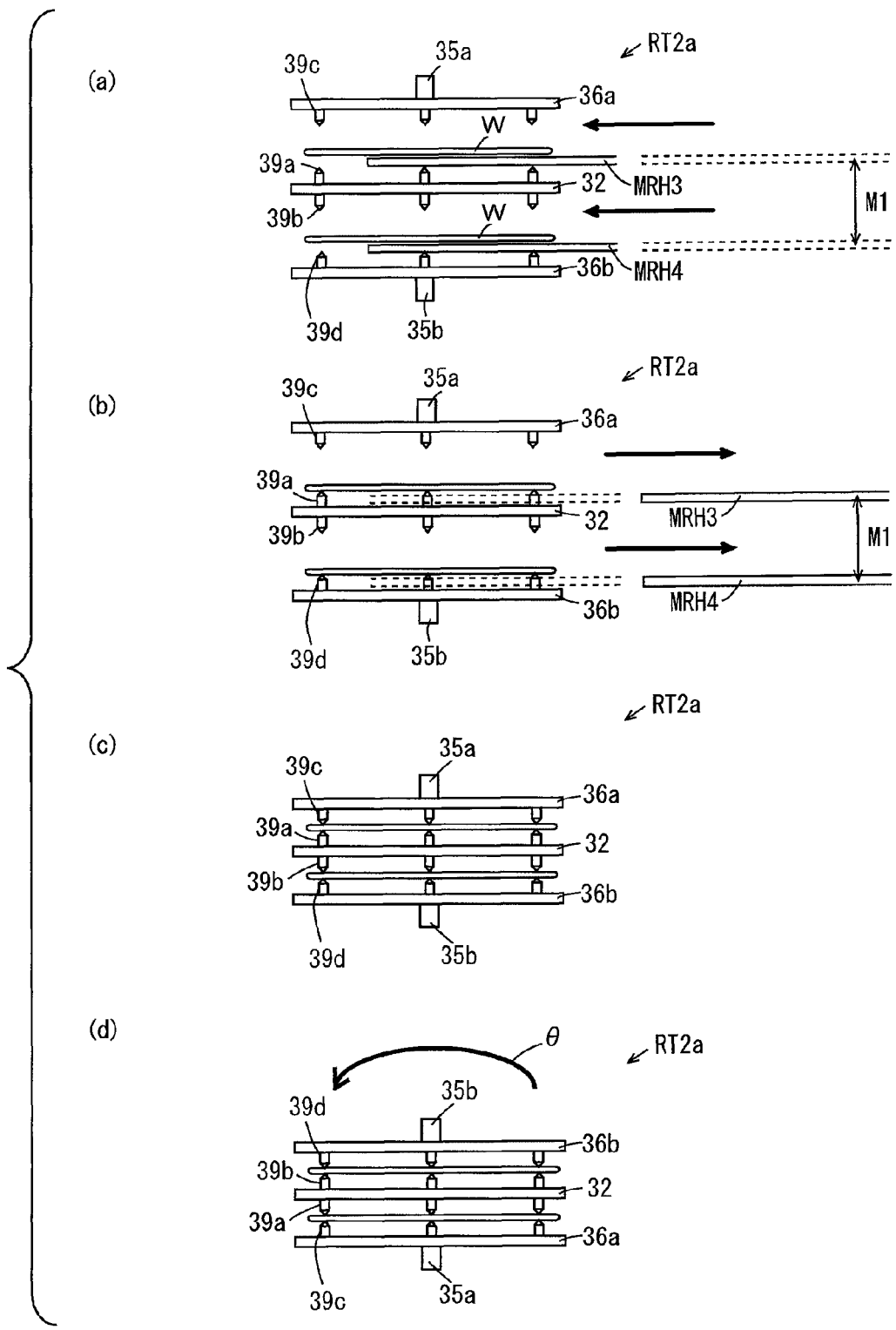
FIG. 14 is a diagram showing an operation of the reversing unit according to the second embodiment.
Figure 15:
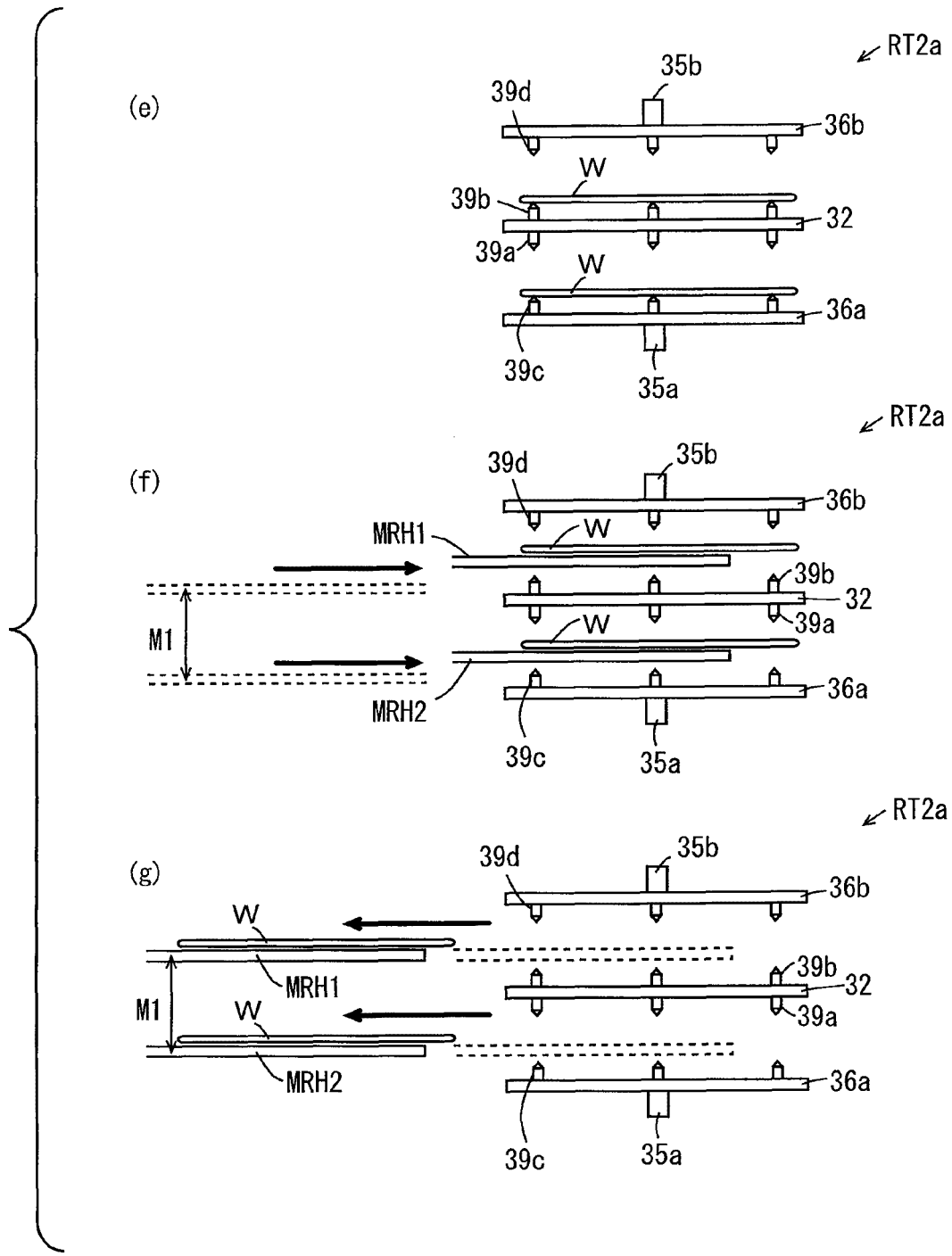
FIG. 15 is a diagram showing the operation of the reversing unit according to the second embodiment.

Next, an operation of the reversing unit RT1a, RT2a will be described. FIG. 14 and FIG. 15 are diagrams for explaining the operation of the reversing unit RT1a, RT2a. Note that since the operations of the respective processes of the reversing units RT1a, RT2a are the same, the operation of the reversing unit RT2a will be described as an example in FIG. 14 and FIG. 15.

As shown in FIG. 14 (a), the hands MRH3, MRH4 of the second main robot MR2 holding the substrates W simultaneously advance between the first movable plate 36a and the fixed plate 32 and between the second movable plate 36b and the fixed plate 32. Note that the above-mentioned direction of the arrow U (FIG. 13) is perpendicular to a direction of forward and backward movements of the hands MRH3, MRH4 of the second main robot MR2. The respective support pins 39a, 39b, 39c, 39d of the reversing units RT1a, RT2a are provided in positions with which any of the hands IRH1, IRH2, the hands MRH1, MRH2 and the hands MRH3, MRH4 does not come into contact when the substrate W is carried in and out.

Then, the hands MRH3, MRH4 are simultaneously lowered and withdraw as shown in FIG. 14 (b). Thus, the substrates W are placed on the support pins 39a, 39d. In this case, the substrates W with the top surfaces thereof directed upward are placed on the support pins 39a, 39d in the reversing unit RT2a.

Next, the supporting member 35a is lowered by the cylinder 37a (FIG. 13 (a)) while the supporting member 35b is lifted by the cylinder 37b (FIG. 13 (a)) as shown in FIG. 14 (c). Thus, the one substrate W is held by the support pins 39c of the first movable plate 36a and the support pins 39a of the fixed plate 32, and the other substrate W is held by the support pins 39d of the second movable plate 36b and the support pins 39b of the fixed plate 32.

In the state, the first movable plate 36a, the fixed plate 32 and the second movable plate 36b are integrally rotated by the rotary actuator 38 through 180 degrees in the 8 direction (around the horizontal axis HA) as shown in FIG. 14 (d).

Accordingly, the substrate W held by the support pins 39a, 39c and the substrate W held by the support pins 39b, 39d are reversed. In this case, the back surfaces of the substrates W are directed upward in the reversing unit RT2a.

After that, the supporting member 35a is lowered by the cylinder 37a while the supporting member 35b is lifted by the cylinder 37b as shown in FIG. 15 (e). Thus, the first movable plate 36a is lowered while the second movable plate 36b is lifted. Therefore, the one substrate W is supported by the support pins 39c of the first movable plate 36a, and the other substrate W is supported by the support pins 39b of the fixed plate 32.

In the state, the hands MRH1, MRH2 of the first main robot MR1 (FIG. 10) advance below the substrate W supported by the support pins 39b and below the substrate W supported by the support pins 39c, respectively, and are lifted as shown in FIG. 15 (f). Thus, the substrate W supported by the support pins 39b is received by the hand MRH1 and the substrate W supported by the support pins 39c is received by the hand MRH2. Note that a direction of forward and backward movements of the hands MRH1, MRH2 of the first main robot MR1 is perpendicular to the above-mentioned direction of the arrow U (FIG. 1).

Thereafter, the hands MRH1, MRH2 simultaneously withdraw, so that the two substrates W are carried out of the reversing unit RT2a as shown in FIG. 15 (g).

(2-4) Effects of the Second Embodiment

In the present embodiment, the first and second main robots MR1, MR2 simultaneously carry the two substrates W into and out of the reversing units RT1a, RT2a. In addition, the reversing units RT1a, RT2a simultaneously reverse the two substrates W. This allows the plurality of substrates W to be efficiently reversed. As a result, the throughput in the substrate processing apparatus 100a can be improved.

Moreover, the indexer robot IR, the first main robot MR1 and the second main robot MR2 concurrently transport the respective two substrates W, so that the throughput in the substrate processing apparatus 100a can be further improved.

In addition, similarly to the above-described first embodiment, the back surface cleaning processing to the substrate W is performed after the end surface cleaning processing and the top surface cleaning processing to the substrate W. Thus, even though the suction mark is formed on the back surface of the substrate W by the suction-type spin chucks 201, 61, the suction mark can be removed in the back surface cleaning processing. This allows the substrate W to be sufficiently clean.

(3) Third Embodiment

Next, for a substrate processing apparatus according to a third embodiment of the present invention, different points from the above-described first embodiment will be described.

(3-1) Configuration of the Substrate Processing Apparatus

Figure 16:
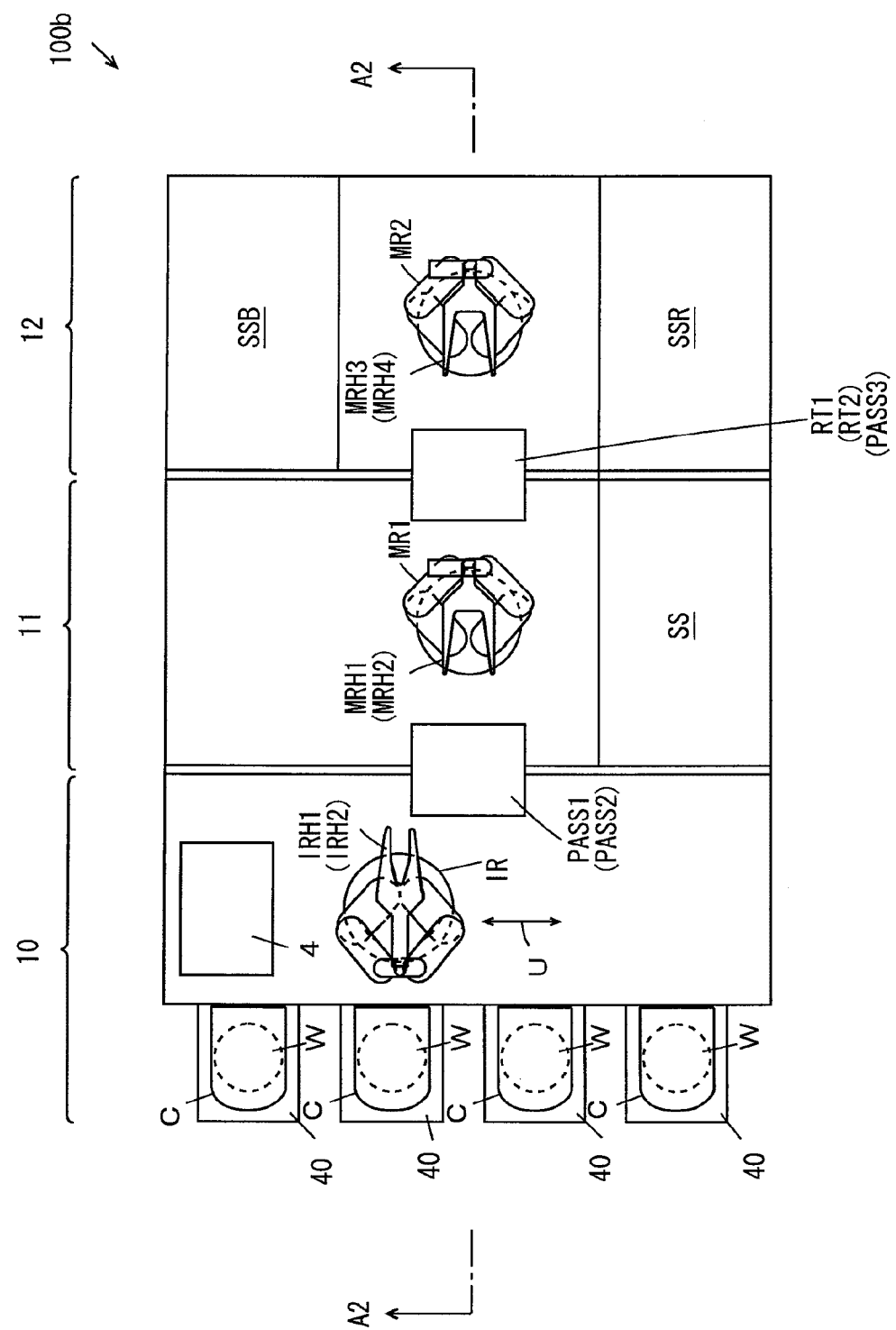
FIG. 16 is a diagram showing a configuration of a substrate processing apparatus according to a third embodiment.
Figure 17:
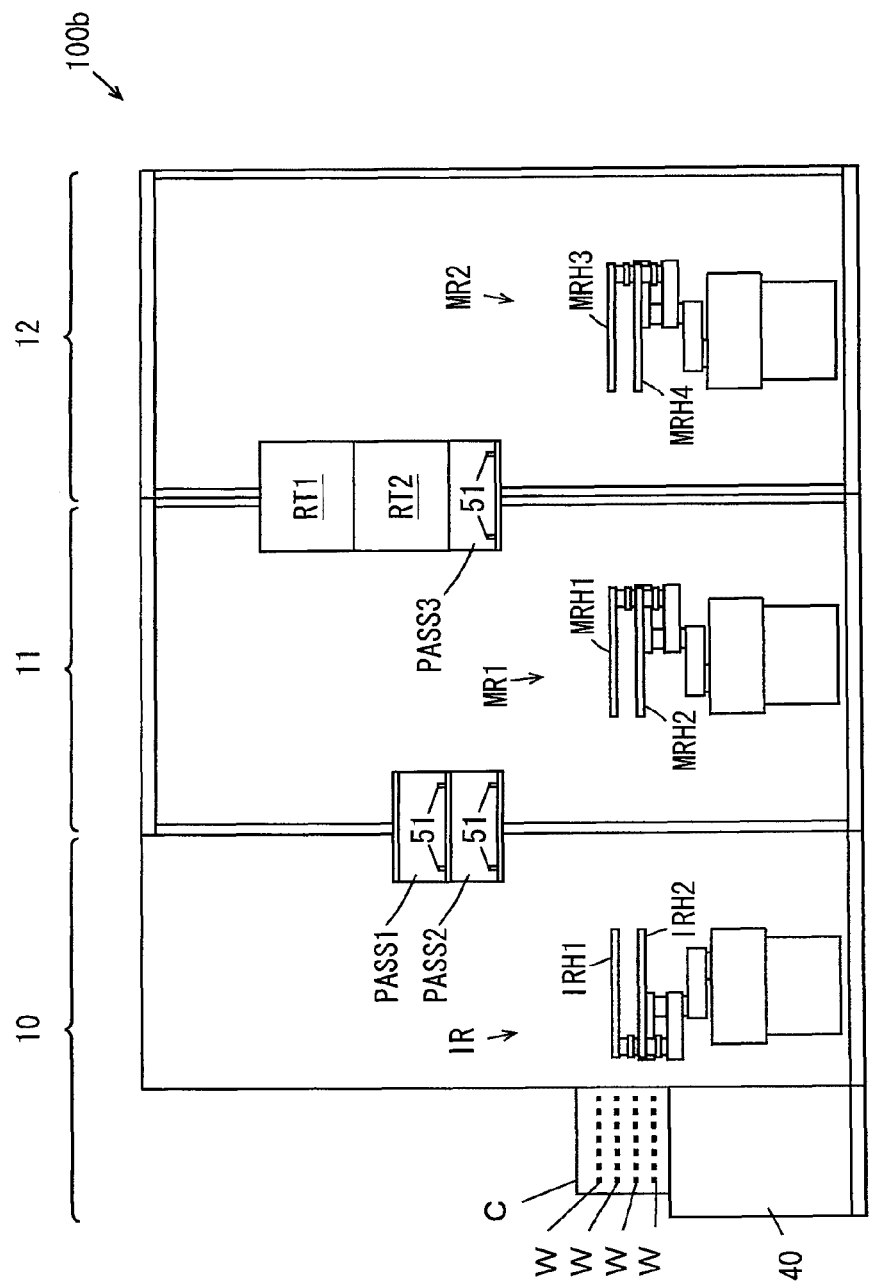
FIG. 17 is a diagram showing the configuration of the substrate processing apparatus according to the third embodiment.

FIG. 16 and FIG. 17 are schematic views showing a configuration of the substrate processing apparatus according to the third embodiment.

FIG. 16 is a plan view of the substrate processing apparatus, and FIG. 17 is a sectional view taken along the line A2-A2 of FIG. 16.

As shown in FIG. 16, the plurality of (four, for example) top surface cleaning units SS are provided on one side of the first processing block 11 in the substrate processing apparatus 100b according to the third embodiment. One side of the second processing block 12 is provided with the plurality of (four, for example) back surface cleaning units SSR, and the other side of the second processing block 12 is provided with the plurality of (four, for example) end surface cleaning units SSB. As shown in FIG. 17, the substrate platforms PASS1, PASS2 are provided on above the other between the indexer block 10 and the first processing block 11, and the reversing units RT1, RT2 and the substrate platform PASS3 are provided one above another between the first processing block 11 and the second processing block 12.

In the top surface cleaning unit SS of the substrate processing apparatus 100b, the mechanical type spin chuck (see FIG. 11) that holds the outer edge of the substrate W is used.

(3-2) Summary of Operation of the Substrate Processing Apparatus

Then, a summary of an operation of the substrate processing apparatus 100b will be described with reference to FIG. 16 and FIG. 17.

First, the indexer robot IR takes the unprocessed substrate W out of one of the carriers C placed on the carrier platforms 40 in the indexer block 10. The indexer robot IR rotates around the vertical axis while moving in the direction of the arrow U, and places the substrate W in the substrate platform PASS1.

The substrate W placed in the substrate platform PASS1 is received by the first main robot MR1 in the first processing block 11, and is subsequently placed in the substrate platform PASS3. The substrate W placed in the substrate platform. PASS3 is received by the second main robot MR2 in the second processing block 12, and is then carried into the end surface cleaning unit SSB. After that, the substrate W after the end surface cleaning processing is carried out of the end surface cleaning unit SSB by the second main robot MR2, and subsequently carried into the reversing unit RT1.

In the reversing unit RT1, the substrate W with the top surface thereof directed upward is reversed so that the back surface thereof is directed upward. The substrate W after the reversing is carried out of the reversing unit RT1 by the second main robot MR2, and subsequently carried into the back surface cleaning unit SSR. Next, the substrate W after the back surface cleaning processing is carried out of the back surface cleaning unit SSR by the second main robot MR2, and then carried into the reversing unit RT2.

In the reversing unit RT2, the substrate W with the back surface thereof directed upward is reversed so that the top surface thereof is directed upward. The substrate W after the reversing is carried out of the reversing unit RT2 by the first main robot MR1 in the first processing block 11, and subsequently carried into the top surface cleaning unit SS. The substrate W after the top surface cleaning processing is carried out of the top surface cleaning unit SS by the first main robot MR1, and then placed in the substrate platform PASS2. The substrate W placed in the substrate platform PASS2 is received by the indexer robot IR in the indexer block 10, and stored in the carrier C.

In the substrate processing apparatus 100b, the first main robot MR1 performs three transporting processes for the single substrate W, that is, a transporting process from the substrate platform PASS1 to the substrate platform PASS3, a transporting process from the reversing unit RT2 to the top surface cleaning unit SS and a transporting process from the top surface cleaning unit SS to the substrate platform PASS2.

Moreover, the second main robot MR2 performs four transporting processes for the single substrate W, that is, a transporting process from the substrate platform PASS3 to the end surface cleaning unit SSB, a transporting process from the end surface cleaning unit SSB to the reversing unit RT1, a transporting process from the reversing unit RT1 to the back surface cleaning unit SSR and a transporting process from the back surface cleaning unit SSR to the reversing unit RT2.

In this case, the number of the transporting processes of the substrate W by the second main robot MR2 is more than the number of the transporting processes of the substrate W by the first main robot MR1. Therefore, the throughput of the whole substrate processing apparatus 100b depends on a transport speed of the substrate W by the second main robot MR2.

(3-3) Effects of the Third Embodiment

Similarly to the above-described first embodiment, the transportation of the substrate in the first processing block 11 and the transportation of the substrate W in the second processing block 12 are concurrently performed, so that the transport time of the substrate W can be shortened in the present embodiment. Thus, the throughput in the substrate processing apparatus 100b can be improved.

In addition, the back surface cleaning processing to the substrate W is performed after the end surface cleaning processing of the substrate W in the present embodiment. Thus, even though the suction mark is formed on the back surface of the substrate W during the end surface cleaning processing, the suction mark is removed in the subsequent back surface cleaning processing. Moreover, since the mechanical type spin chuck is used in the top surface cleaning unit SS, the suction mark will not be formed again on the back surface of the substrate W even though the top surface cleaning processing is performed after the back surface cleaning processing.

(3-4) Modifications of the Third Embodiment

In the substrate processing apparatus 100b according to the third embodiment, the reversing units RT1a, RT2a shown in the above-described second embodiment may be used instead of the reversing units RT1, RT2. In this case, since the plurality of substrates W can be efficiently reversed, the throughput in the substrate processing apparatus 100b can be improved.

Furthermore, when the respective two substrate platforms PASS1, PASS2, PASS3 are provided and the two substrates W are concurrently transported similarly to the above-described second embodiment, the throughput in the substrate processing apparatus 100b can be further improved.

(4) Fourth Embodiment

For a substrate processing apparatus according to a fourth embodiment of the present invention, different points from the above-described first embodiment will be described.

(4-1) Configuration of the Substrate Processing Apparatus

Figure 18:
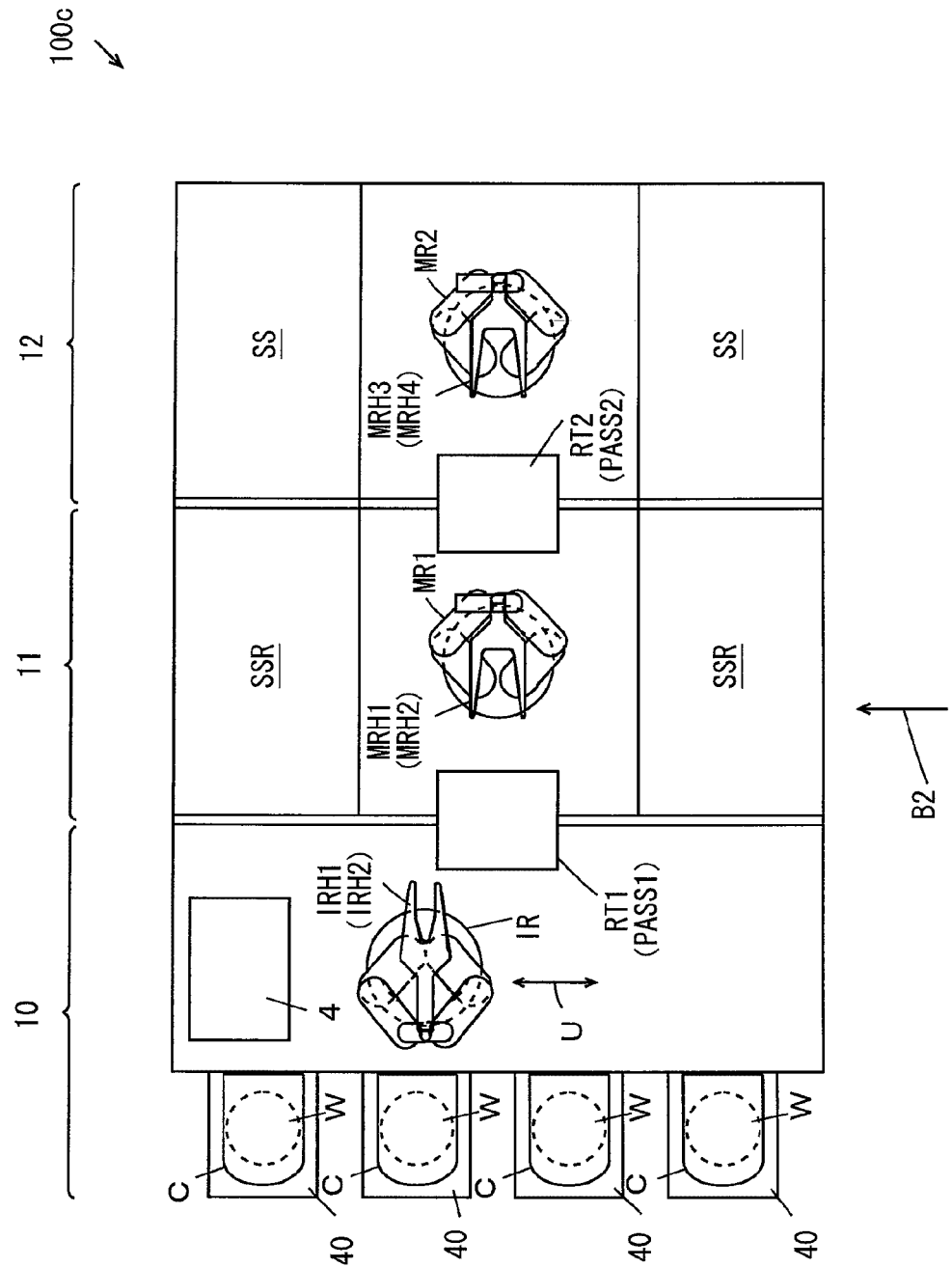
FIG. 18 is a diagram showing a configuration of a substrate processing apparatus according to a fourth embodiment.
Figure 19:
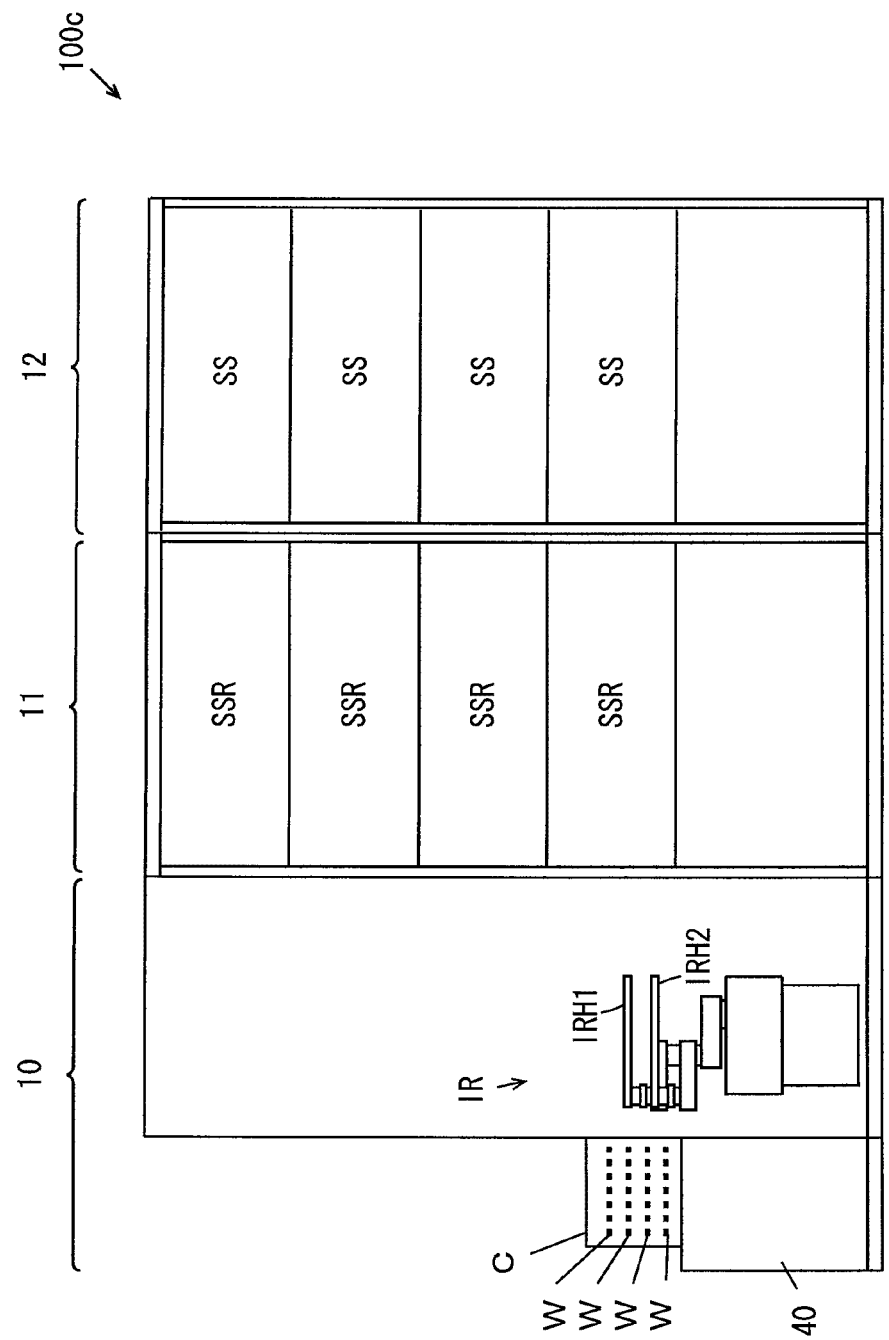
FIG. 19 is a diagram showing the configuration of the substrate processing apparatus according to the fourth embodiment.

FIG. 18 and FIG. 19 are schematic views showing a configuration of the substrate processing apparatus according to the fourth embodiment. FIG. 18 is a plan view of the substrate processing apparatus, and FIG. 19 is a side view of the substrate processing apparatus of FIG. 18 seen from a direction of the arrow B2.

As shown in FIG. 18 and FIG. 19, the plurality of (eight in FIG. 19) back surface cleaning units SSR are provided in the first processing block 11 of the substrate processing apparatus 100c according to the fourth embodiment. One side and the other side of the first processing block 11 have vertical stacks of the four back surface cleaning units SSR, respectively.

The plurality of (eight in FIG. 19) top surface cleaning units SS are provided in the second processing block 12. One side and the other side of the second processing block 12 have vertical stacks of the four top surface cleaning units SS, respectively.

(4-2) Summary of Operation of the Substrate Processing Apparatus

Next, a summary of an operation of the substrate processing apparatus 100c will be described with reference to FIG. 18 and FIG. 19.

First, the indexer robot IR takes the unprocessed substrate W out of one of the carriers C placed on the carrier platforms 40 in the indexer block 10. The indexer robot IR rotates around the vertical axis while moving in the direction of the arrow U, and transfers the substrate W to the reversing unit RT1. At this point, the top surface of the substrate W is directed upward.

In the reversing unit RT1, the substrate W is reversed so that the back surface thereof is directed upward. The substrate W after the reversing is carried out of the reversing unit RT1 by the first main robot MR1 in the first processing block 11, and subsequently carried into the back surface cleaning unit SSR. Then, the back surface cleaning processing is performed to the substrate W in the back surface cleaning unit SSR. The substrate W after the back surface cleaning processing is carried out of the back surface cleaning unit SSR by the first main robot MR1, and subsequently carried into the reversing unit RT2.

In the reversing unit RT2, the substrate W with the back surface thereof directed upward is reversed so that the top surface thereof is directed upward. The substrate W after the reversing is carried out of the reversing unit RT2 by the second main robot MR2 in the second processing block 12, and carried into the top surface cleaning unit SS. Then, the top surface cleaning processing is performed to the substrate W in the top surface cleaning unit SS. Note that any of the suction-type spin chuck 61 (FIG. 10) and the mechanical type spin chuck 81 (FIG. 11) may be used in the top surface cleaning unit SS. When the suction-type spin chuck 61 is used, the peripheral portion and the outer edge of the substrate W can be simultaneously cleaned in the top surface cleaning unit SS.

The substrate W after the top surface cleaning processing is carried out of the top surface cleaning unit SS by the second main robot MR2, and subsequently placed in the substrate platform PASS2. The substrate W placed in the substrate platform PASS2 is received by the main robot MR1 in the first processing block, and subsequently placed in the substrate platform PASS1. The substrate W placed in the substrate platform PASS1 is received by the indexer robot IR in the indexer block 10, and stored in the carrier C.

(4-3) Operation of the Main Robot

(4-3-1) Example of the Operation of the First Main Robot

Next, a specific example of the operation of the first main robot MR1 will be described with reference to FIG. 18.

The first main robot MR1 firstly carries the unprocessed substrate W with the back surface thereof directed upward out of the reversing unit RT1 by using the hand MRH2. Next, the first main robot MR1 carries the substrate W after the back surface cleaning processing out of any of the back surface cleaning units SSR by using the hand MRH1, and carries the above-mentioned unprocessed substrate W held by the hand MRH2 into the back surface cleaning unit SSR. The first main robot MR1 subsequently carries the substrate W with the top surface thereof directed upward out of the substrate platform PASS2 by using the hand MRH2. This substrate W has already been subjected to the back surface cleaning processing and the top surface cleaning processing.

Then, the first main robot MR1 carries the substrate W, held by the hand MRH1, after the above-mentioned back surface cleaning processing into the reversing unit RT2. The first main robot MR1 subsequently places the substrate W, held by the hand MRH2, after the back surface cleaning processing and the top surface cleaning processing in the substrate platform PASS1.

The first main robot MR1 successively performs a series of such operations. Note that the operation of the hand MRH1 and the operation of the hand MRH2 may be reverse to each other in the above-described example of the operation.

The first main robot MR1 performs three transporting processes for the single substrate, that is, the transporting process from the reversing unit RT1 to the back surface cleaning unit SSR, the transporting process from the back surface cleaning unit SSR to the reversing unit RT2 and a transporting process from the substrate platform PASS2 to the substrate platform PASS1.

(4-3-2) Example of Operation of the Second Main Robot

Next, a specific example of the operation of the second main robot MR2 will be described with reference to FIG. 18.

First, the second main robot MR2 carries the substrate W with the top surface thereof directed upward after the back surface cleaning processing out of the reversing unit RT2 by using the hand MRH4. Next, the second main robot MR2 carries the substrate W after the top surface cleaning processing out of any of the top surface cleaning units SS by using the hand MRH3, and carries the substrate W held by the hand MRH4 into the top surface cleaning unit SS. The second main robot MR2 subsequently places the substrate W, held by the hand MRH3, after the top surface cleaning processing in the substrate platform PASS2.

The second main robot MR2 successively performs a series of such operations. Note that the operation of the hand MRH3 and the operation of the hand MRH4 may be reverse to each other in the above-described example of the operation.

The second main robot MR2 performs two transporting processes for the single substrate W, that is, the transporting process from the reversing unit RT2 to the top surface cleaning unit SS and the transporting process from the top surface cleaning unit SS to the substrate platform PASS2

Such an operation of the second main robot MR2 is performed concurrently with the above-described operation of the first main robot MR1. In the present embodiment, the number of the transporting processes of the substrate W by the second main robot MR2 is less than the number of the transporting processes of the substrate W by the first main robot MR1. Therefore, the throughput of the whole substrate processing apparatus 100c depends on a transport speed of the substrate W by the first main robot MR1.

(4-4) Effects of the Fourth Embodiment

In the present embodiment, the first main robot MR1 is provided in the first processing block 11, and the second main robot MR2 is provided in the second processing block 12. In this case, the transportation of the substrate W in the first processing block 11 and the transportation of the substrate W in the second processing block 12 can be concurrently performed. Thus, the transport time of the substrate W can be shortened, so that the throughput in the substrate processing apparatus 100c can be improved.

Furthermore, the reversing unit RT1 is provided in the intermediate position between the indexer robot IR and the first main robot MR1 while the reversing unit RT2 is provided in the intermediate position between the first main robot MR1 and the second main robot MR2. In this case, the substrate W can be transferred from the indexer robot IR to the first main robot MR1 while being reversed. Similarly, the substrate W can be transferred from the first main robot MR1 to the second main robot MR2 while being reversed. This allows the number of the transporting processes by the first and second main robots MR1, MR2 to be reduced, compared to the case where each of the first and second main robots MR1, MR2 carries the substrate W into and out of the reversing units RT1, RT2. Accordingly, the throughput in the substrate processing apparatus 100c can be further improved.

In addition, the plurality of back surface cleaning units SSR are arranged in multiple stages on one side and the other side of the first processing block 11, respectively, and the plurality of top surface cleaning unit SS are arranged in multiple stages on one side and the other side of the second processing block 12, respectively, in the substrate processing apparatus 100c according to the present embodiment. This can significantly reduce the substrate processing apparatus 100c in size and save the space in the substrate processing apparatus 100c, compared to the case where the plurality of cleaning units are arranged in two dimensions.

Moreover, the substrate W before the back surface cleaning processing and the substrate W after the back surface cleaning processing are reversed in the different reversing units RT1, RT2 in the present embodiment. In this case, even though the back surface of the substrate W before the back surface cleaning processing is contaminated, contaminants will not transfer to the substrate W after the back surface cleaning processing. Accordingly, the back surface of the substrate W after the back surface cleaning processing can be maintained in a clean state.

Furthermore, in the present embodiment, providing the plurality of top surface cleaning units SS and the plurality of back surface cleaning units SSR so as to be stacked in respective multiple stages in the height direction allows the configuration of the substrate processing apparatus 100c (a configuration of the so-called platform) to be reduced in size while disposing the top surface cleaning units SS and the back surface cleaning units SSR in the above-mentioned height direction allows the respective required numbers of top surface cleaning units SS and back surface cleaning units SSR to be easily provided.

(5) Fifth Embodiment

Next, for a substrate processing apparatus according to a fifth embodiment of the present invention, different points from the above-described fourth embodiment will be described.

Figure 20:
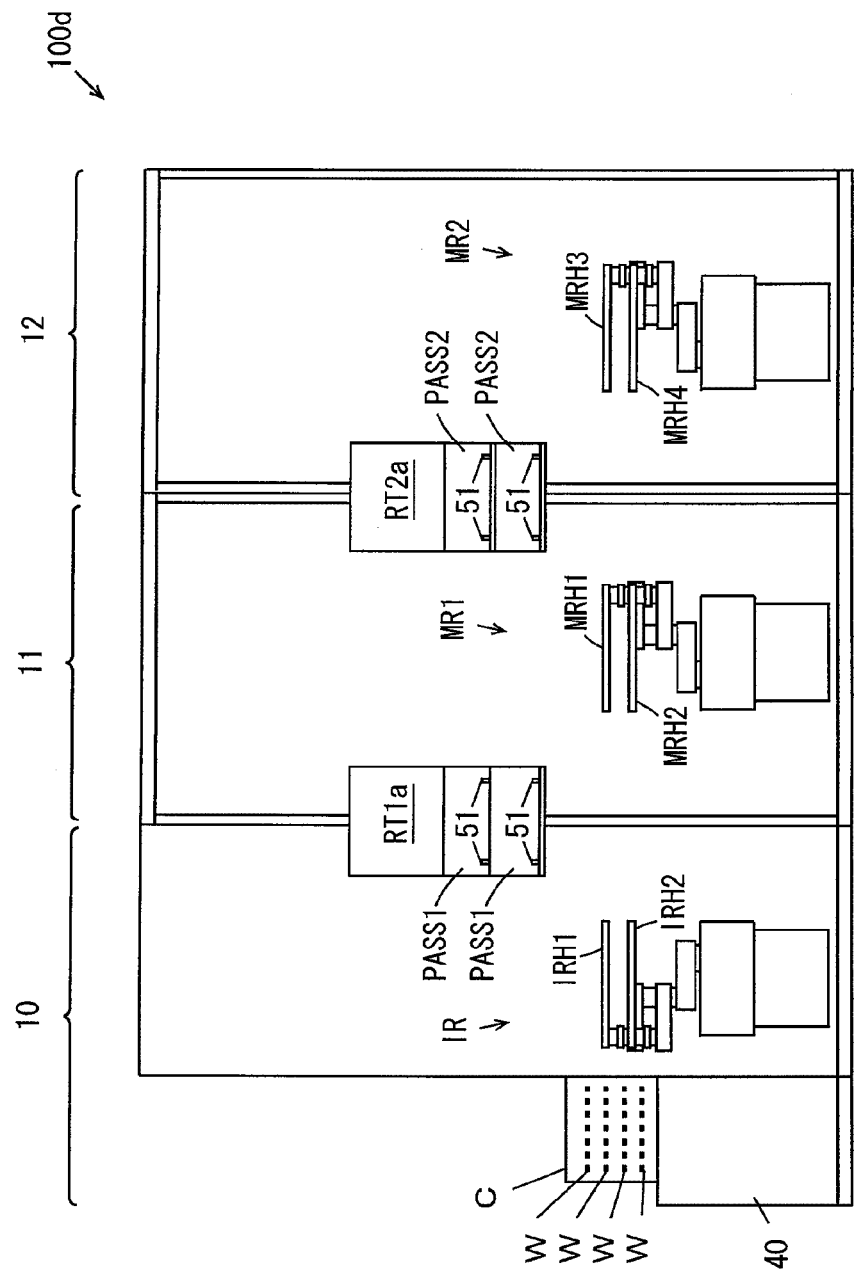
FIG. 20 is a diagram showing a configuration of a substrate processing apparatus according to a fifth embodiment.

FIG. 20 is a schematic sectional view of the substrate processing apparatus according to the fifth embodiment. As shown in FIG. 20, the substrate processing apparatus 100d according to the fifth embodiment includes the reversing units RT1a, RT2a shown in FIG. 13 instead of the reversing units RT1, RT2. In addition, the respective two substrate platforms PASS1, PASS2 are provided.

(5-1) Summary of Operation of the Substrate Processing Apparatus

A summary of an operation of the substrate processing apparatus 100d will be described with reference to FIG. 20.

First, the indexer robot IR takes the two unprocessed substrates W out of one of the carriers C placed on the carrier platforms 40 by using the hand IRH1, IRH2 in the indexer block 10. Then, the indexer robot IR sequentially transfers the two substrates W held by the hands IRH1, IRH2 to the reversing unit RT1a.

In the reversing unit RT1a, the two unprocessed substrates W with the top surfaces thereof directed upward are reversed so that the back surfaces thereof are directed upward. The operation of the reversing unit RT1a will be described later.

Next, the first main robot MR1 in the first processing block 11 simultaneously carries the two substrates W with the back surfaces thereof directed upward out of the reversing unit RT1a by using the hands MRH1, MRH2. Then, the first main robot MR1 sequentially carries the two substrates W held by the hands MRH1, MRH2 into the two back surface cleaning units SSR (FIG. 18). After that, the first main robot MR1 sequentially carries the two substrates W after the back surface cleaning processing out of the two back surface cleaning units SSR by using the hands MRH1, MRH2.

Next, the first main robot MR1 simultaneously carries the two substrates W, held by the hands MRH1, MRH2, after the back surface cleaning processing into the reversing unit RT2a. In the reversing unit RT2a, the two substrates W with the back surfaces thereof directed upward are reversed so that the top surfaces thereof are directed upward. The operation of the reversing unit RT2a will be described later.

Next, the second main robot MR2 in the second processing block 12 simultaneously carries the two substrates W with the top surfaces thereof directed upward out of the reversing unit RT2a by using the hands MRH3, MRH4. Then, the second main robot MR2 sequentially carries the two substrates W held by the hands MRH3, MRH4 into the two top surface cleaning units SS (FIG. 18). After that, the second main robot MR2 sequentially carries the two substrates W after the top surface cleaning processing out of the two top surface cleaning units SS by using the hands MRH3, MRH4.

Then, the second main robot MR2 sequentially places the two substrates W held by the hands MRH3, MRH4 in the two substrate platforms PASS2. Next, the first main robot MR1 in the first processing block 11 sequentially receives the two substrates W placed in the two substrate platforms PASS2 by using the hands MRH1, MRH2. After that, the first main robot MR1 sequentially places the two substrates W in the two substrate platforms PASS1. The indexer robot IR in the indexer block 10 subsequently receives the two substrates W placed in the two substrate platforms PASS1, and stores the substrates W in the carrier C. Accordingly, a series of the operations of the substrate processing apparatus 100d according to the fifth embodiment is completed.

(5-2) Operation of the Reversing Unit

Figure 21:
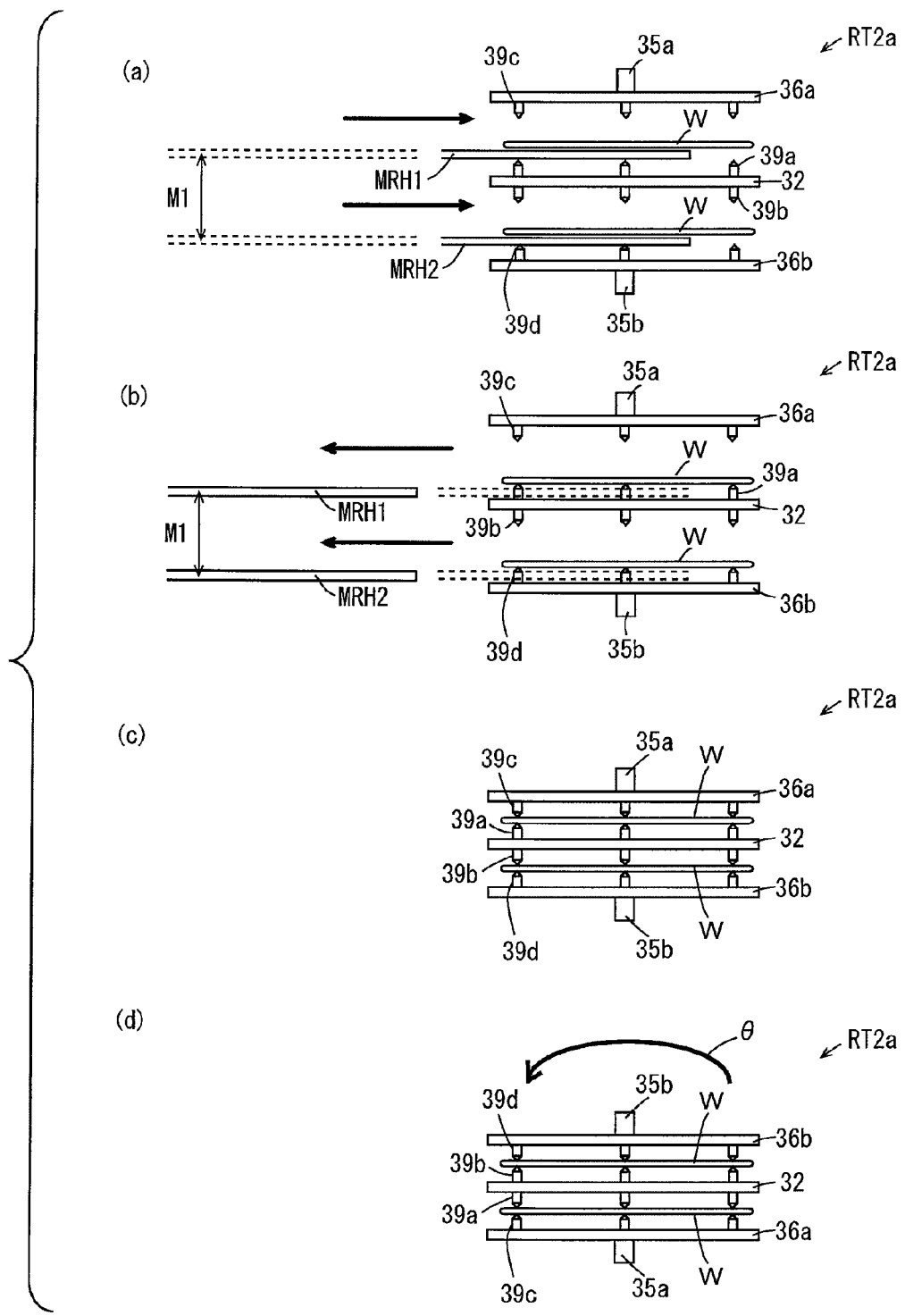
FIG. 21 is a diagram showing an operation of a reversing unit in the fifth embodiment.
Figure 22:
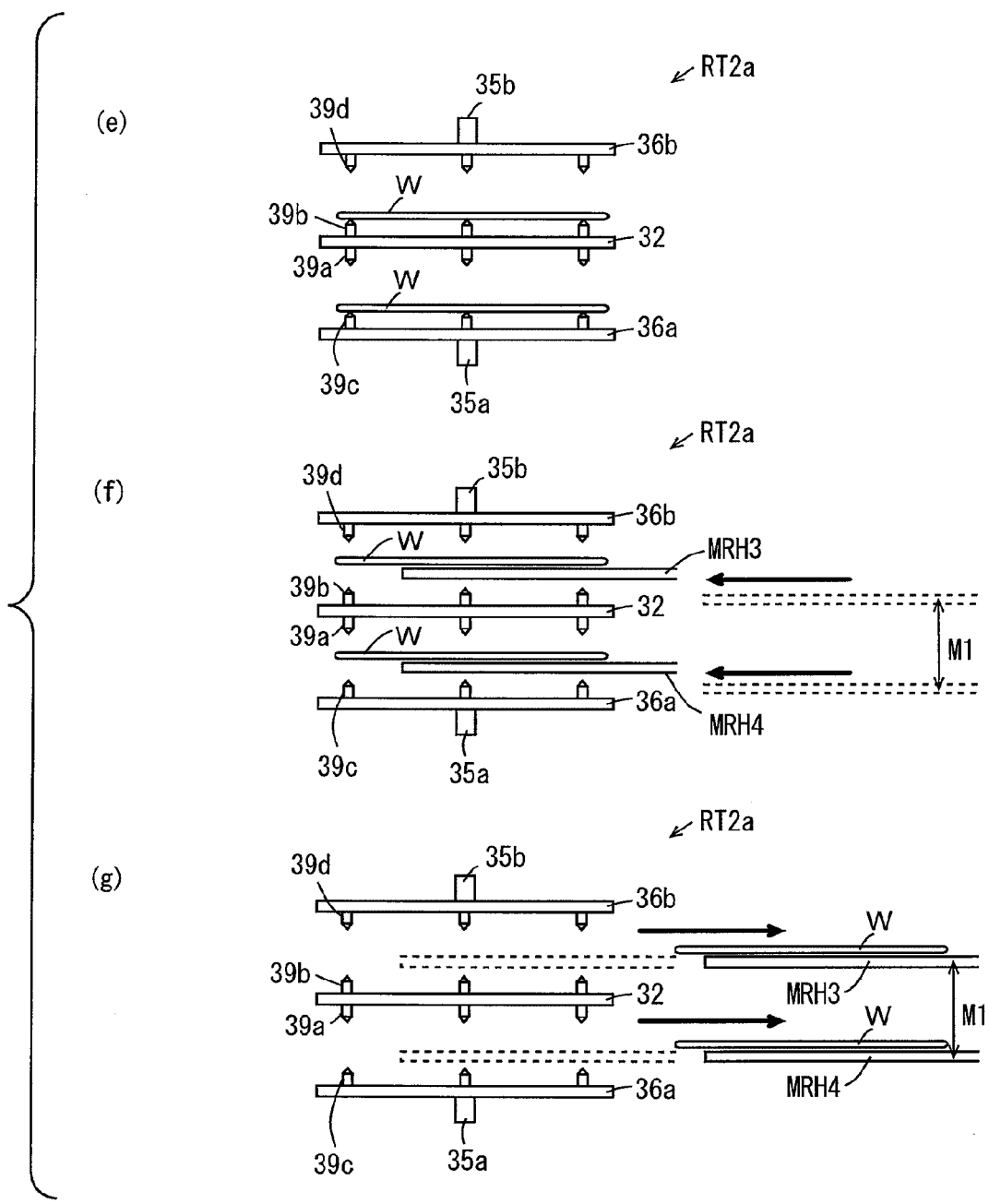
FIG. 22 is a diagram showing the operation of the reversing unit in the fifth embodiment.

Next, an operation of the reversing unit RT1a, RT2a will be described. FIG. 21 and FIG. 22 are diagrams for explaining the operation of the reversing unit RT1a, RT2a. Note that since the operations of the reversing units RT1a, RT2a are the same in each process, the operation of the reversing unit RT2a is described as an example in FIG. 21 and FIG. 22.

As shown in FIG. 21 (a), the hands MRH1, MRH2 of the first main robot MR1 holding the substrates W simultaneously advance between the first movable plate 36a and the fixed plate 32 and between the second movable plate 36b and the fixed plate 32. Note that the above-mentioned direction of the arrow U (FIG. 18) is perpendicular to the direction of the forward and backward movements of the hands MRH1, MRH2 of the first main robot MR1. The respective support pins 39a, 39b, 39c, 39d of the reversing units RT1a, RT2a are provided in positions with which any of the hands IRH1, IRH2, the hands MRH1, MRH2 and the hands MRH3, MRH4 does not come into contact when the substrate W is carried in and out.

Then, the hands MRH1, MRH2 are simultaneously lowered and withdraw as shown in FIG. 21 (b). Thus, the substrates W are placed on the support pins 39a, 39d. In this case, the substrates W with the back surfaces thereof directed upward are placed on the support pins 39a, 39d in the reversing unit RT2a.

Next, the supporting member 35a is lowered by the cylinder 37a (FIG. 13 (a)) while the supporting member 35b is lifted by the cylinder 37b (FIG. 13 (a)) as shown in FIG. 21 (c). Therefore, the one substrate W is held by the support pins 39c of the first movable plate 36a and the support pins 39a of the fixed plate 32, and the other substrate W is held by the support pins 39d of the second movable plate 36b and the support pins 39b of the fixed plate 32.

In the state, the first movable plate 36a, the fixed plate 32 and the second movable plate 36b are integrally rotated by the rotary actuator 38 through 180 degrees in the θ direction (around the horizontal axis HA) as shown in FIG. 21 (d). Accordingly, the substrate W held by the support pins 39a, 39c and the substrate W held by the support pins 39b, 39d are reversed. In this case, the top surfaces of the substrates W are directed upward in the reversing unit RT2a.

Next, the supporting member 35a is lowered by the cylinder 37a while the supporting member 35b is lifted by the cylinder 37b as shown in FIG. 22 (e). Accordingly, the first movable plate 36a is lowered while the second movable plate 36b is lifted. Therefore, the one substrate W is supported by the support pins 39c of the first movable plate 36a, and the other substrate W is supported by the support pins 39b of the fixed plate 32.

In the state, the hands MRH3, MRH4 of the second main robot MR2 advance below the substrates W supported by the support pins 39b and below the substrate W supported by the support pins 39c, respectively, and are lifted as shown in FIG. 22 (f). Thus, the substrate W supported by the support pins 39b is received by the hand MRH3 and the substrate W supported by the support pins 39c is received by the hand MRH4. Note that the direction of the forward and backward movements of the hands MRH3, MRH4 of the second main robot MR2 is perpendicular to the above-described direction of the arrow U (FIG. 18).

Thereafter, the hands MRH3, MRH4 simultaneously withdraw, so that the two substrates W are carried out of the reversing unit RT2a as shown in FIG. 22 (g).

(5-3) Effects of the Fifth Embodiment

In the present embodiment, the first and second main robots MR1, MR2 simultaneously carry the respective two substrates W into and out of the reversing units RT1a, RT2a.

In addition, the reversing unit RT1a, RT2a simultaneously reverses the two substrates W. This allows the plurality of substrates W to be efficiently reversed. As a result, the throughput in the substrate processing apparatus 100d can be improved.

Moreover, the indexer robot IR, the first main robot MR1 and the second main robot MR2 concurrently transport the respective two substrates W, so that the throughput in the substrate processing apparatus 100d can be further improved.

(6) Sixth Embodiment

Next, for a substrate processing apparatus according to a sixth embodiment of the present invention, different points from the above-described fourth embodiment will be described.

(6-1) Configuration of the Substrate Processing Apparatus

Figure 23:
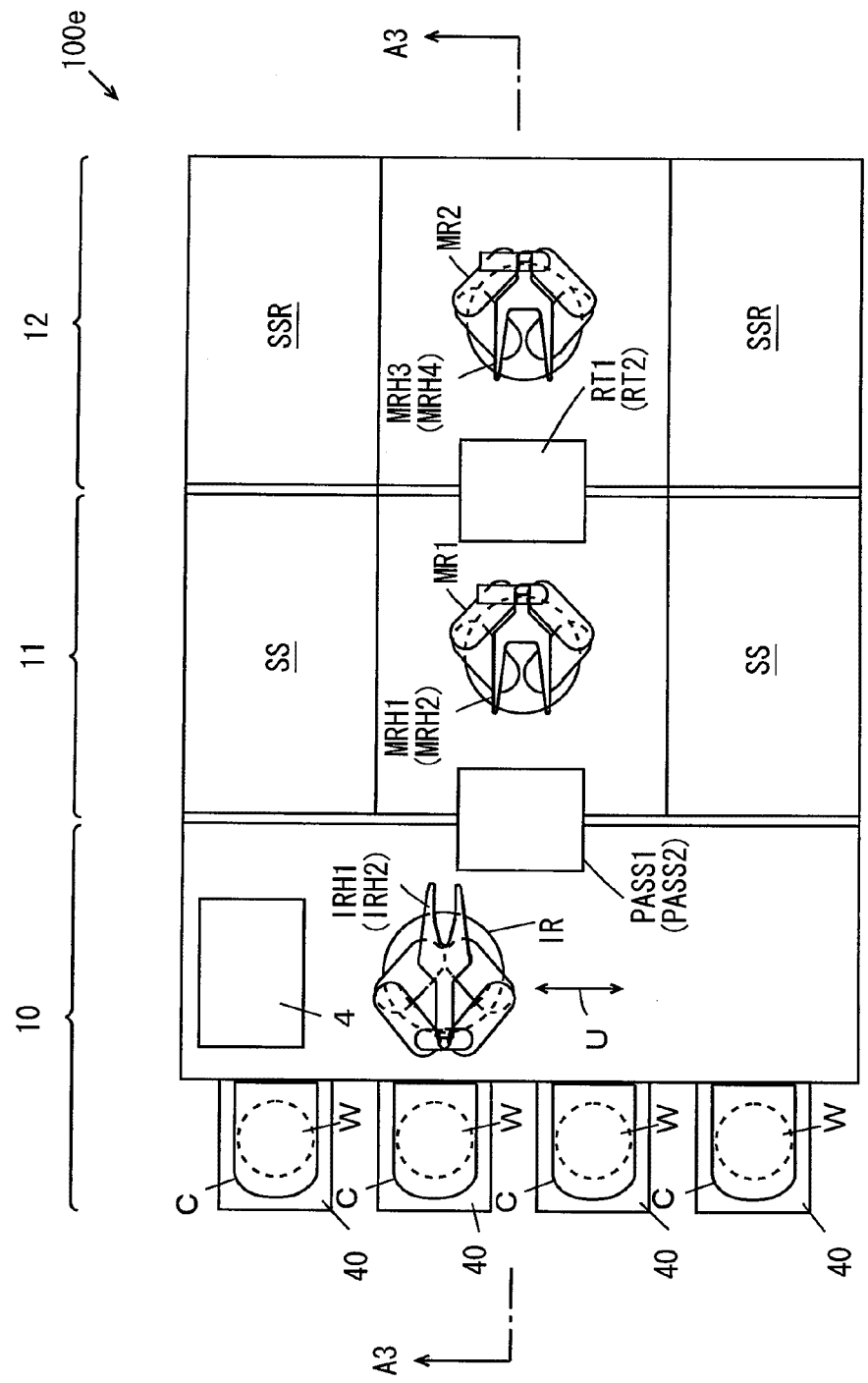
FIG. 23 is a diagram showing a configuration of a substrate processing apparatus according to a sixth embodiment.
Figure 24:
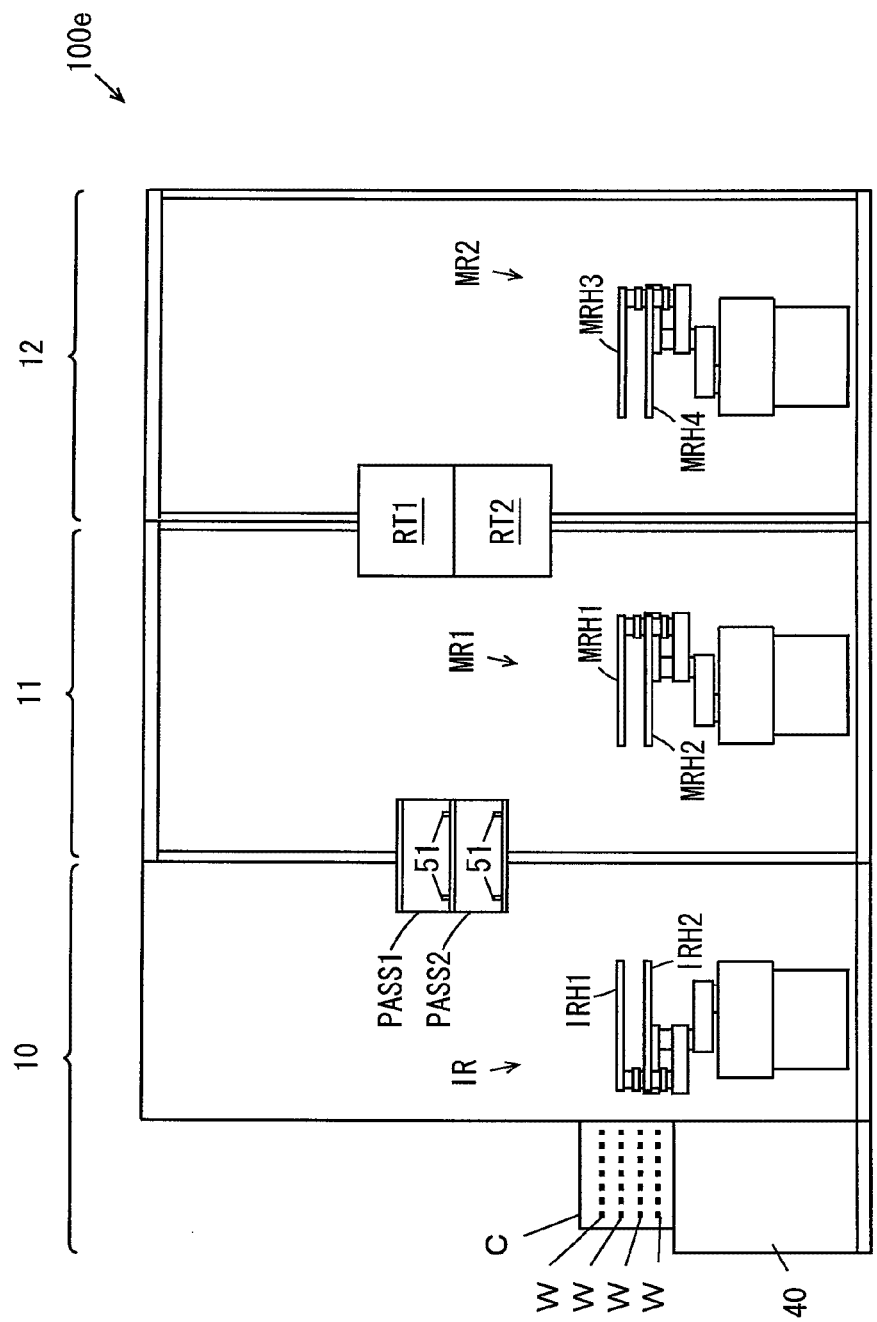
FIG. 24 is a diagram showing the configuration of the substrate processing apparatus according to the sixth embodiment.

FIG. 23 and FIG. 24 are schematic views showing a configuration of the substrate processing apparatus according to the sixth embodiment. FIG. 23 is a plan view of the substrate processing apparatus, and FIG. 24 is a sectional view taken along the line A3-A3 of FIG. 23.

As shown in FIG. 23, the plurality of (eight, for example) top surface cleaning units SS are provided in the first processing block 11, and the plurality of (eight, for example) back surface cleaning units SSR are provided in the second processing block 12 in the substrate processing apparatus 100e according to the sixth embodiment. As shown in FIG. 24, the substrate platforms PASS1, PASS2 are provided one above the other between the indexer block 10 and the first processing block 11, and the reversing units RT1, RT2 are provided one above the other between the first processing block 11 and the second processing block 12.

(6-2) Summary of Operation of the Substrate Processing Apparatus

Next, a summary of an operation of the substrate processing apparatus 100e will be described with reference to FIG. 23 and FIG. 24.

First, the indexer robot IR takes the unprocessed substrate W out of one of the carriers C placed on the carrier platform 40 in the indexer block 10. The indexer robot IR rotates around the vertical axis while moving in the direction of the arrow U, and places the substrate W in the substrate platform PASS1.

The substrate W placed in the substrate platform PASS1 is received by the first main robot MR1 in the first processing block 11, and subsequently carried into the top surface cleaning unit SS. Then, the substrate W after the top surface cleaning processing is carried out of the top surface cleaning unit SS by the first main robot MR1, and subsequently carried into the reversing unit RT1.

In the reversing unit RT1, the substrate W with the top surface thereof directed upward is reversed so that the back surface thereof is directed upward. The substrate W after the reversing is carried out of the reversing unit RT1 by the second main robot MR2 in the second processing block 12, and subsequently carried into the back surface cleaning unit SSR. Then, the substrate W after the back surface cleaning processing is carried out of the back surface cleaning unit SSR by the second main robot MR2, and subsequently carried into the reversing unit RT2.

In the reversing unit RT2, the substrate W with the back surface thereof directed upward is reversed so that the top surface thereof is directed upward. The substrate W after the reversing is carried out of the reversing unit RT2 by the first main robot MR1 in the first processing block 11, and subsequently placed in the substrate platform PASS2. The substrate W placed in the substrate platform PASS2 is received by the indexer robot IR in the indexer block 10, and stored in the carrier C.

In the substrate processing apparatus 100e, the first main robot MR1 performs three transporting processes for the single substrate W, that is, a transporting process from the substrate platform PASS1 to the top surface cleaning unit SS, a transporting process from the top surface cleaning unit SS to the reversing unit RT1 and a transporting process from the reversing unit RT2 to the substrate platform PASS2.

Moreover, the second main robot MR2 performs two transporting processes for the single substrate W, that is, the transporting process from the reversing unit RT1 to the back surface cleaning unit SSR and the transporting process from the back surface cleaning unit SSR to the reversing unit RT2.

Similarly to the above-mentioned fourth embodiment, the number of the transporting processes of the substrate W by the second main robot MR2 is less than the number of the transporting processes of the substrate W by the first main robot MR1. Therefore, the throughput of the whole substrate processing apparatus 100e depends on the transport speed of the substrate W by the first main robot MR1.

(6-3) Effects of the Sixth Embodiment

Also in the present embodiment, the transportation of the substrate W in the first processing block 11 and the transportation of the substrate W in the second processing block 12 can be concurrently performed. Thus, the transport time of the substrate W can be shortened, so that the throughput in the substrate processing apparatus 100e can be improved.

Furthermore, the reversing units RT1, RT2 are provided in the intermediate position between the first main robot MR1 and the second main robot MR2, so that the substrate W can be transferred and received between the first main robot MR1 and the second main robot MR2 while being reversed. This allows the number of the transporting processes by the first and second main robots MR1, MR2 to be reduced, compared to the case where each of the first and second main robots MR1, MR2 carries the substrate W into and out of the reversing units RT1, RT2. Accordingly, the throughput in the substrate processing apparatus 100e can be further improved.

(6-4) Modifications of the Sixth Embodiment

In the substrate processing apparatus 100e according to the sixth embodiment, the reversing units RT1a, RT2a shown in the above-described second embodiment may be used instead of the reversing units RT1, RT2. In this case, the plurality of substrates W can be efficiently reversed, so that the throughput in the substrate processing apparatus 100e can be improved.

Furthermore, when the respective two substrate platforms PASS1, PASS2 are provided and the two substrates W are concurrently transported similarly to the above-described second embodiment, the throughput in the substrate processing apparatus 100e can be further improved.

(7) Seventh Embodiment

Next, for a substrate processing apparatus according to a seventh embodiment of the present invention, different points from the above-described fourth embodiment will be described.

(7-1) Configuration of the Substrate Processing Apparatus

Figure 25:
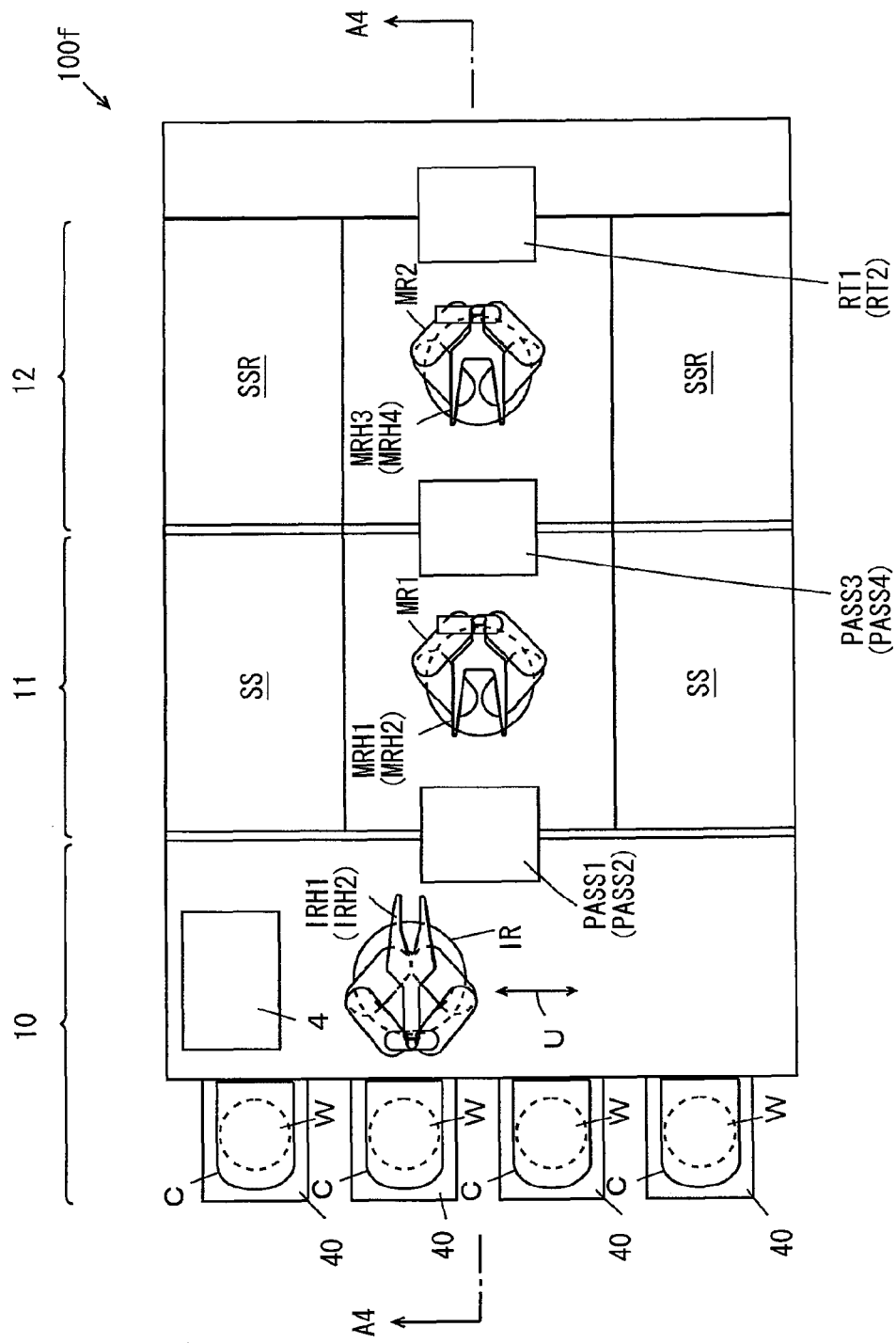
FIG. 25 is a diagram showing a configuration of a substrate processing apparatus according to a seventh embodiment.
Figure 26:
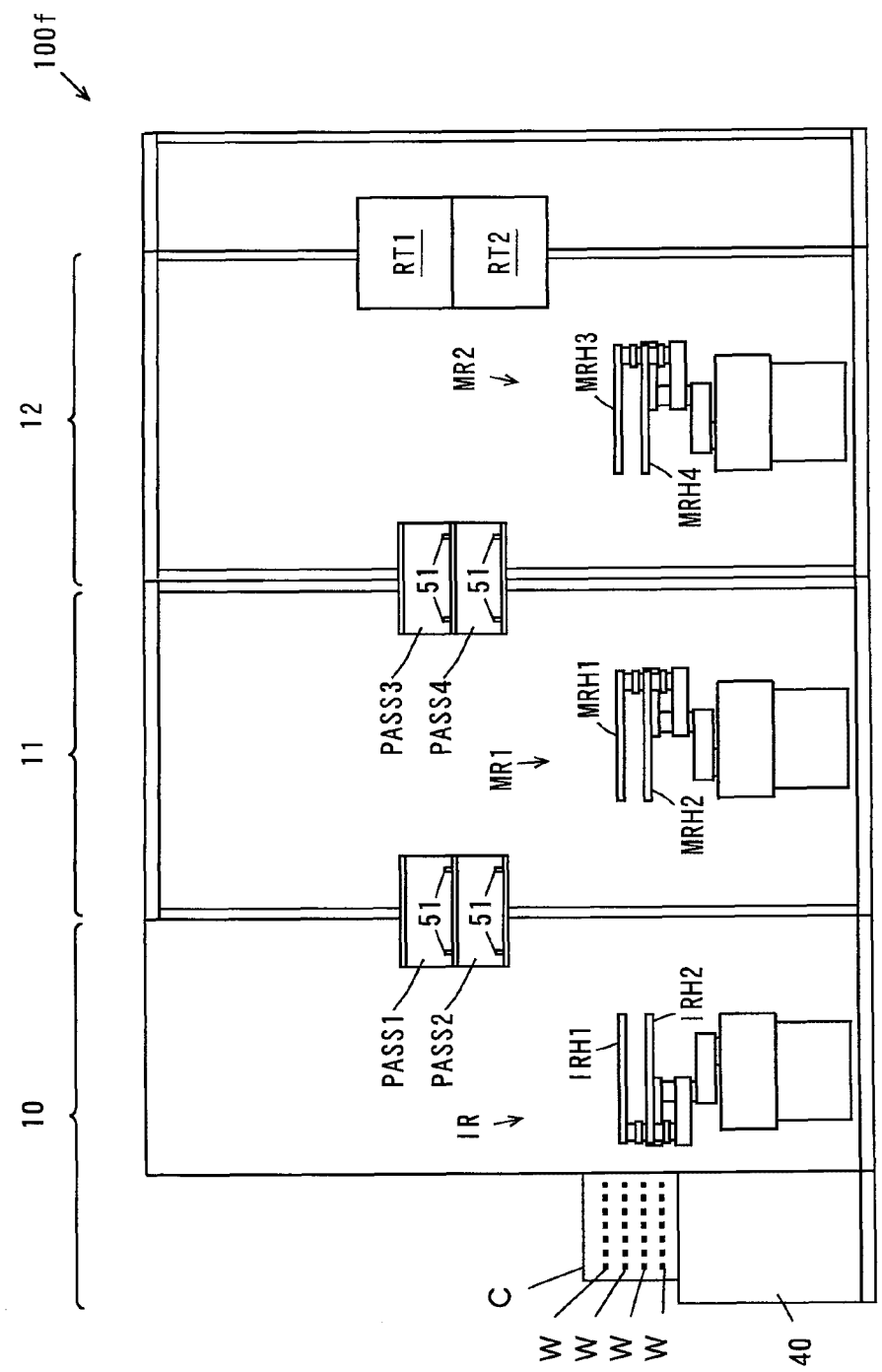
FIG. 26 is a diagram showing the configuration of the substrate processing apparatus according to the seventh embodiment.

FIG. 25 and FIG. 26 are schematic views showing a configuration of the substrate processing apparatus according to the seventh embodiment. FIG. 25 is a plan view of the substrate processing apparatus, and FIG. 26 is a sectional view taken along the line A4-A4 of FIG. 25.

As shown in FIG. 25 and FIG. 26, the substrate platforms PASS1, PASS2 are provided one above the other between the indexer block 10 and the first processing block 11, and the substrate platforms PASS3, PASS4 having configurations similar to the substrate platforms PASS1, PASS2 are provided one above the other between the first processing block 11 and the second processing block 12 in the substrate processing apparatus 100f according to the seventh embodiment. In addition, the reversing units RT1, RT2 are provided one above the other on one side, which is the opposite side of the first processing block 11, of the second processing block 12.

(7-2) Summary of an Operation of the Substrate Processing Apparatus

A summary of an operation of the substrate processing apparatus 100f will be described with reference to FIG. 25 and FIG. 26. First, the indexer robot IR takes the unprocessed substrate W out of one of the carriers C placed on the carrier platforms 40 in the indexer block 10. The indexer robot IR rotates around the vertical axis while moving in the direction of the arrow U, and places the substrate W in the substrate platform PASS1.

The substrate W placed in the substrate platform PASS1 is received by the first main robot MR1 in the first processing block 11, and subsequently placed in the substrate platform PASS3. The substrate W placed in the substrate platform PASS3 is received by the second main robot MR2 in the second processing block 12, and then carried into the reversing unit RT1.

In the reversing unit RT1, the substrate W with the top surface thereof directed upward is reversed so that the back surface thereof is directed upward. The substrate W after the reversing is carried out of the reversing unit RT1 by the second main robot MR2, and subsequently carried into the back surface cleaning unit SSR. Then, the substrate W after the back surface cleaning processing is carried out of the back surface cleaning unit SSR by the second main robot MR2, and subsequently carried into the reversing unit RT2.

In the reversing unit RT2, the substrate W with the back surface thereof directed upward is reversed so that the top surface thereof is directed upward. The substrate W after the reversing is carried out of the reversing unit RT2 by the second main robot MR2, and placed in the substrate platform PASS4. The substrate W placed in the substrate platform PASS4 is received by the first main robot MR1 in the first processing block 11, and subsequently carried into the top surface cleaning unit SS.

Then, the substrate W after the top surface cleaning processing is carried out of the top surface cleaning unit SS by the first main robot MR1, and subsequently placed in the substrate platform PASS2. The substrate W placed in the substrate platform PASS2 is received by the indexer robot IR in the indexer block 10, and stored in the carrier C.

(7-3) Effects of the Seventh Embodiment

Also in the present embodiment, the transportation of the substrate W in the first processing block 11 and the transportation of the substrate W in the second processing block 12 can be concurrently performed. Thus, the transport time of the substrate W can be shortened, so that the throughput in the substrate processing apparatus 100f can be improved.

(7-4) Modifications of the Seventh Embodiment

In the substrate processing apparatus 100f according to the seventh embodiment, the reversing units RT1a, RT2a shown in the above-described second embodiment may be used instead of the reversing units RT1, RT2. In this case, the plurality of substrates W can be efficiently reversed, so that the throughput in the substrate processing apparatus 100f can be improved.

Furthermore, when the respective two substrate platforms PASS1, PASS2, PASS3, PASS4 are provided and the two substrates Ware concurrently transported similarly to the above-described second embodiment, the throughput in the substrate processing apparatus 100f can be further improved.

(8) Other embodiments

While the unprocessed substrate W is transported from the indexer block 10 to the second processing block 12 via the substrate platforms PASS1, PASS2 in the above-described first embodiment, the present invention is not limited to this and the unprocessed substrate W may be transported from the indexer block 10 to the second processing block 12 via the reversing units RT1, RT2.

While the top surface cleaning processing to the substrate W is performed after the end surface cleaning processing and back surface cleaning processing to the substrate W in the above-described third embodiment, the present invention is not limited to this and the end surface cleaning processing and back surface cleaning processing to the substrate W may be performed after the top surface cleaning processing to the substrate W.

While the substrate W before the back surface cleaning processing is reversed by the reversing unit RT1 and the substrate W after the back surface cleaning processing is reversed by the reversing unit RT2 in the above-described third, sixth and seventh embodiments, the present invention is not limited to this and the substrate W before the back surface cleaning processing and the substrate W after the back surface cleaning processing may be reversed by a common reversing unit In the above-described first-third embodiments, arrangements of the top surface cleaning unit SS, the back surface cleaning unit SS and the end surface cleaning unit SSB may be suitably changed depending on their processing speeds. For example, the end surface cleaning unit SSB may be provided in the first processing block 11, or the top surface cleaning unit SS and the back surface cleaning unit SSR may be provided in a common processing block.

While the substrate W after the top surface cleaning processing is transported from the second processing block 12 to the indexer block 10 via the substrate platforms PASS1, PASS2 in the above-described fourth embodiment, the present invention is not limited to this and the substrate W after the top surface cleaning processing may be transported from the second processing block 12 to the indexer block 10 via the reversing units RT1, RT2.

In the above-described fourth-seventh embodiments, the top surface cleaning processing and the back surface cleaning processing may be performed in reverse order.

In the above-described first-seventh embodiments, the order of the operations of the indexer robot IR and the main robots MR1, MR2 may be suitably changed depending on the processing speeds of the reversing units RT1, RT2, the top surface cleaning unit SS, the back surface cleaning unit SSR and the end surface cleaning unit SSB.

The respective numbers of the reversing units RT1, RT2, RT1a, RT2a, the top surface cleaning units SS, the back surface cleaning units SSR and the end surface cleaning units SSB are suitably changed depending on their processing speeds.

While multi-joint type transport robots that linearly move their hands forward and backward by moving their joints are used as the indexer robot IR and the main robots MR1, MR2 in the above-described first-seventh embodiments, the present invention is not limited to this and linear-type transport robots that move their hands forward and backward by linearly sliding them with respect to the substrate W may be used.

(9) Correspondences Between Structural Elements in Claims and Elements in the Embodiments In the following paragraphs, non-limiting examples of correspondences between various elements recited in the claims below and those described above with respect to various embodiments of the present invention are explained.

In the above-described embodiments, the first processing block 11 is an example of a first processing region, the second processing block 12 is an example of a second processing region, the indexer block 10 is an example of a carrying in and out region, the intermediate region between the indexer block 10 and the first processing block 11 is an example of a first interface region or a first interface, the intermediate region between the first processing block 11 and the second processing block 12 is an example of a second interface region or a second interface.

At least one of the top surface cleaning unit SS, the back surface cleaning unit SSR and the end surface cleaning unit SSB is an example of a first or second processing section, the first main robot MR1 is an example of a first transport device, the second main robot MR2 is an example of a second transport device, the carrier C is an example of a storing container, the carrier platform 40 is an example of a container platform, and the indexer robot IR is an example of a third transport device.

The end surface cleaning unit SSB is an example of an edge cleaning processing section, the back surface cleaning unit SSR is an example of a back surface cleaning processing section, the top surface cleaning unit SS is an example of a top surface cleaning processing section, the reversing units RT1, RT2, RT1a, RT1b are examples of a (first or second) reversing device or reversing mechanism, and the substrate platforms PASS 1, PASS2, PASS3, PASS4 are examples of a (first or second) substrate platform.

The fixed plate 32, the first movable plate 36a, the support pins 39a, 39c and the cylinder 37a are examples of a first holding mechanism, the fixed plate 32, the second movable plate 36b, the support pins 39b, 39d and the cylinder 37b are examples of a second holding mechanism, the supporting plate 31 is an example of a supporting member, the rotary actuator 38 is an example of a rotating device, the fixed plate 32 is an example of a common reverse holding member, the support pin 39a is an example of a first supporter, the first movable plate 36a is an example of a first reverse holding member, the support pin 39c is an example of a second supporter, the cylinder 37a is an example of a first driving mechanism, the support pin 39b is an example of a third supporter, the second movable plate 36b is an example of a second reverse holding member, the support pin 39d is an example of a fourth supporter, and the cylinder 37b is an example of a second driving mechanism.

Note that as each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus that performs processing to a substrate having a top surface and a back surface, comprising:
   first and second processing regions, arranged adjacent to each other, for performing the processing to the substrate;
   a storing and carrying in and out region, arranged adjacent to the first processing region, for storing and carrying the substrate into and out of the first processing region;
   a first interface provided between the storing and carrying in and out region and the first processing region; and
   a second interface provided between the first processing region and the second processing region, wherein
   the first processing region includes
   a plurality of first processing sections, and
   a first transport device that has first and second hands provided one above another for holding substrates respectively, and transports the substrate among the first interface, the plurality of first processing sections and the second interface,
   the second processing region includes
   a plurality of second processing sections, and
   a second transport device that has third and fourth hands provided one above another for holding substrates respectively, and transports the substrate between the second interface and the plurality of second processing sections,
   the storing and carrying in and out region includes
   a container platform on which a storing container that stores the substrate is placed, and
   a third transport device that transports the substrate between the storing container placed on the container platform and the first interface,
   the first interface includes first, second, third and fourth substrate platforms on which the substrates are placed, respectively, wherein the first and second substrate platforms are provided one above another, the third and fourth substrate platforms are provided one above another, and a difference in height between the first hand and the second hand is equal to a difference in height between the first substrate platform and the second substrate platform and is equal to a difference in height between the third substrate platform and the fourth substrate platform,
   the second interface includes first and second reversing devices that each reverse the top surface and the back surface of the substrate, each of the first and second reversing devices being configured to reverse two substrates simultaneously,
   the first processing section includes a top surface cleaning processing section that cleans the top surface of the substrate,
   the second processing section includes a back surface cleaning processing section that cleans the back surface of the substrate,
   the first transport device is configured to transport the substrate among the first, second, third and fourth substrate platforms, the first and second reversing devices and the plurality of first processing sections, and is configured to be capable of receiving two substrates simultaneously from the first and second substrate platforms, placing two substrates simultaneously on the third and fourth substrate platforms, transporting two substrates simultaneously to the first reversing device, and receiving two substrates simultaneously from the second reversing device,
   the second transport device is configured to transport the substrate among the first and second reversing devices and the plurality of second processing sections, and is configured to be capable of receiving two substrates simultaneously from the reversing device, and transporting two substrates simultaneously to the second reversing device, and
   the third transport device is configured to transport the substrate among the storing container placed on the container platform and the first, second, third and fourth substrate platforms, placing substrates on the first and second substrate platforms, respectively, and receiving substrates from the third and fourth substrate platforms, respectively.

2. The substrate processing apparatus according to claim 1, wherein the reversing device reverses the substrate around a rotation axis crossing a line connecting a position of the first transport device and a position of the second transport device in transferring and receiving the substrate.

3. The substrate processing apparatus according to claim 1, wherein the reversing device includes first and second reversing devices arranged one above the other.

4. The substrate processing apparatus according to claim 3, wherein the first reversing device is used for reversing the substrate before cleaning by the back surface cleaning processing section, and the second reversing device is used for reversing the substrate after the cleaning by the back surface cleaning processing section.

5. The substrate processing apparatus according to claim 1, wherein the substrate platform includes first and second substrate platforms arranged one above the other.

6. The substrate processing apparatus according to claim 5, wherein the first substrate platform is used for placing the substrate before the cleaning by the back surface cleaning processing section, and the second substrate platform is used for placing the substrate after the cleaning by the back surface cleaning processing section.

7. The substrate processing apparatus according to claim 1, wherein the reversing device includes
   a first holding mechanism that holds the substrate in a state vertical with respect to a first axis, a second holding mechanism that holds the substrate in the state vertical with respect to the first axis,
a supporting member that supports the first and second holding mechanisms so that the first and second holding mechanisms overlap with each other in a direction of the first axis, and
a rotating device that integrally rotates the supporting member together with the first and second holding mechanisms around a second axis that is substantially vertical with respect to the first axis, wherein
the first and second holding mechanisms are configured to hold the substrate independently.

8. The substrate processing apparatus according to claim 7, wherein
the first and second holding mechanisms include a common reverse holding member having one surface and the other surface that are vertical with respect to the first axis,
the first holding mechanism includes
a plurality of first supporters that are provided on the one surface of the common reverse holding member and support a periphery of the substrate,
a first reverse holding member provided so as to face the one surface of the common reverse holding member,
a plurality of second supporters that are provided on a surface, which faces the common reverse holding member, of the first reverse holding member and support the periphery of the substrate, and
a first driving mechanism that moves at least one of the first reverse holding member and the common reverse holding member so that the first reverse holding member and the common reverse holding member are selectively shifted between a state where the first reverse holding member and the common reverse holding member are spaced apart from each other in the direction of the first axis and a state where the first reverse holding member and the common reverse holding member are close to each other, and
the second holding mechanism includes
a plurality of third supporters that are provided on the other surface of the common reverse holding member and support the periphery of the substrate,
a second reverse holding member provided so as to face the other surface of the common reverse holding member,
a plurality of fourth supporters that are provided on a surface, which faces the common reverse holding member, of the second reverse holding member and support the periphery of the substrate, and
a second driving mechanism that moves at least one of the second reverse holding member and the common reverse holding member so that the second reverse holding member and the common reverse holding member are selectively shifted between a state where the second reverse holding member and the common reverse holding member are spaced apart from each other in the direction of the first axis and a state where the second reverse holding member and the common reverse holding member are close to each other.

9. A substrate processing apparatus that performs processing to a substrate having a top surface and a back surface, comprising:
first and second processing regions, arranged adjacent to each other, for performing the processing to the substrate;
a storing and carrying in and out region, arranged adjacent to the first processing region, for storing and carrying the substrate into and out of the first processing region;
a first interface for transferring and receiving the substrate between the storing and carrying in and out region and the first processing region; and
a second interface for transferring and receiving the substrate between the first processing region and the second processing region, wherein
the first processing region includes
a plurality of first processing sections, and
a first transport device that has first and second hands provided one above another for holding substrates respectively, and transports the substrate among the first interface, the plurality of first processing sections and the second interface,
the second processing region includes
a plurality of second processing sections, and
a second transport device that has third and fourth hands provided one above another for holding substrates respectively, and transports the substrate between the second interface and the plurality of second processing sections,
the storing and carrying in and out region includes
a container platform on which a storing container that stores the substrate is placed, and
a third transport device that transports the substrate between the storing container placed on the container platform and the first interface,
the first interface includes first, second, third and fourth substrate platforms on which the substrates are placed, respectively, and a difference in height between the first hand and the second hand is equal to a difference in height between the first substrate platform and the second substrate platform and is equal to a difference in height between the third substrate platform and the fourth substrate platform,
the second interface includes first and second reversing devices that each reverse the top surface and the back surface of the substrate while transferring and receiving the substrate between the first transport device and the second transport device, each of the first and second reversing devices being configured to reverse two substrates simultaneously,
the first processing section includes a top surface cleaning processing section that cleans the top surface of the substrate,
the second processing section includes a back surface cleaning processing section that cleans the back surface of the substrate,
the first transport device is configured to transport the substrate among the first, second, third and fourth substrate platforms, the first and second reversing devices and the plurality of first processing sections, and is configured to be capable of placing two substrates simultaneously on the first and second substrate platforms, receiving two substrates simultaneously from the third and fourth substrate platforms, transporting two substrates simultaneously to the first reversing device, and receiving two substrates simultaneously from the second reversing device,
the second transport device is configured to transport the substrate among the first and second reversing devices and the plurality of second processing sections, and is configured to be capable of receiving two substrates simultaneously from the first reversing device, and transporting two substrates simultaneously to the second reversing device, and
the third transport device is configured to transport the substrate between the storing container placed on the container platform and the first, second, third and fourth substrate platforms, and is configured to be capable of placing substrates on the first and second substrate platforms, respectively, and receiving substrates from the third and fourth substrate platforms, respectively.

* * * * *